(12) United States Patent
Kato et al.

(10) Patent No.: US 6,534,790 B2
(45) Date of Patent: Mar. 18, 2003

(54) COMPOUND SEMICONDUCTOR FIELD EFFECT TRANSISTOR

(75) Inventors: Takehiko Kato, Tokyo (JP); Kazuki Ota, Tokyo (JP); Hironobu Miyamoto, Tokyo (JP); Naotaka Iwata, Tokyo (JP); Masaaki Kuzuhara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/796,803

(22) Filed: Mar. 2, 2001

(65) Prior Publication Data

US 2001/0019131 A1 Sep. 6, 2001

(30) Foreign Application Priority Data

Mar. 6, 2000 (JP) ........................................ 2000-060511

(51) Int. Cl.[7] .............................................. H01L 29/15
(52) U.S. Cl. .................... 257/76; 257/194; 257/200; 257/201; 438/285; 438/590
(58) Field of Search ................... 257/76, 192, 194, 257/195, 200, 201, 279, 289; 435/285, 590

(56) References Cited

U.S. PATENT DOCUMENTS 5,610,410 A * 3/1997 Imanashi ..................... 257/76
5,739,558 A * 4/1998 Ishida et al. ................ 257/192
6,072,203 A * 6/2000 Nozaki et al. .............. 257/194

FOREIGN PATENT DOCUMENTS

| JP | 4-145629 | 5/1992 |
| JP | 6-168960 | 6/1994 |
| JP | 6-196504 | 7/1994 |
| JP | 7-335867 | 12/1995 |
| JP | 10-64924 | 3/1998 |
| JP | 10-173137 | 6/1998 |

* cited by examiner

Primary Examiner—Nathan J. Flynn
Assistant Examiner—Scott R Wilson
(74) Attorney, Agent, or Firm—Sughrue Mion, PLLC

(57) ABSTRACT

The present invention provides a field effect transistor (FET) having, on a semi-insulating compound semiconductor substrate, a buffer layer; an active layer that includes a channel layer made of a first conductive-type epitaxial growth layer (e.g. InGaAs); source/drain electrodes formed on a first conductive-type contact layer which is formed either on said active layer or on a lateral face thereof; a gate layer made of a second conductive-type epitaxial growth layer (e.g. $p^+$-GaAs); and a gate electrode formed on said gate layer; which further has, between said second conductive-type gate layer and said channel layer, a semiconductor layer (e.g. InGaP) that rapidly lowers the energy of the valance band spreading from said gate layer to said channel layer. The present invention improves withstand voltage characteristic of a FET having a pn junction in a gate region (JFET) and realizes stable operations of a JFET.

28 Claims, 62 Drawing Sheets

COMPOUND SEMICONDUCTOR FIELD EFFECT TRANSISTOR

BACKGROUND OF THE INVENTION

1. Field of the Invention

The present invention relates to a field effect transistor (FET) and more particularly to a heterojunction FET.

2. Description of the Related Art

A heterojunction FET of which a HEMT (High Electron Mobility Transistor) with a GaAs-based or InP-based group III-V compound semiconductor is typical has been being employed as a low-noise high-output high-efficiency high-frequency device for various purposes. FIG. 61 is, for example, a cross-sectional view of the structure of a FET shown in Japanese Patent Application Laid-open No. 64924/1998. In FIG. 61, referential numeral 1005 indicates a semi-insulating GaAs substrate; 1004, a buffer layer formed on the semi-insulating GaAs substrate 1005; 1003, an n-GaAs active layer formed in a prescribed region of the buffer layer 1004; 1007, an $n^+$ ohmic contact region formed in a region of the buffer layer 1004 where no n-GaAs active layer 1003 is formed; 1002, an n-AlGaAs etching stopper layer formed on the n-GaAs active layer 1003; 1001, an i-GaAs layer formed in a prescribed region of the n-AlGaAs etching stopper layer 1002; 1008, an $SiO_2$ insulating film formed on the i-GaAs layer 1001; 1015 and 1016, source/drain electrodes made of AuGe-based metal, being formed on the $n^+$ ohmic contact region 1007; and 1017, a gate layer made of a $p^+$-type semiconductor. Such a FET having a p-n junction in a gate region as described above is known as a JFET (Junction Field Effect Transistor). Therein, the p-n junction is biased and the drain current is controlled through the adjustment of the width of the space charge region directly under the gate.

Next, referring to FIGS. 62–64, a method of manufacturing the afore-mentioned semiconductor device is described. In the first step thereof, layers 1001–1005 are formed by the epitaxial crystal growth method, in succession. An $n^+$ ohmic contact region 1007 is then formed in each prescribed region on the i-GaAs layer 1005, using the ion-implantation/annealing method. After that, over the entire surface of the semiconductor substrate, an $SiO_2$ insulating film 1008 is deposited and, using resist masks 1009, an opening is made in the $SiO_2$ film 1008. Further, the i-GaAs layer 1001 is dry etched and thereby a gate region is formed (FIG. 62).

Next, a semiconductor layer 1017 of $p^+$-type conductivity is formed in the gate region by either an MOCVD (Metal Organic Chemical Vapour Deposition) method or a CBE (Chemical Beam Epitaxy) method, using the $SiO_2$ insulating film 1008 as a mask (FIG. 63). After that, using a photoresist 1014 as a mask, openings for source/drain electrode formation sections are made in the $SiO_2$ insulating film 1008 (FIG. 64), and then, using the same photoresist 1014, a drain electrode 1015 and a source electrode 1016 of AuGe-based metal are formed by the deposition/lift-off method, whereby a semiconductor device shown in FIG. 61 is obtained.

The structure of a conventional semiconductor device and the procedure of a manufacturing method thereof are as described above. However, in forming a semiconductor layer of $p^+$-type conductivity, if the formation is made on AlGaAs, the amount of energy discontinuity between the valance bands of AlGaAs and GaAs or those of AlGaAs and InGaAs is small so that, with an applied voltage, holes are made to pour forth, which leads to deterioration of withstand voltage characteristic and unstabilization of operations in the FET.

Further, since Al is easily oxidized to form a thin natural oxidation film, the morphology of the $p^+$-type semiconductor is considerably inferior in quality. Moreover, when a $p^+$-type semiconductor is formed on AlGaAs, numerous interface states turn up on the interface therebetween. Due to these factors, when such a semiconductor device is utilized as a high-frequency device, high frequency characteristic thereof markedly deteriorates.

In addition, because the surface of the AlGaAs layer on which the $p^+$-type semiconductor is grown is formed by dry etching, some damage is produced on the AlGaAs layer. Yet, the selectivity of this dry etching method between these two substances is not particularly good. This brings about deterioration of high-frequency characteristic as well as dispersion of various characteristics of the FET when fabricated.

Electrical resistances that arise in various sections of a FET by way of distributed constants include contact resistances from respective ohmic electrodes to the channel layer and a sheet resistance under the gate. Meanwhile, ON-resistance of a FET is the whole resistance from the source electrode to the drain electrode. As mentioned in IEEE GaAs IC Symposium, pp. 119 (1996), a low ON-resistance is essential to attain a high output and a high efficiency in low-voltage operations. Nevertheless, contact resistances from the ohmic electrodes to the channel layer in conventional structures are notably high.

SUMMARY OF THE INVENTION

An object of the present invention is to improve withstand voltage characteristic of a JFET and realize stable operations of a JFET.

Another object of the present invention is to achieve better morphology in forming a semiconductor of $p^+$-type conductivity and suppress substantially creation of the interface states and thereby enhance high frequency characteristic.

A further object of the present invention is to improve a method of manufacturing a semiconductor substance and thereby reduce deterioration of high frequency characteristic as well as dispersion of various characteristics of JFET when fabricated.

A still further object of the present invention is to change the epitaxial structure and thereby lower the contact resistance from the cap layer to the channel layer.

A still further object of the present invention is to achieve a structure over which control can be easily made in forming semiconductor substances.

A still further object of the present invention is to provide a manufacturing method of a FET wherein, in gate formation, structure control is easy and good uniformity is obtainable.

The present invention relates to a field effect transistor having, on a semi-insulating compound semiconductor substrate:

a buffer layer;

an active layer that includes a channel layer made of a first conductive-type epitaxial growth layer;

source/drain electrodes formed on a first conductive-type semiconductor ohmic contact layer which is formed either on said active layer or on a lateral face thereof;

a gate layer made of a second conductive-type epitaxial growth layer; and a gate electrode formed on said gate layer; which further has:

between said second conductive-type gate layer and said channel layer, a semiconductor layer (referred to as "energy discontinuity layer", hereinafter) that rapidly lowers the energy of the valance band spreading from said gate layer to said channel layer.

The present invention provides a field effect transistor; wherein:

(1) said energy discontinuity layer is made of InGaP;
(2) said first conductive-type is n-type and second conductive-type is p-type;
(3) said channel layer is composed of either InGaAs or GaAs and said second conductive-type gate layer is a layer composed of substances selected from the group consisting of GaAs, AlGaAs, InGaAs and InGap.
(4) a semiconductor layer to form a first recess is formed on said energy discontinuity layer and another semiconductor layer to form a second recess which is wider than said first recess is formed on said semiconductor layer to form a first recess, and said second conductive-type gate layer is formed in the first recess;
(5) the ohmic contact layer to provide ohmic contacts for source/drain electrodes is formed on said energy discontinuity layer and said second conductive-type gate layer is formed within a one-stage recess formed with said ohmic contact layer;
(6) while as described in (5), the ohmic contact layer is formed by regrowth on said energy discontinuity layer;
(7) while as described in (5), the ohmic contact layer is consecutively formed, by epitaxial growth, on said energy discontinuity layer made of InGaP, and, using said InGaP layer as an etching stopper layer, said ohmic contact layer is etched by means of wet etching to form a recess, and a second conductive-type gate layer is formed, by regrowth, in said formed recess;
(8) the ohmic contact layer is a layer formed by regrowth after source/drain electrode formation regions of an active layer which, at least, includes a channel layer are removed selectively;
(9) while as described in any one item among (4) to (8), a semiconductor layer or layers within the active layer lying above the channel are a layer or layers essentially consisting of In, Ga and P;
(10) a part or all of said active layer is formed by regrowth together with said second conductive-type gate layer in a depressed section that is formed in the semiconductor layer or layers formed on the buffer layer;
(11) while as described in (10), said semiconductor layer or layers exposed in said formed depressed section are a semiconductor layer containing no Al;
(12) while as described in (10) or (11), said semiconductor layers exposed in said depressed section consist of an etching stopper layer and the ohmic contact layer for source/drain electrodes formed on said stopper layer, and said depressed section is formed in the ohmic contact layer lying over the etching stopper layer;
(13) while as described in (10) or (11), said semiconductor layers exposed in said depressed section consist of the ohmic contact layer for source/drain electrodes and the buffer layer, and, within said formed depressed section, the whole active layer is formed by regrowth;
(14) said second conductive-type gate layer is formed in contact with said energy discontinuity layer; and
(15) while as described in any one item among (4) to (7), either one or both of the ohmic contact layer for source/drain electrodes and the second conductive-type gate layer formed on the active layer are formed on an InGaAsP layer over said energy discontinuity layer.

Further, the present invention relates to a method of manufacturing a field effect transistor as described above and includes the following embodiments.

(a) A method of manufacturing a field effect transistor which comprises the steps of:

forming, on a semi-insulating compound semiconductor substrate, a first conductive-type buffer layer, an active layer that includes a channel layer and a contact layer for source/drain electrodes, by epitaxial growth, in succession;

forming a wide second recess in said contact layer;

forming a first recess in the active layer exposed in this second recess; and regrowing selectively a gate layer having a second conductive-type conductivity in said first recess; wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and said first recess is formed by means of wet etching, using said InGaP layer as an etching stopper layer;

said energy discontinuity layer is a layer composed of InGaP, and the steps further comprises additional steps of forming an active layer which includes an InGaAsP layer on said InGaP layer and said contact layer on said active layer, and forming the first recess in said active layer which includes said InGaAsP layer by means of wet etching, using said InGaP layer as an etching stopper layer; or semiconductor layers comprised in the active layer lying above the channel layer are formed solely with layers whose constituents comprise In, Ga and P.

(b) A method of manufacturing a field effect transistor which comprises the steps of:

forming, on a semi-insulating compound semiconductor substrate, a first conductive-type buffer layer, an active layer that includes a channel layer and a contact layer for source/drain electrodes, by epitaxial growth, in succession;

forming, at least, a recess in said contact layer; and regrowing selectively a gate layer having a second conductive-type conductivity in said recess;

wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and the recess is formed in said contact layer by means of wet etching, using said InGaP layer as an etching stopper layer;

said energy discontinuity layer is a layer composed of InGaP, and the steps further comprises additional steps of forming said contact layer on an InGaAsP layer over said InGaP layer, and forming the recess in said contact layer and the InGaAsP layer by means of wet etching, using said InGaP layer as an etching stopper layer; or semiconductor layers comprised in the active layer lying above the channel layer are formed solely with layers whose constituents comprise In, Ga and P.

(c) A method of manufacturing a field effect transistor which comprises the steps of:

forming, on a semi-insulating compound semiconductor substrate, a first conductive-type buffer layer, an active layer that includes a channel layer and a gate layer with second conductive-type conductivity, in succession;

setting a gate electrode on said gate layer;

removing portions of the gate layer other than the one beneath said gate electrode by means of etching, using the gate electrode as a mask;

removing selectively source and drain regions of said active layer;

regrowing ohmic contact layers for source/drain electrodes in said regions where a portion of the layer is each removed; and forming source and drain electrodes on said ohmic contact layers, respectively;

wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and said gate layer is etched by means of wet etching, using said InGaP layer as an etching stopper layer; or semiconductor layers comprised in the active layer lying above the channel layer are formed solely with layers whose constituents comprise In, Ga and P.

(d) A method of manufacturing a field effect transistor which comprises the steps of:

forming, on a semi-insulating compound semiconductor substrate, a first conductive-type buffer layer, an active layer that includes a channel layer and a gate layer with second conductive-type conductivity, in succession;

patterning said gate layer into a prescribed shape;

removing selectively source and drain regions of said active layer;

regrowing ohmic contact layers for source/drain electrodes in said regions where a portion of the layer is each removed;

forming a gate electrode on said gate layer; and forming source and drain electrodes on said ohmic contact layers, respectively;

wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and said gate layer is patterned into a prescribed shape by means of wet etching, using said InGaP layer as an etching stopper layer.

Said gate electrode can be formed either before source/drain regions of the active layer are selectively removed, or after ohmic contact layers for source/drain electrodes are formed. Semiconductor layers comprised in the active layer lying above the channel layer are formed solely with layers whose constituents comprise In, Ga and P.

(e) A method of manufacturing a field effect transistor which comprises the steps of:

forming, on a semi-insulating compound semiconductor substrate, a first conductive-type buffer layer, an active layer that includes a channel layer and a gate layer with second conductive-type conductivity, in succession;

setting a gate electrode on said gate layer;

removing portions of the gate layer other than the one beneath said gate electrode by means of etching, using the gate electrode as a mask;

regrowing ohmic contact layers for source/drain electrodes in source and drain regions of said active layer; and forming source and drain electrodes on said ohmic contact layers, respectively;

wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and said gate layer is etched by means of wet etching, using said InGaP layer as an etching stopper layer;

said energy discontinuity layer is a layer composed of InGaP, and said second conductive-type gate layer is formed on an InGaAsP layer over said InGaP layer, and then, using said InGaAsP layer as an etching stopper layer, said gate layer is patterned into a prescribed shape by means of wet etching; or semiconductor layers comprised in the active layer lying above the channel layer are formed solely with layers whose constituents comprise In, Ga and P.

(f) A method of manufacturing a field effect transistor which comprises the steps of:

forming, on a semi-insulating compound semiconductor substrate, a first conductive-type buffer layer, an active layer that includes a channel layer and a gate layer with second conductive-type conductivity, in succession;

patterning said gate layer into a prescribed shape;

regrowing ohmic contact layers for source/drain electrodes in source and drain regions of said active layer;

forming a gate electrode on said gate layer; and forming source and drain electrodes on said ohmic contact layers, respectively;

wherein a semiconductor layer (an energy discontinuity layer) that rapidly lowers the energy of the valance band spreading from the gate layer to the channel layer is set between said gate layer and said channel layer.

The method preferably contains the following embodiments:

said energy discontinuity layer is a layer composed of InGaP, and said gate layer is patterned into a prescribed shape by means of wet etching, using said InGaP layer as an etching stopper layer; or said energy discontinuity layer is a layer composed of InGaP, and said second conductive-type gate layer is formed on an InGaAsP layer over said InGaP layer, and then, using said InGaAsP layer as an etching stopper layer, said gate layer is patterned into a prescribed shape by means of wet etching.

Said gate electrode can be formed either before ohmic contact layers for source/drain electrodes are formed or after ohmic contact layers for source/drain electrodes are formed. Semiconductor layers comprised in the active layer lying above the channel layer are formed solely with layers whose constituents comprise In, Ga and P.

(g) A method of manufacturing a field effect transistor which comprises the steps of:
  forming, on a semi-insulating compound semiconductor substrate, a first conductive-type buffer layer, a channel layer, an etching stopper layer to overlie said channel layer and an ohmic contact layer for source/drain electrodes to overlie said stopper layer, by epitaxial growth, in succession;
  forming, on said ohmic contact layer, a mask layer in which an opening for a gate region is made;
  removing a portion of the ohmic contact layer that is exposed in the opening section of said mask layer so as to form a depressed section; and
  forming, in said formed depressed section, a first conductive-type semiconductor layer and a second conductive-type gate layer by epitaxial growth;
  wherein a semiconductor layer (an energy discontinuity layer) that rapidly lowers the energy of the valance band spreading from the gate layer to the channel layer is set between said gate layer and said channel layer.
  The method preferably contains the following embodiments:
    said energy discontinuity layer is a layer composed of InGaP.
    Following the semi-conductor layer that rapidly lowers the energy of the valance band, said second conductive-type gate layer can be consecutively formed by regrowth.
(h) A method of manufacturing a field effect transistor which comprises the steps of:
  forming, on a semi-insulating compound semiconductor substrate, a first conductive-type buffer layer, an etching stopper layer and an ohmic contact layer for source/drain electrodes to overlie said stopper layer, by epitaxial growth, in succession;
  forming, on said ohmic contact layer, a mask layer in which an opening for a gate region is made;
  removing a portion of the ohmic contact layer that is exposed in the opening section of said mask layer so as to form a depressed section; and
  forming, in said formed depressed section, a first conductive-type semiconductor layer that includes a channel layer and a second conductive-type gate layer by epitaxial growth;
  wherein a semiconductor layer (an energy discontinuity layer) that rapidly lowers the energy of the valance band spreading from the gate layer to the channel layer is set between said gate layer and said channel layer.
  The method preferably contains the following embodiments:
    said energy discontinuity layer is a layer composed of InGaP.
    Following the semi-conductor layer that rapidly lowers the energy of the valance band, said second conductive-type gate layer can be consecutively formed by regrowth.
(i) A method of manufacturing a field effect transistor as described in any one item among (a) to (h), wherein said first conductive-type is n-type and second conductive-type is p-type.
(j) A method of manufacturing a field effect transistor as described in any one item among (a) to (i), wherein said channel layer is composed of either InGaAs or GaAs and said second conductive-type gate layer is a layer composed of substances selected from the group consisting of GaAs, AlGaAs, InGaAs and InGaP.

The present invention can improve withstand voltage characteristic of a JFET and realize stable operations of a JFET. This results from a fact that the insertion of an energy discontinuity layer between a gate layer and a channel layer rapidly lowers the energy of the valance band spreading from the gate layer to the channel so that it becomes more difficult for holes to reach the channel when the gate voltage is applied and, thus, avalanche breakdown becomes less likely to occur.

Further, the present invention can achieve better morphology when a semiconductor layer of $p^+$-type conductivity or an ohmic contact layer for source/drain electrodes is formed by regrowth and can suppress creation of the interface states substantially and thereby enhance high frequency characteristic of the JFET. This can be explained as follows. Because formation of a gate layer by regrowth is carried out on a layer such as an InGaP layer constituting an energy discontinuity layer, an interface of which contains no Al, the formation by regrowth can attain excellent morphology. This can substantially suppress creation of the interface states on the regrowth interface which may be brought about by the presence of impurities such as oxygen.

Further, the present invention can reduce deterioration of high frequency characteristic as well as dispersion of various characteristics of the JFET when fabricated. This results from a fact that when the regrowth interface is exposed b wet etching, using the InGaP layer as an etching stopper layer, the etching damage decreases considerably.

The present invention can lower the contact resistance from the cap layer to the channel layer. The explanation lies in a fact that by forming an InGaAsP layer on an energy discontinuity layer, the contact resistance can be reduced by 0.1 Ω·mm or so, compared with the case that no InGaAsP layer is formed. As a result, a high-output high-efficiency FET can be provided.

DETAILED DESCRIPTION OF THE PRREFERRED EMBODIMENTS

Figure 1:
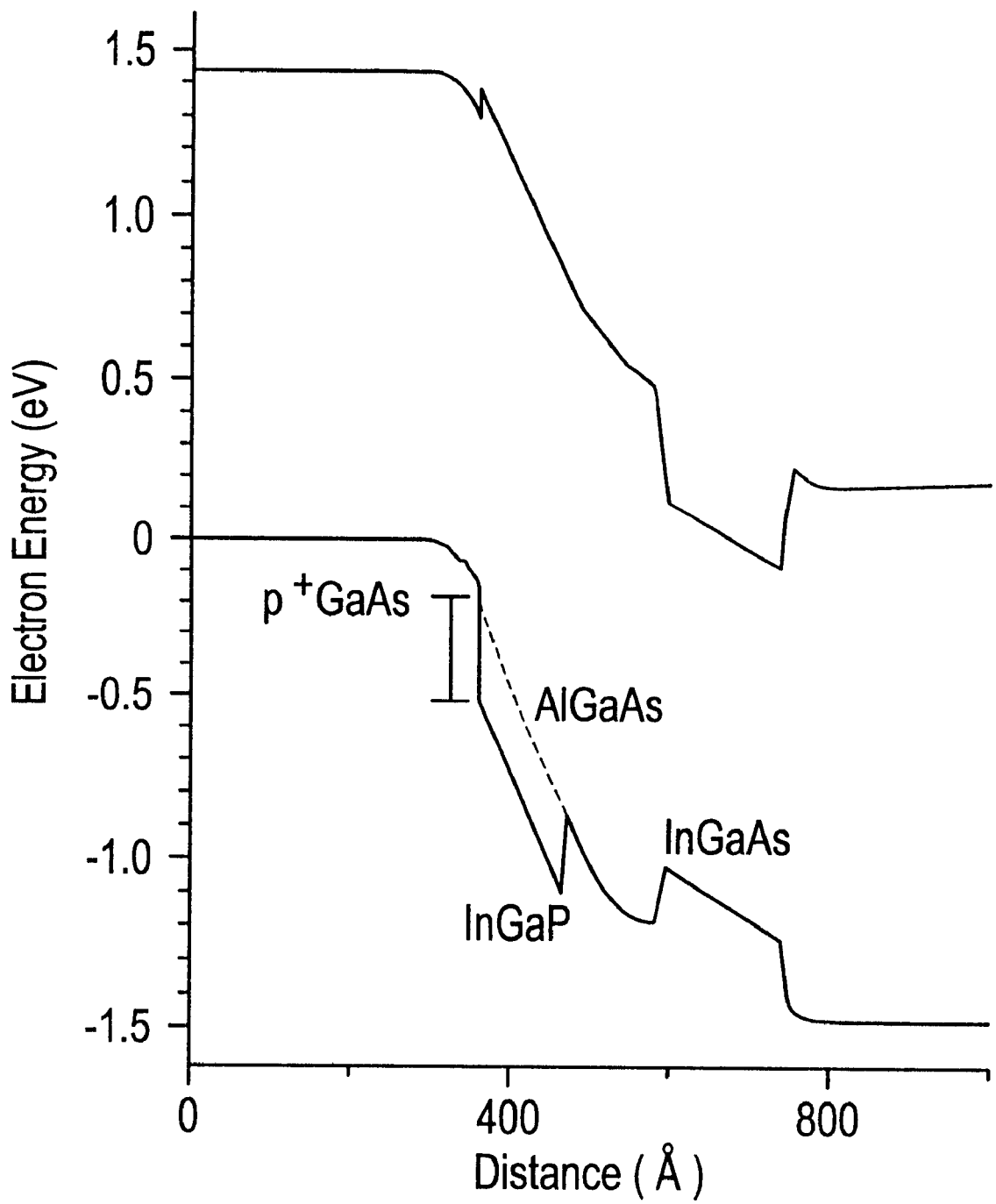
FIG. 1 is an energy band diagram of a field effect transistor which is one embodiment of the present invention.

FIG. 1 shows an energy band diagram of a field effect transistor which is one embodiment according to the present invention. Hereat, taking a FET wherein a channel layer is compound of InGaAs and a gate layer, p$^+$-GaAs, as an example, a description is given. In the conventional technique described above, a p$^+$-GaAs gate layer is formed on an AlGaAs layer and the energy of the valance band gently decreases towards the channel layer (the broken line). In contrast with this, in a field effect transistor according to the present invention wherein a p$^+$-GaAs gate layer is formed on an InGaP layer, the energy of the valance band rapidly drops at the interface (the solid line). Consequently, in the field effect transistor of the present invention, it becomes more difficult for holes to reach the channel when the gate voltage is applied and, thus, avalanche breakdown becomes less likely to occur. As a result, a JFET with a high withstand voltage and a capability of stable operations can be provided.

Hitherto, an InGaP layer has been in use as an etching stopper layer, since it has a high etching selectivity to As-based materials. Yet, a fact that formation of an InGaP layer between a gate layer and a channel layer of different conductive types can provide the effects described above was utterly unknown, and such effects are primarily recognized by the present inventors.

Further, an InGaP layer does not contain Al which is liable to be oxidized. When a semiconductor layer is formed on said InGaP layer by regrowth, therefore, a structure of excellent morphology with few interface states can be attained. Moreover, a high etching selection ratio obtainable herein as described above enables the wet etching to be employed with little damage so that deterioration of high frequency characteristic as well as dispersion of various characteristics of the FET, when fabricated, can be much reduced.

Further, in the present invention, the above effects can be held even if an InGaAsP layer is inserted between this InGaP layer and the gate layer.

Now, referring to the accompanying drawings, the preferred embodiments of the present invention are described below. However, it is to be understood the present invention is not limited to these specific embodiments.

EXAMPLE 1

Figure 2:
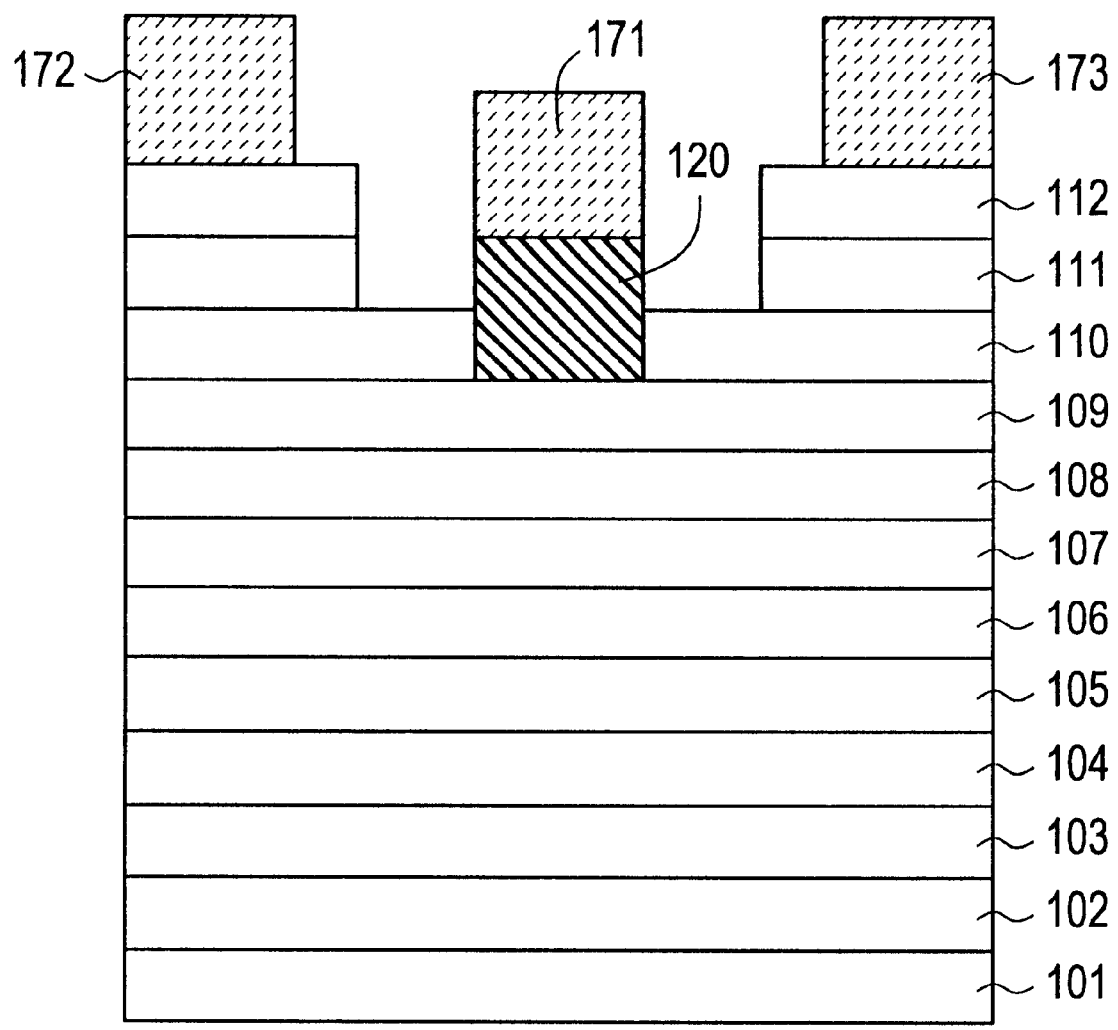
FIG. 2 is a schematic cross-sectional view showing the first embodiment of the present invention.

FIG. 2 is a cross-sectional view showing the structure of the first embodiment of the present invention and FIGS. 3–6 are cross-sectional views illustrating, in sequence, the steps of a method of manufacturing the same embodiment. Referring to FIGS. 2–6, the first embodiment is described in detail below.

Figure 3:
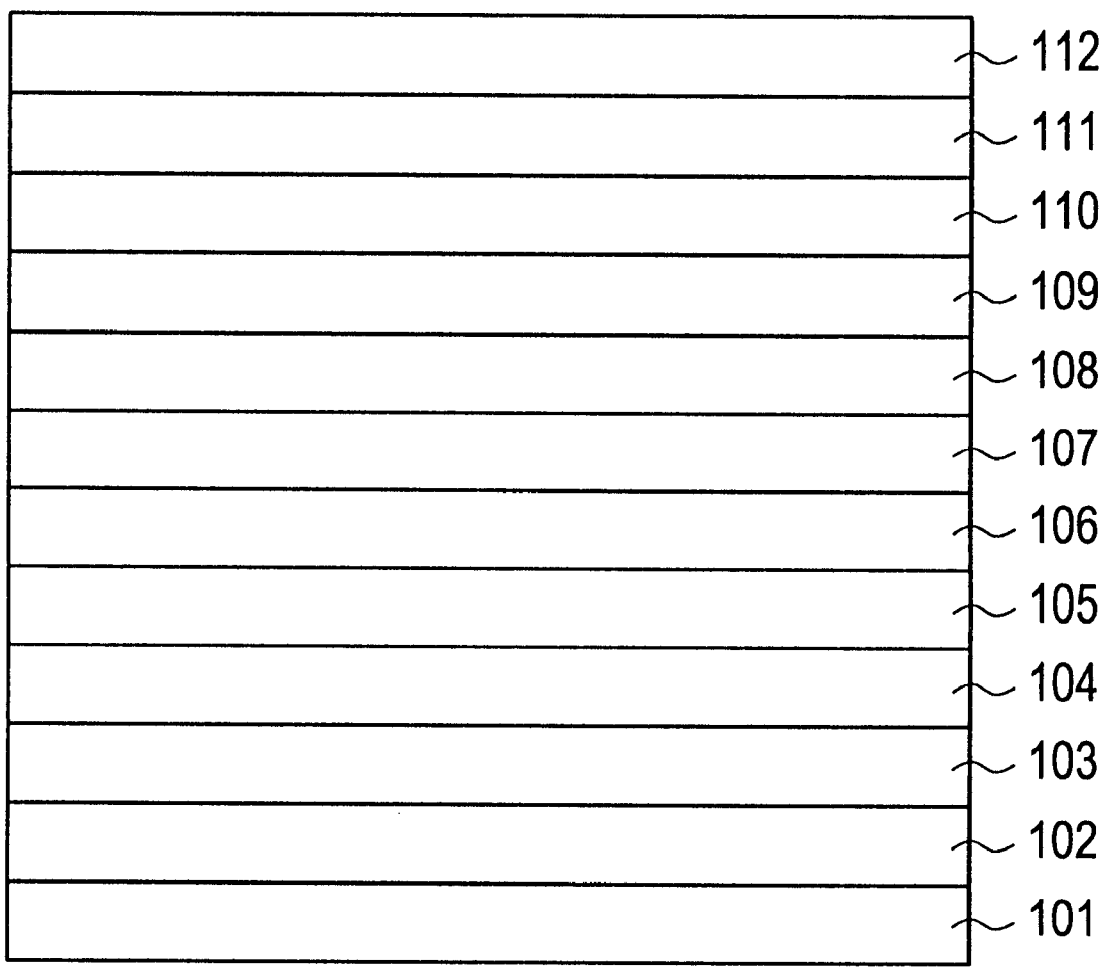
FIGS. 3–6 are a series of schematic cross-sectional views illustrating the steps of a method of manufacturing the first embodiment.

On a semi-insulating GaAs substrate 101, a GaAs buffer layer 102 with a thickness of 400 nm, an undoped $Al_{0.2}Ga_{0.8}As$ buffer layer 103 with a thickness of 100 nm, a $4\times10^{18}$ cm$^{-3}$ Si-doped $Al_{0.2}Ga_{0.8}As$ electron supply layer 104 with a thickness of 4 nm, an undoped $Al_{0.2}Ga_{0.8}As$ spacer layer 105 with a thickness of 2 nm, an undoped $In_{0.2}Ga_{0.8}As$ channel layer 106 with a thickness of 15 nm, an undoped $Al_{0.2}Ga_{0.8}As$ spacer layer 107 with a thickness of 2 nm, a $4\times10^{18}$ cm$^{-3}$ Si-doped $Al_{0.2}Ga_{0.8}As$ electron supply layer 108 with a thickness of 9 nm, an undoped $In_{0.49}Ga_{0.51}P$ layer 109 with a thickness of 17 nm, an undoped GaAs buried layer 110 with a thickness of 30 nm, a $4\times10^{18}$ cm$^{-3}$ Si-doped $Al_{0.2}Ga_{0.8}As$ wide recess stopper layer 111 with a thickness of 6 nm and a $4\times10^{18}$ cm$^{-3}$ Si-doped GaAs cap layer 112 with a thickness of 100 nm are formed, in succession, by epitaxial growth, using either the molecular beam epitaxy (MBE) method or the MOCVD method. FIG. 3 shows the structure after the epitaxial growth.

Figure 4:
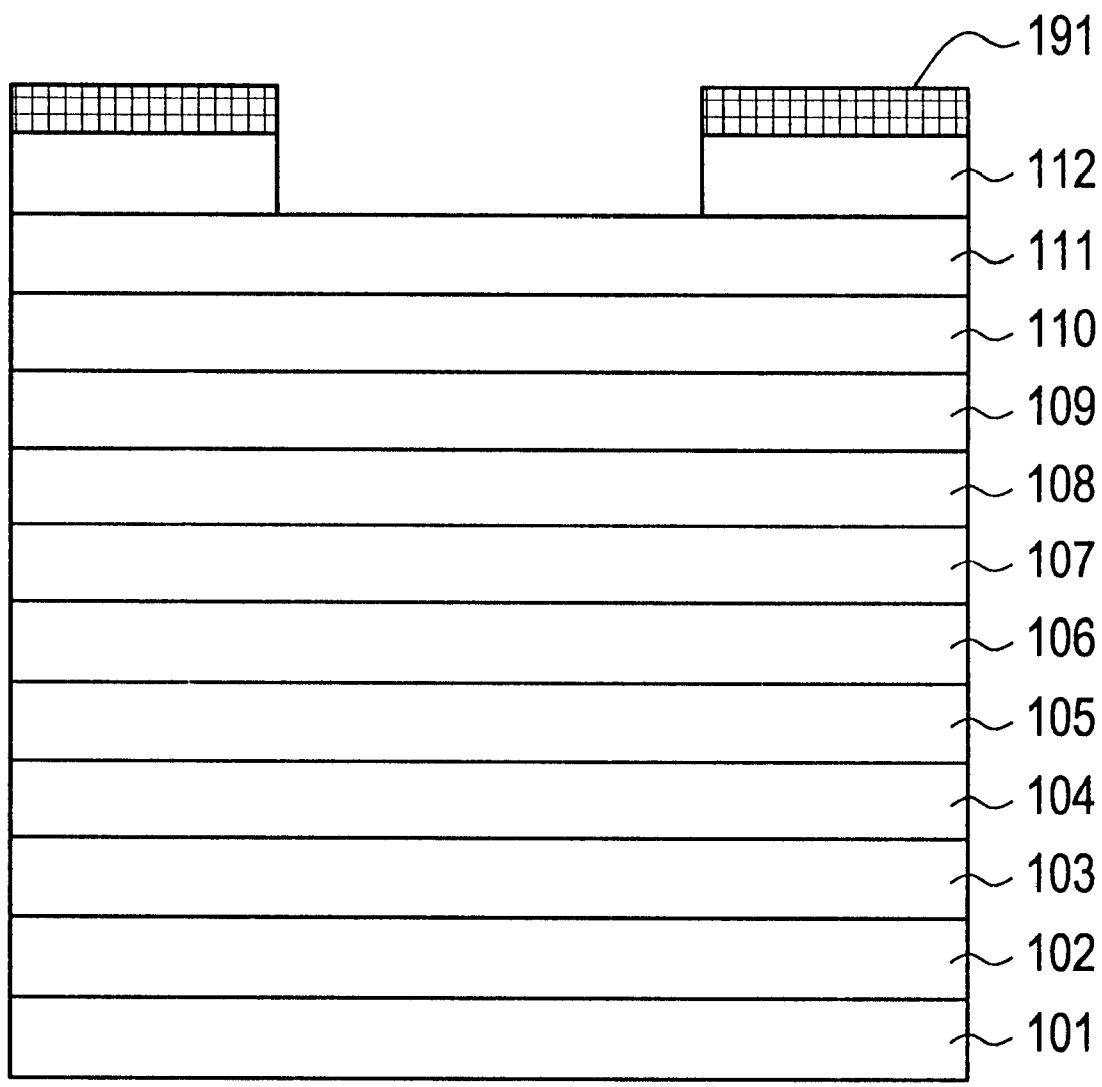

Next, as shown in FIG. 4, on the wafer fabricated as above, a mask 191 having an opening for a wide recess (a second recess) is formed, and, using the $Al_{0.2}Ga_{0.8}As$ wide recess stopper layer 111 as an etching stopper layer, the GaAs cap layer 112 is selectively etched. The selective etching of this sort can be carried out by dry etching in which either an ECR (Electron Cyclotron Resonance) etching apparatus or a RIE (Reactive Ion Etching) apparatus is used and a mixed gas (such as $BCl_3+SF_6$) of a chloride gas containing only chlorine as a halogen element and a fluoride gas containing only fluorine as a halogen element is supplied thereto.

Figure 5:
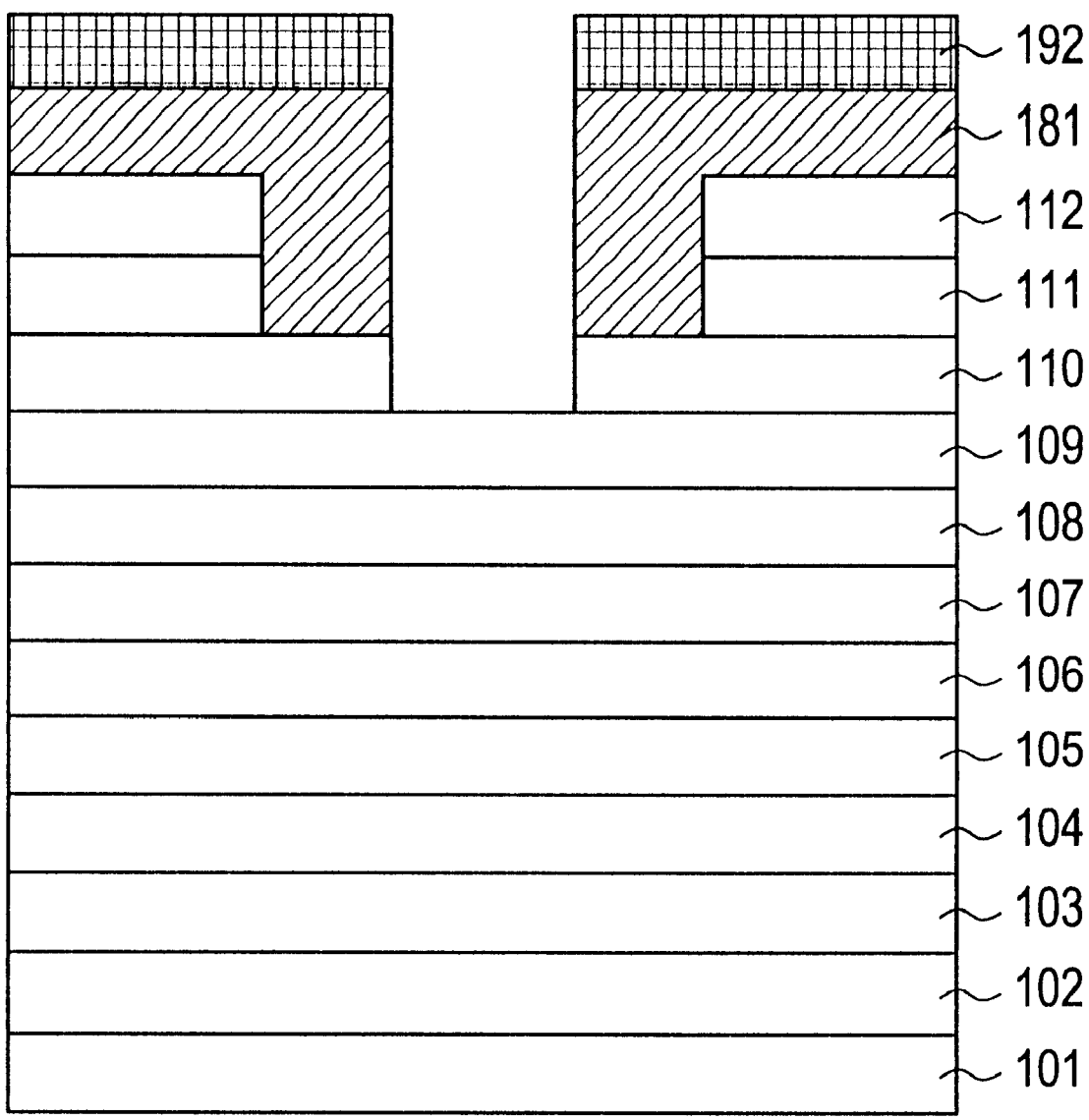

After an exposed portion of the $Al_{0.2}Ga_{0.8}As$ wide recess stopper layer 111 and the mask 191 are removed, a $SiO_2$ film 181 is formed over the entire surface. A mask 192 having an opening for a gate recess section (a first recess) is formed afresh and the $SiO_2$ film 181 is etched. The undoped GaAs buried layer 110 with a thickness of 30 nm is then selectively etched by means of wet etching with, for instance, a sulfuric acid base etchant, using $In_{0.49}Ga_{0.51}P$ layer 109 as an etching stepper layer. FIG. 5 shows the structure after the wet etching.

Figure 6:
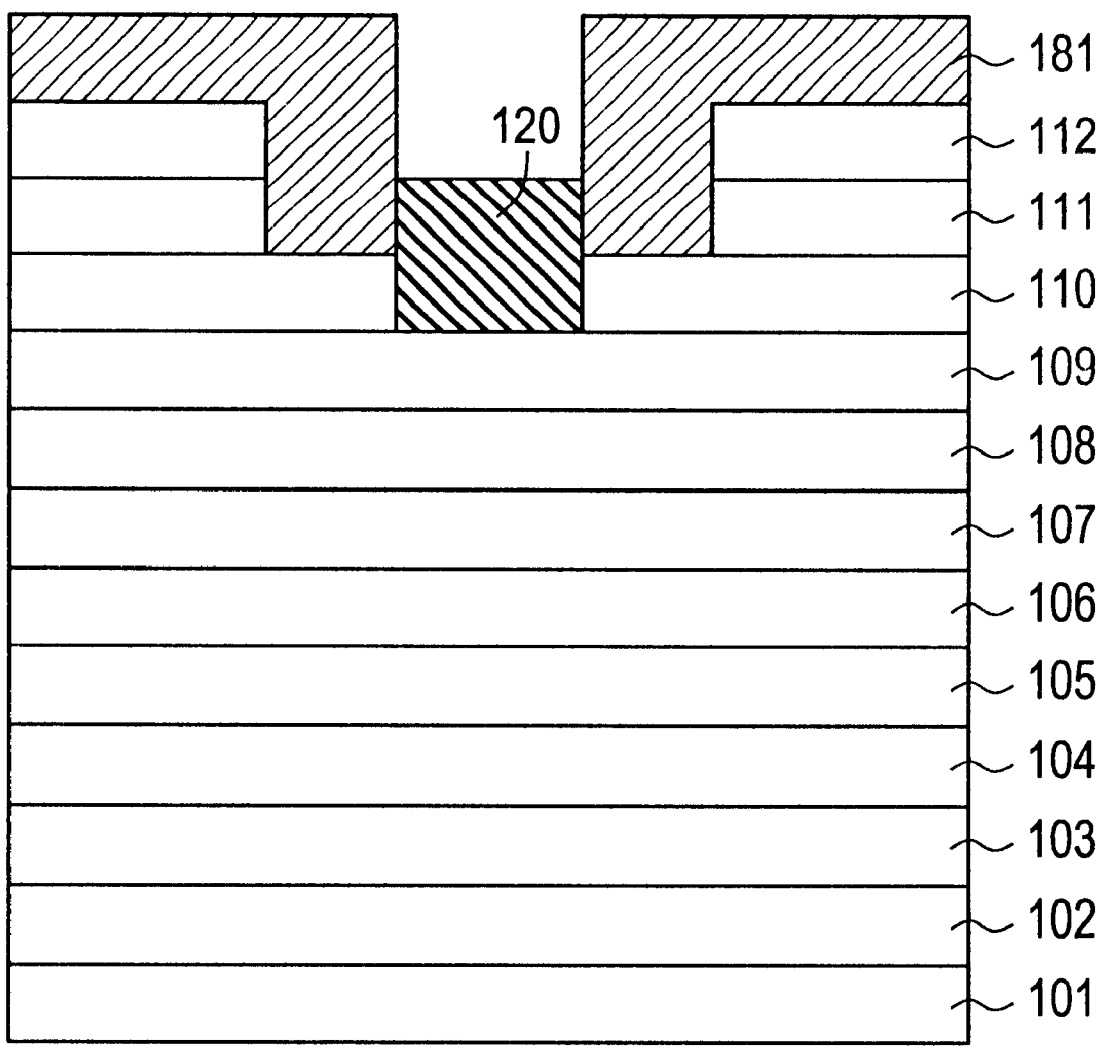

Next, as shown in FIG. 6, after the mask 192 is removed, a p$^+$-GaAs layer 120 doped with $1\times10^{20}$ cm$^{-3}$ Zn or C is grown on the exposed portion of the $In_{0.49}Ga_{0.51}P$ layer 109 lying in the gate opening section by the MBE method or the MOCVD method, using the SiO$_2$ film 181 as a mask.

A gate electrode 171 is then formed on the p$^+$-GaAs layer 120. Next, a source electrode 172 and a drain electrode 173 are formed as ohmic electrodes with AuGe by means of deposition, lift-off and alloying (for example, 400° C./1 min), and the structure of FIG. 2 is accomplished.

With this structure, when a semiconductor of p$^+$-type conductivity, that is, the p$^+$-GaAs layer 120 is formed, morphology thereof can be improved and the interface states, greatly reduced, and thereby high frequency characteristic of the JFET can be enhanced. Moreover, an introduction of an InGaP layer enables the wet etching to be employed with little damage in fabrication of a JFET. This can much reduce deterioration of high frequency characteristic as well as dispersion of various characteristics. Further, through the use of an InGaP layer, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations.

EXAMPLE 2

Figure 7:
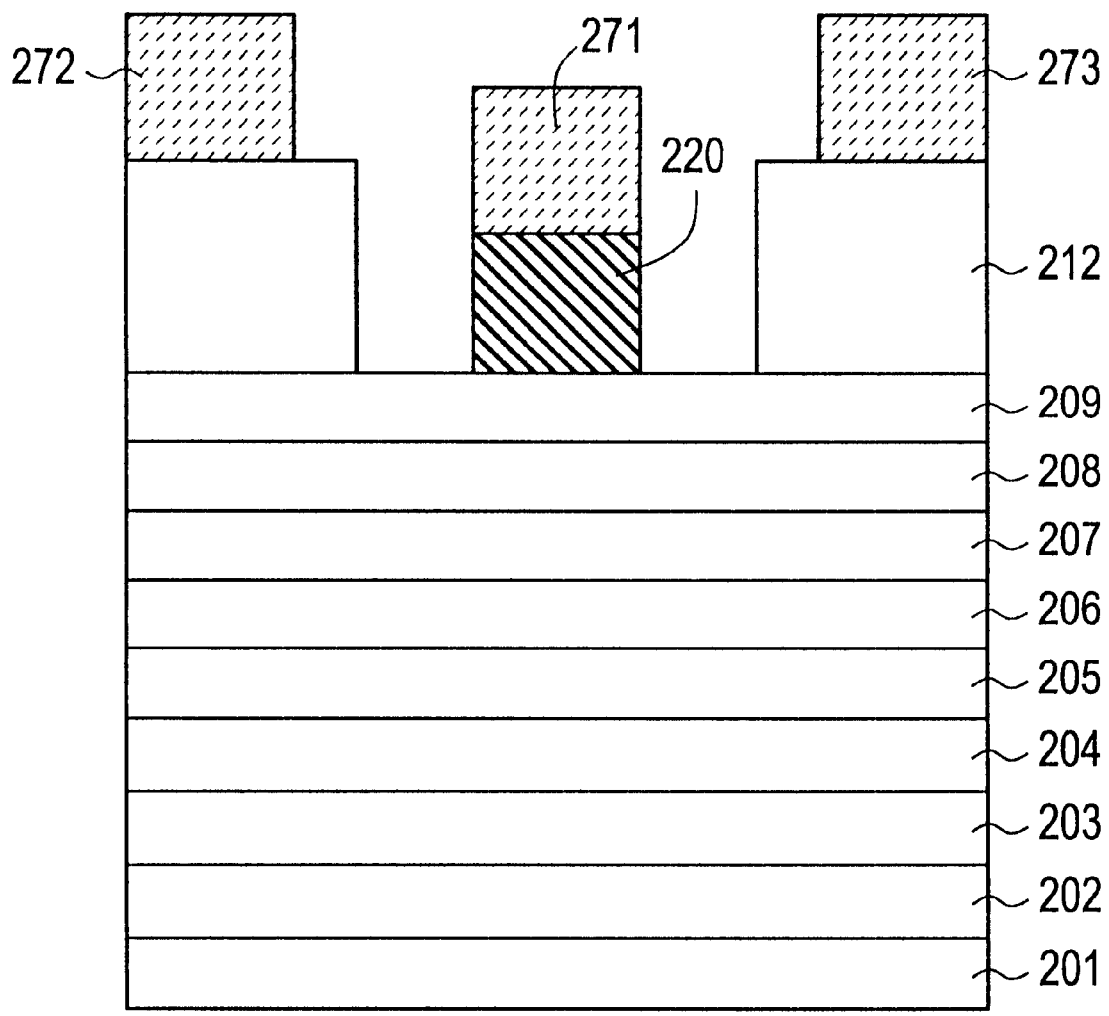
FIG. 7 is a schematic cross-sectional view showing the second embodiment of the present invention.

FIG. 7 is a cross-sectional view showing the structure of the second embodiment of the present invention and FIGS. 8–11 are cross-sectional views illustrating, in sequence, the steps of a method of manufacturing the same embodiment. Referring to FIGS. 7–11, the second embodiment is described in detail below.

Figure 8:
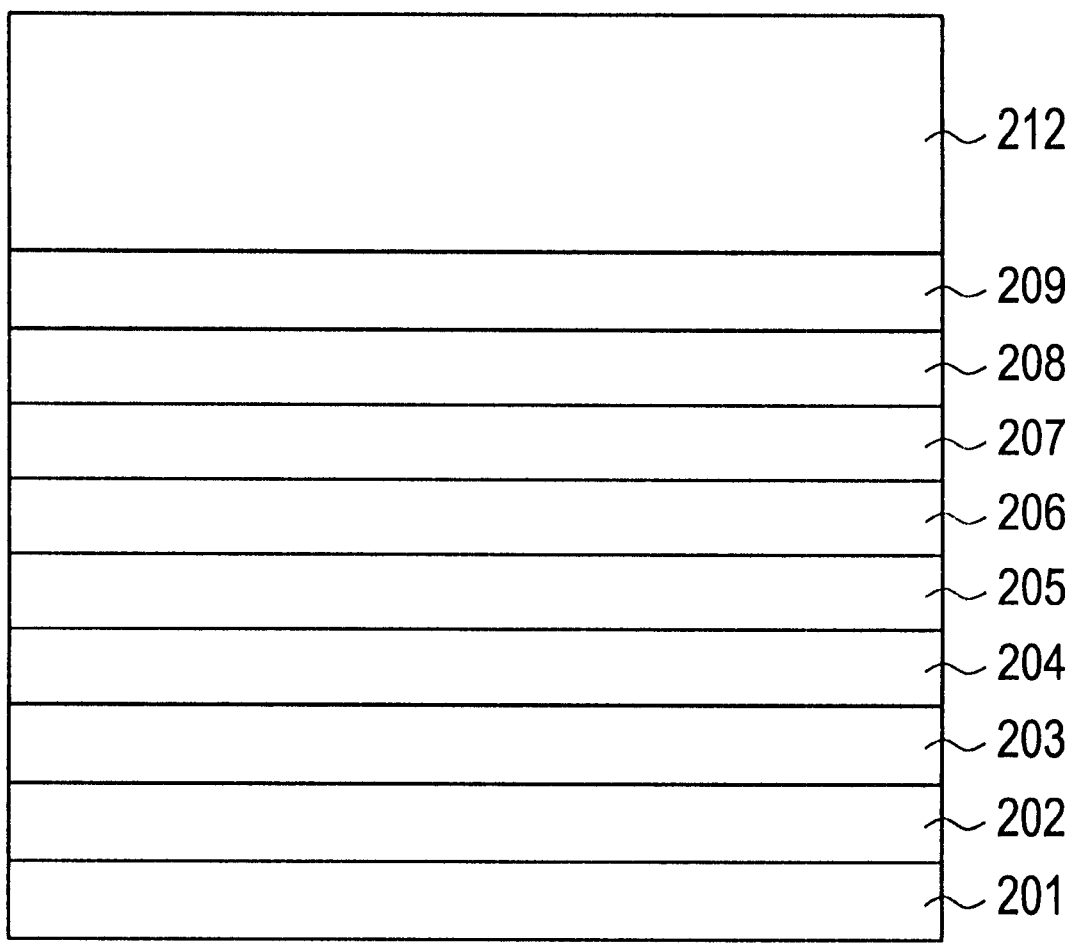
FIGS. 8–11 are a series of schematic cross-sectional views illustrating the steps of a method of manufacturing the second embodiment.

On a semi-insulating GaAs substrate 201, a GaAs buffer layer 202 with a thickness of 400 nm, an undoped Al$_{0.2}$Ga$_{0.8}$As buffer layer 203 with a thickness of 100 nm, a $4 \times 10^{18}$ cm$^{-3}$ Si-doped Al$_{0.2}$Ga$_{0.8}$As electron supply layer 204 with a thickness of 4 nm, an undoped Al$_{0.2}$Ga$_{0.8}$As spacer layer 205 with a thickness of 2 nm, an undoped In$_{0.2}$Ga$_{0.8}$As channel layer 206 with a thickness of 15 nm, an undoped Al$_{0.2}$Ga$_{0.8}$As spacer layer 207 with a thickness of 2 nm, a $4 \times 10^{18}$ cm$^{-3}$ Si-doped Al$_{0.2}$Ga$_{0.8}$As electron supply layer 208 with a thickness of 9 nm, an undoped In$_{0.49}$Ga$_{0.51}$P layer 209 with a thickness of 17 nm, and a $4 \times 10^{18}$ cm$^{-3}$ Si-doped GaAs cap layer 212 with a thickness of 100 nm are formed, in succession, by epitaxial growth, using either the MBE method or the MOCVD method. FIG. 8 shows the structure after the epitaxial growth.

Figure 9:
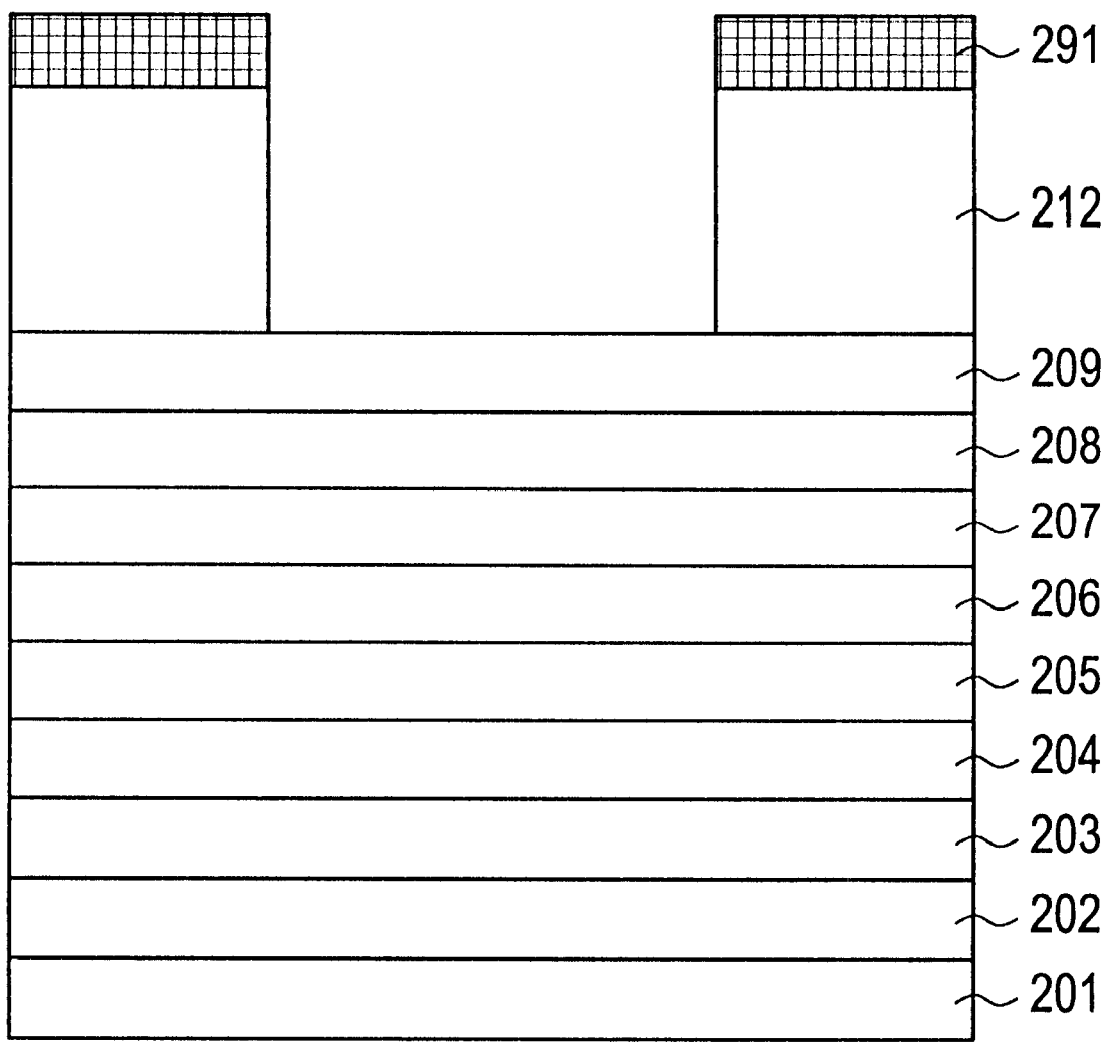
Figure 10:
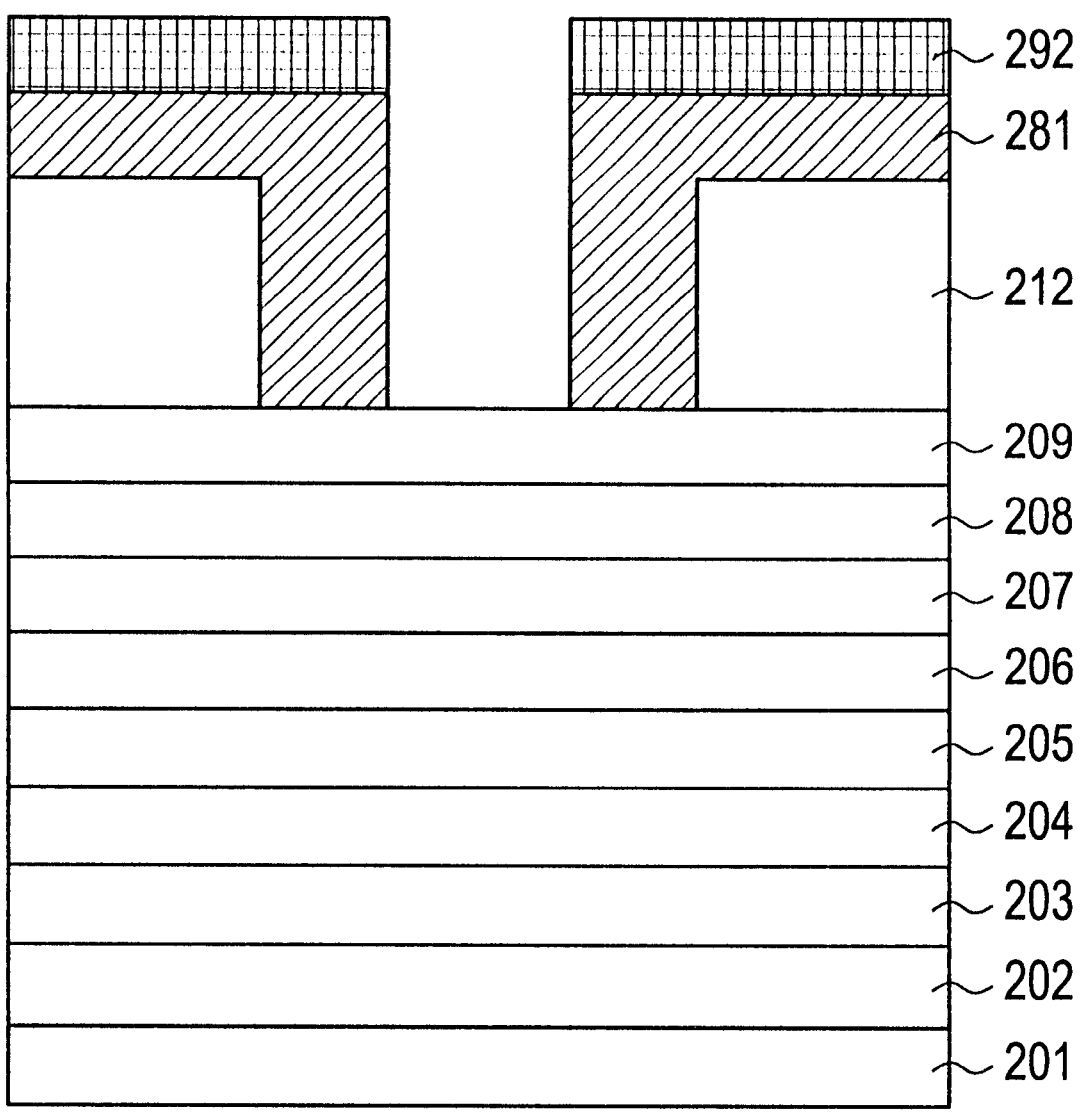

Next, on the wafer fabricated as above, a mask 291 having an opening for a wide recess is formed, and, using the In$_{0.49}$Ga$_{0.51}$P layer 209 as a stopper layer, the GaAs cap layer 212 is selectively etched by means of wet etching with, for instance, a sulfuric acid based etchant. FIG. 9 shows the structure after the wet etching.

Figure 11:
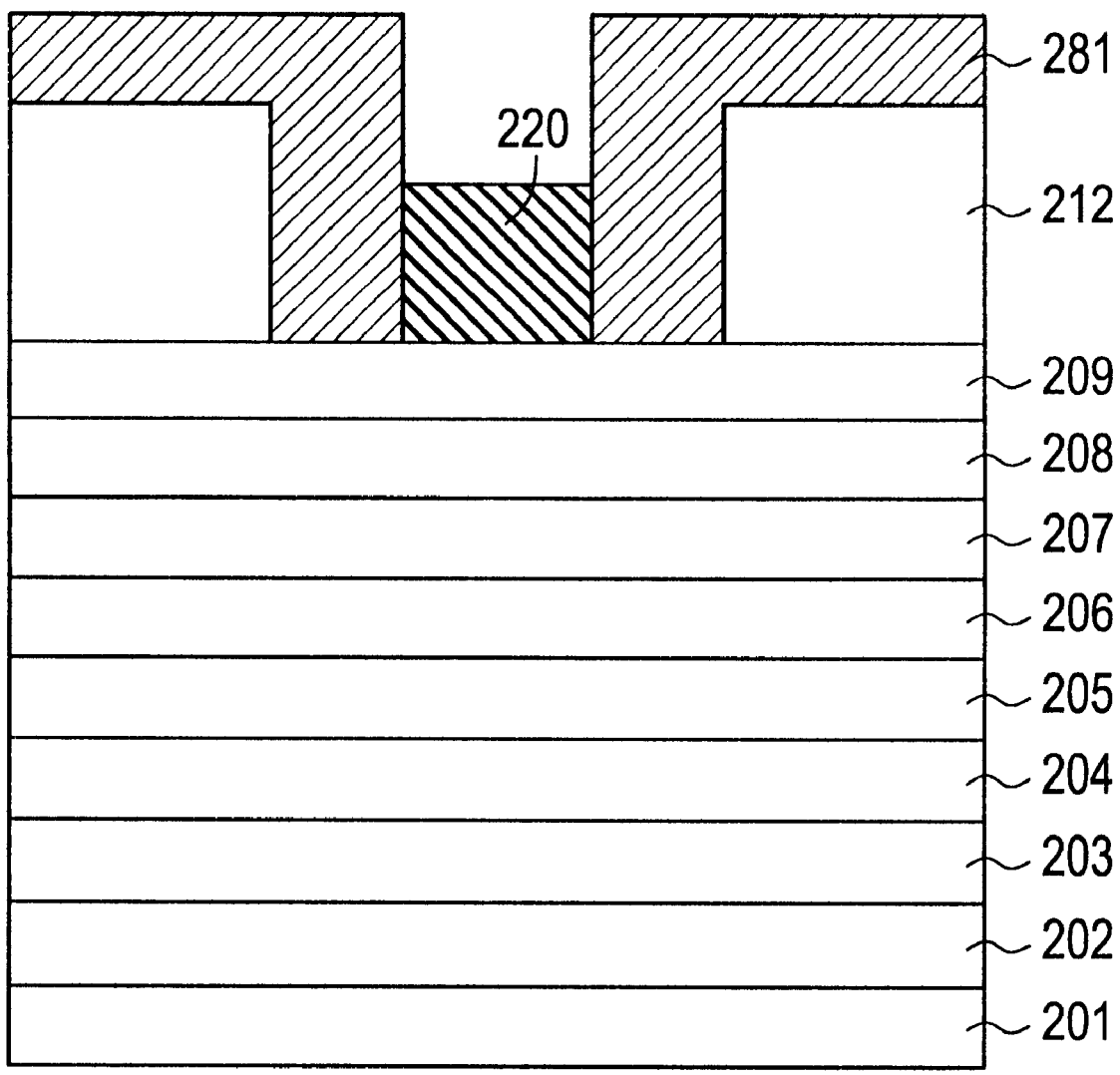

After the mask 291 is removed, a SiO$_2$ film 281 is formed over the entire surface. A mask 292 having an opening for a gate recess is formed afresh and the SiO$_2$ film 281 is etched. Next, as shown in FIG. 11, after the mask 292 is removed, a p$^+$-GaAs layer 220 doped with $1 \times 10^{20}$ cm$^{-3}$ Zn or C is grown on the exposed portion of the In$_{0.49}$Ga$_{0.51}$P layer 219 lying in the gate opening section by the MBE method or the MOCVD method, using the SiO$_2$ film 281 as a mask.

A gate electrode 271 is then formed on the p$^+$-GaAs layer 220. Next, a source electrode 272 and a drain electrode 273 are formed as ohmic electrodes with AuGe by means of deposition, lift-off and alloying (for example, 400° C./1 min), and the structure of FIG. 7 is accomplished.

With this structure, when a semiconductor of p$^+$-type conductivity is formed, morphology thereof can be improved and the interface states, greatly reduced, and thereby high frequency characteristic of the JFET can be enhanced. Moreover, an introduction of an InGaP layer enables the wet etching to be employed with little damage in fabrication of a JFET. This can much reduce deterioration of high frequency characteristic as well as dispersion of various characteristics. Further, through the use of an InGaP layer, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations.

EXAMPLE 3

Figure 12:
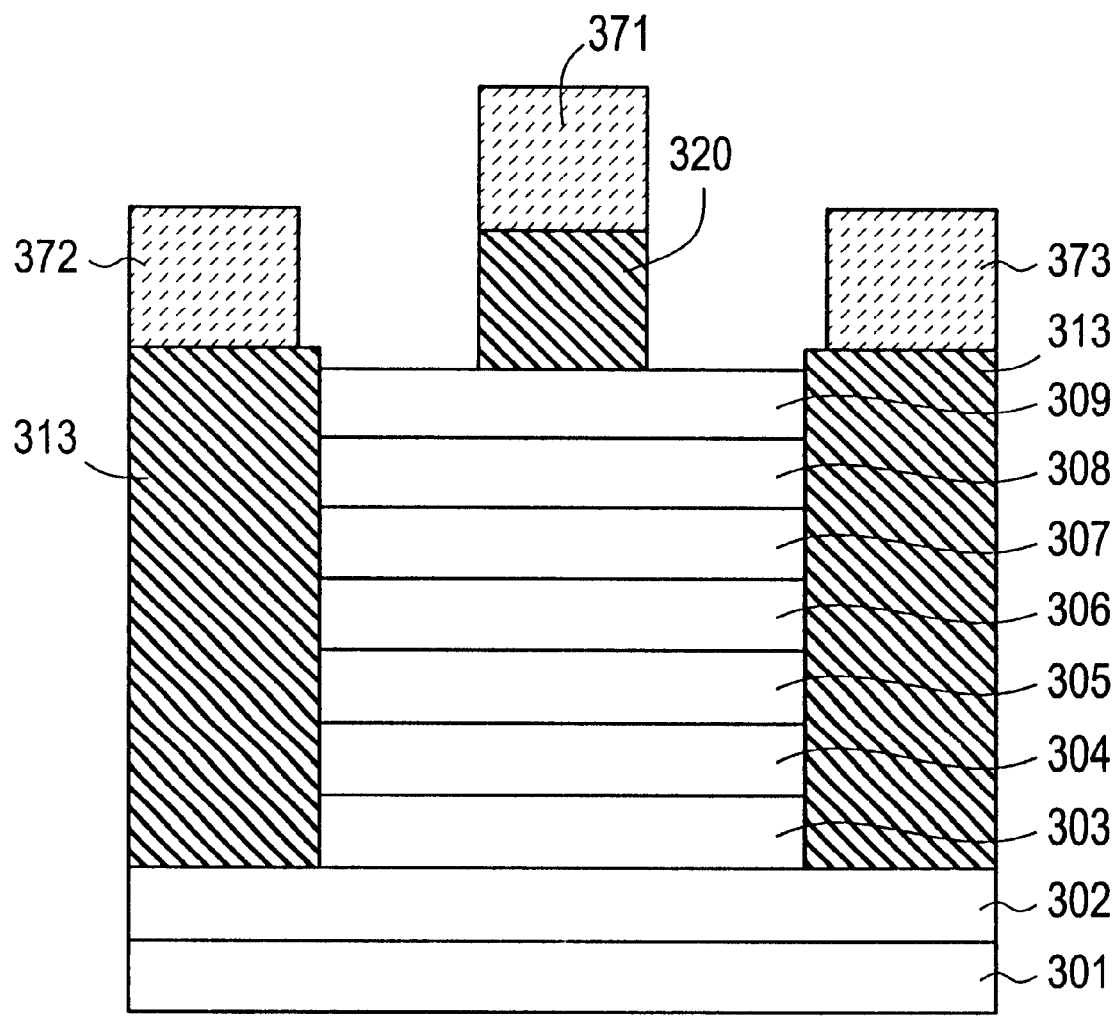
FIG. 12 is a schematic cross-sectional view showing the third embodiment of the present invention.

FIG. 12 is a cross-sectional view showing the structure of the third embodiment of the present invention and FIGS. 13–16 are cross-sectional views illustrating, in sequence, the steps of a method of manufacturing the same embodiment. Referring to FIGS. 12–16, the third embodiment is described in detail below.

Figure 13:
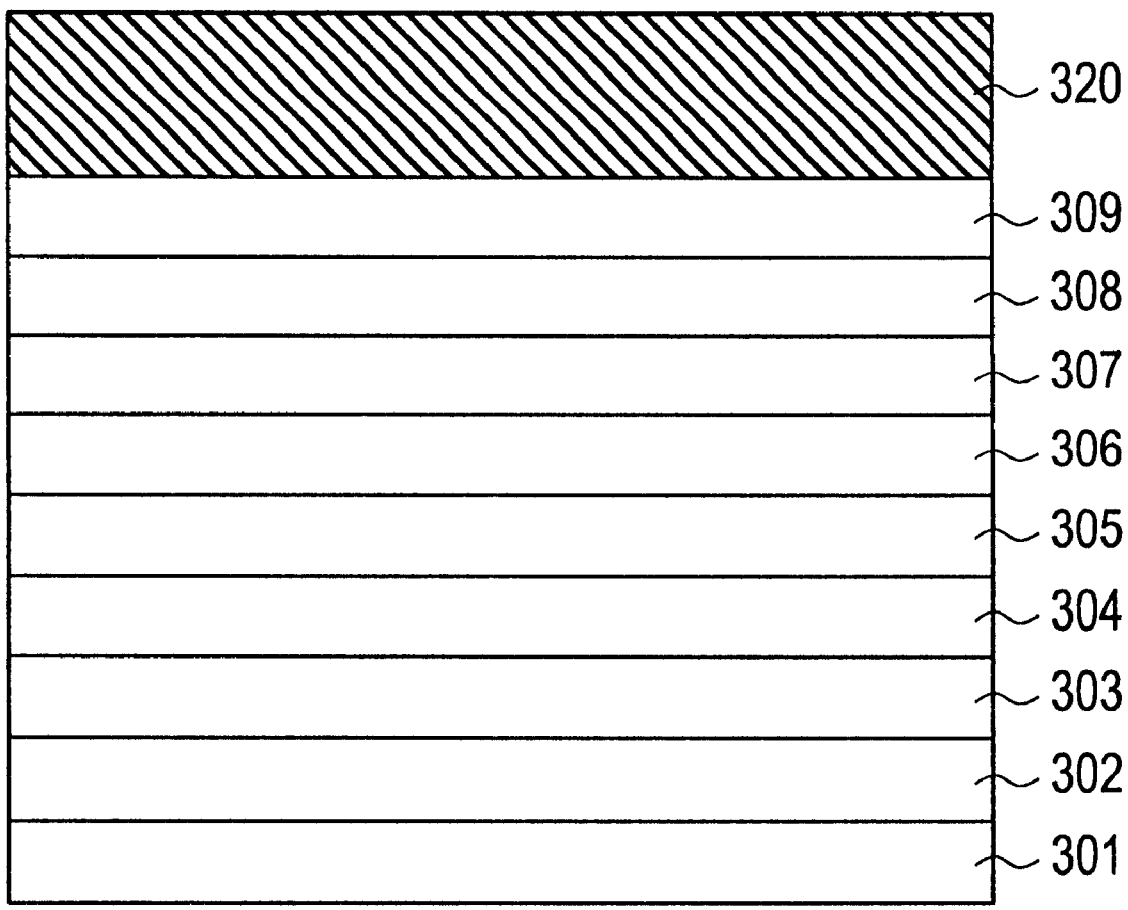
FIGS. 13–16 are a series of schematic cross-sectional views illustrating the steps of a method of manufacturing the third embodiment.

On a semi-insulating GaAs substrate 301, a GaAs buffer layer 302 with a thickness of 400 nm, an undoped Al$_{0.2}$Ga$_{0.8}$As buffer layer 303 with a thickness of 100 nm, a $4 \times 10^{18}$ cm$^{-3}$ Si-doped Al$_{0.2}$Ga$_{0.8}$As electron supply layer 304 with a thickness of 4 nm, an undoped Al$_{0.2}$Ga$_{0.8}$As spacer layer 305 with a thickness of 2 nm, an undoped In$_{0.2}$Ga$_{0.8}$As channel layer 306 with a thickness of 15 nm, an undoped Al$_{0.2}$Ga$_{0.8}$As spacer layer 307 with a thickness of 2 nm, a $4 \times 10^{18}$ cm$^{-3}$ Si-doped Al$_{0.2}$Ga$_{0.8}$As electron supply layer 308 with a thickness of 9 nm, an undoped In$_{0.49}$Ga$_{0.51}$P layer 309 with a thickness of 17 nm, and a p$^+$-GaAs layer 320 doped with $1 \times 10^{20}$ cm$^{-3}$ Zn or C are formed, in succession, by epitaxial growth, using either the MBE method or the MOCVD method. FIG. 13 shows the structure after the epitaxial growth.

Figure 14:
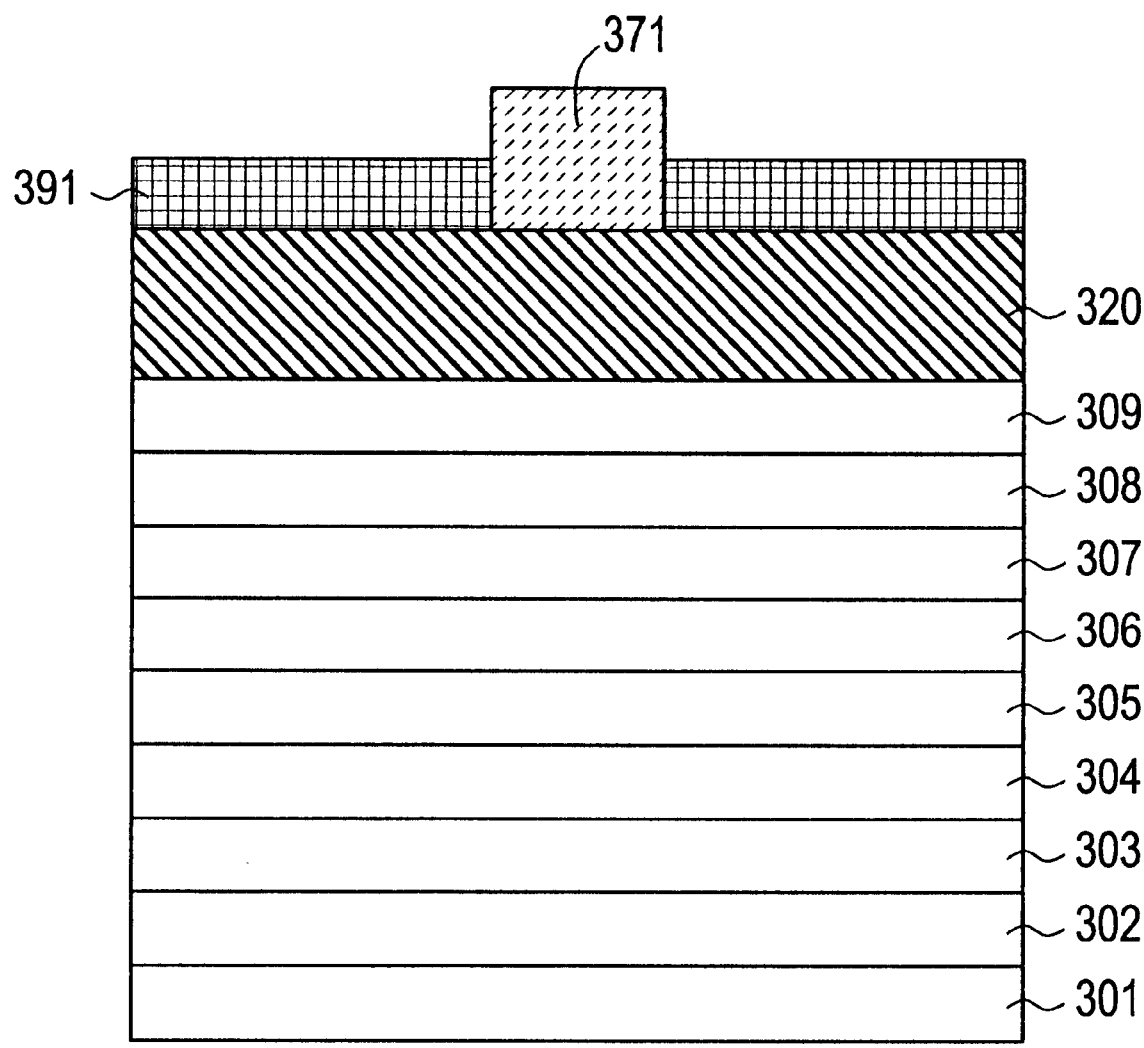

Next, as shown in FIG. 14, a mask 391 is formed, and, then, a gate electrode 371 is formed. After the mask 391 is removed, portions of the p$^+$-GaAs layer 320 other than that beneath the gate electrode 371 is selectively etched using the gate electrode 371 as a mask, by means of wet etching with, for instance, a sulfuric acid based etchant.

Figure 15:
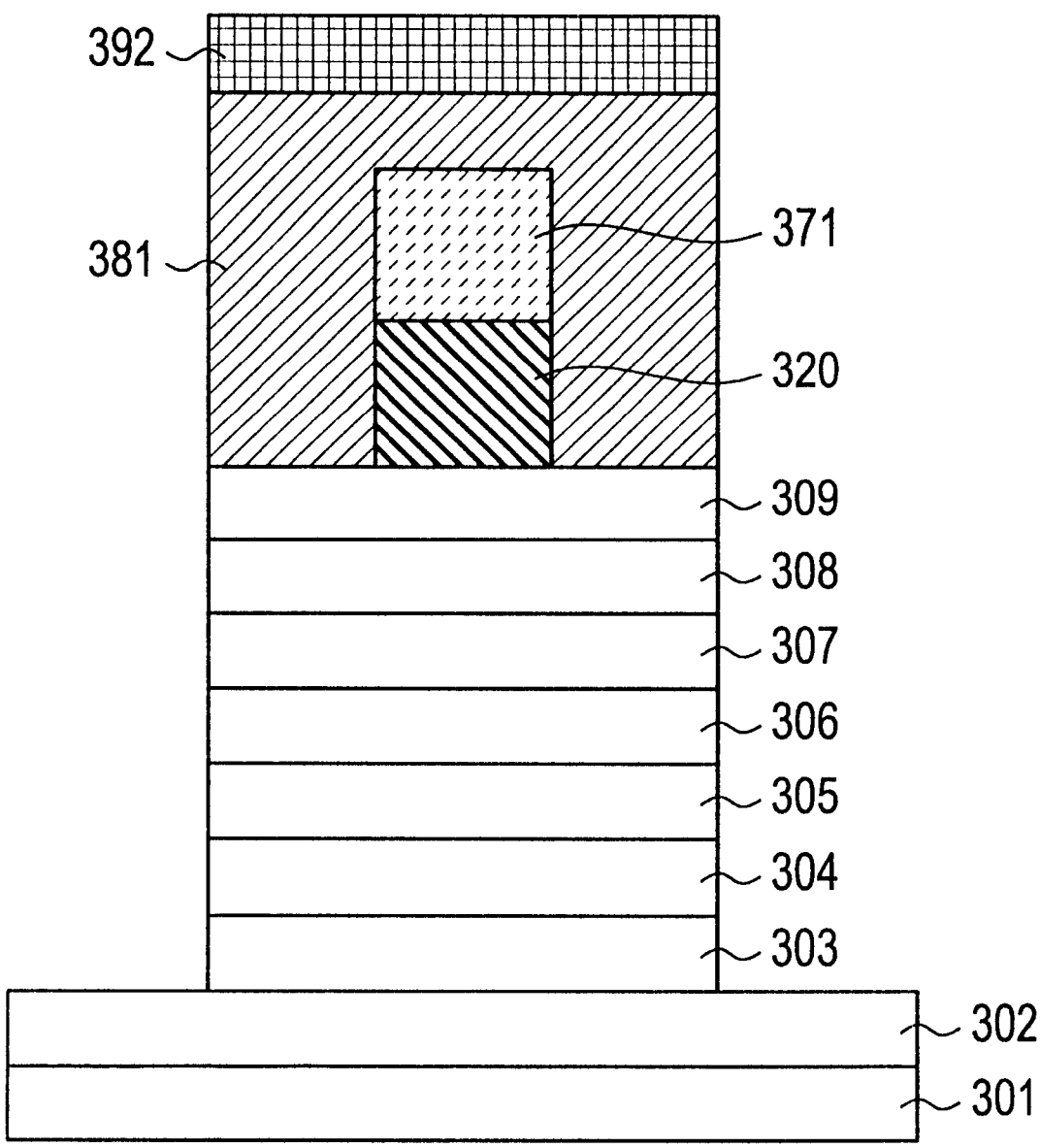
Figure 16:
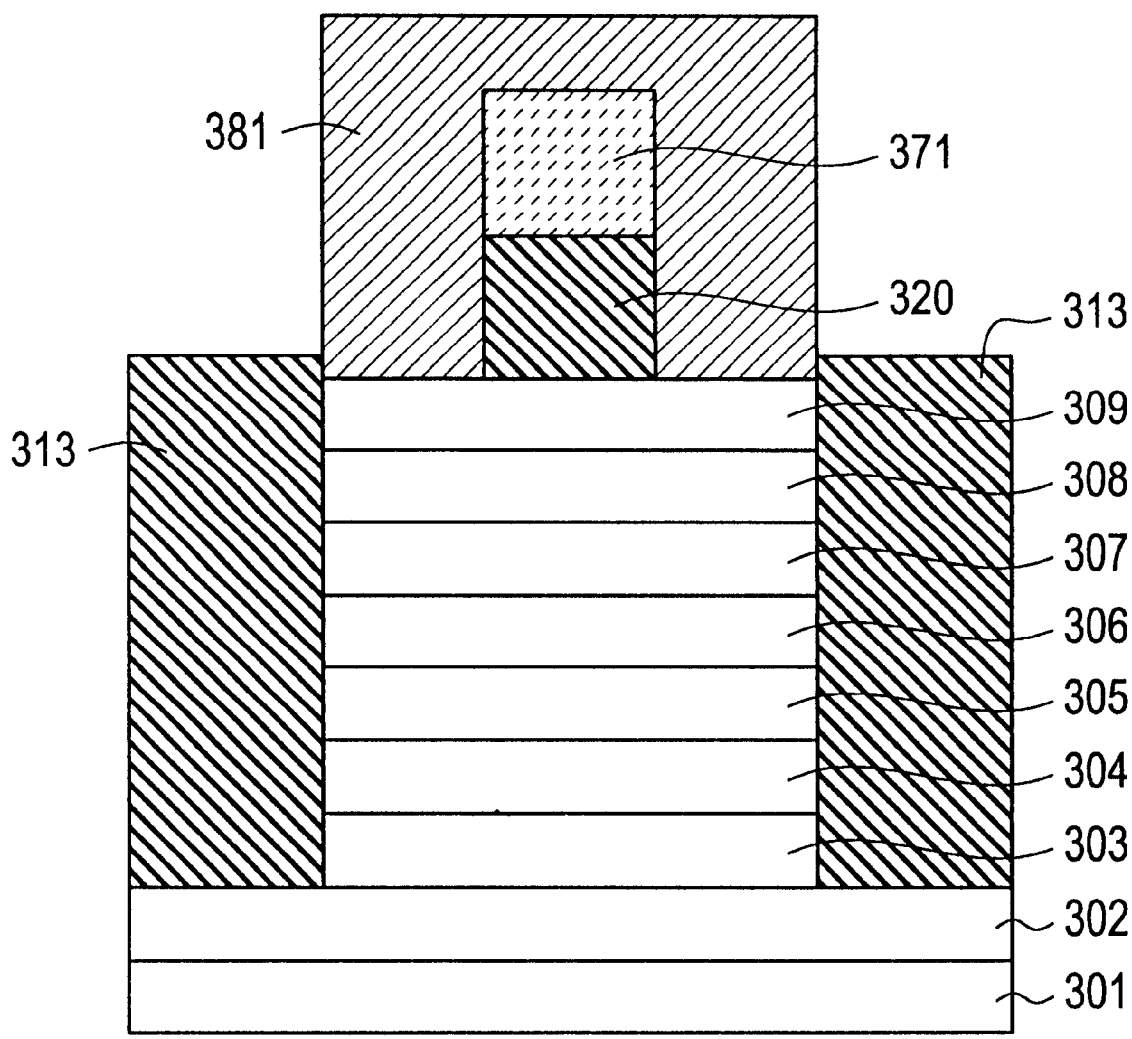

Next, a SiO$_2$ film 381 is applied over the entire surface. After that, as shown in FIG. 15, a mask 392 is formed, and portions of layers 381, 303–309 are removed. After removing the mask 392, the SiO$_2$ film 381 is used as a mask and, by the MBE method or the MOCVD method, $4 \times 10^{18}$ cm$^{-3}$ Si-doped n$^+$-GaAs ohmic contact layers 313 are grown to fill source/drain electrode sections. FIG. 16 shows the structure after the layer 313 is grown. Subsequently, a source electrode 372 and a drain electrode 373 are formed as Example 1 and the structure of FIG. 12 is obtained.

With this structure, the contact resistance from the source/drain electrodes to the channel layer can be lowered. Further, the etching of the p$^+$-GaAs layer 320, in this method, is performed, using the gate electrode as a mask, the gate formation is accomplished with excellent uniformity. Further, through the use of an InGaP layer, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations.

EXAMPLE 4

Figure 17:
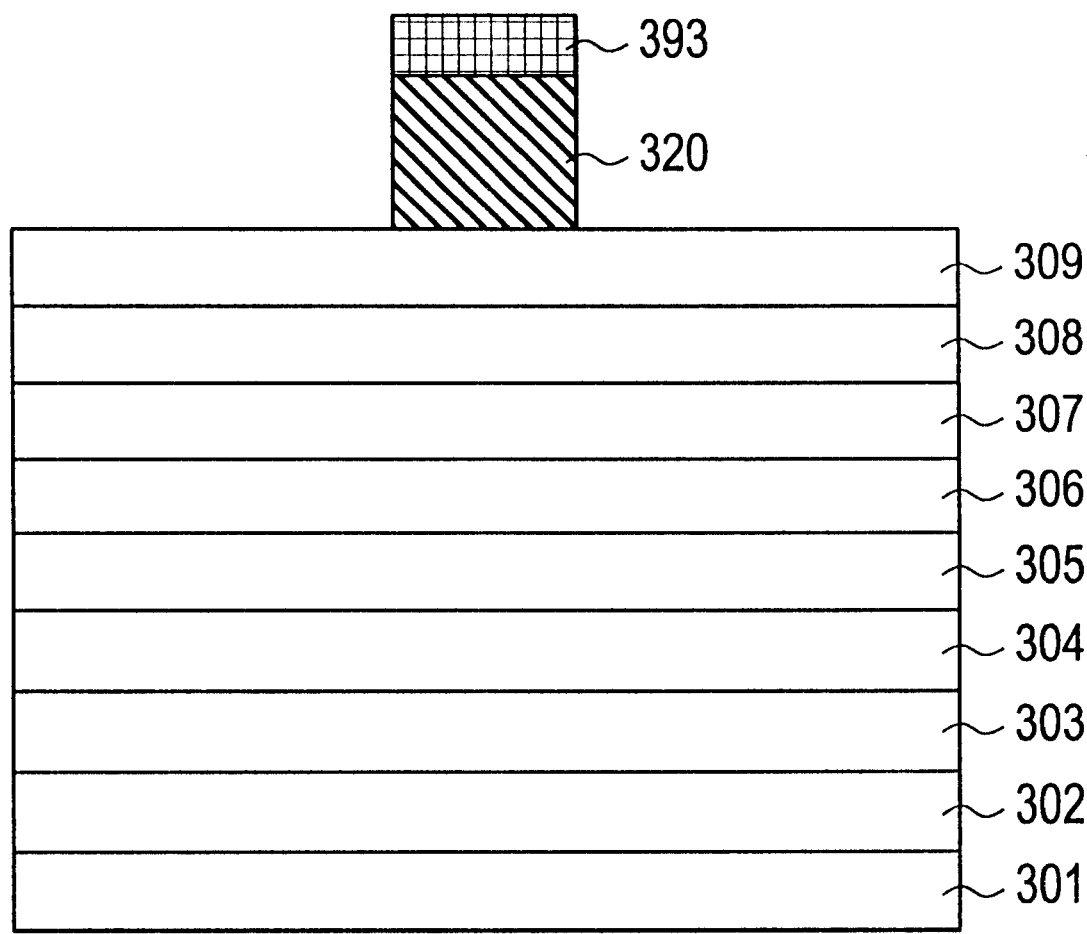
FIGS. 17–20 are a series of schematic cross-sectional views illustrating the steps of another method of manufacturing the third embodiment.
Figure 18:
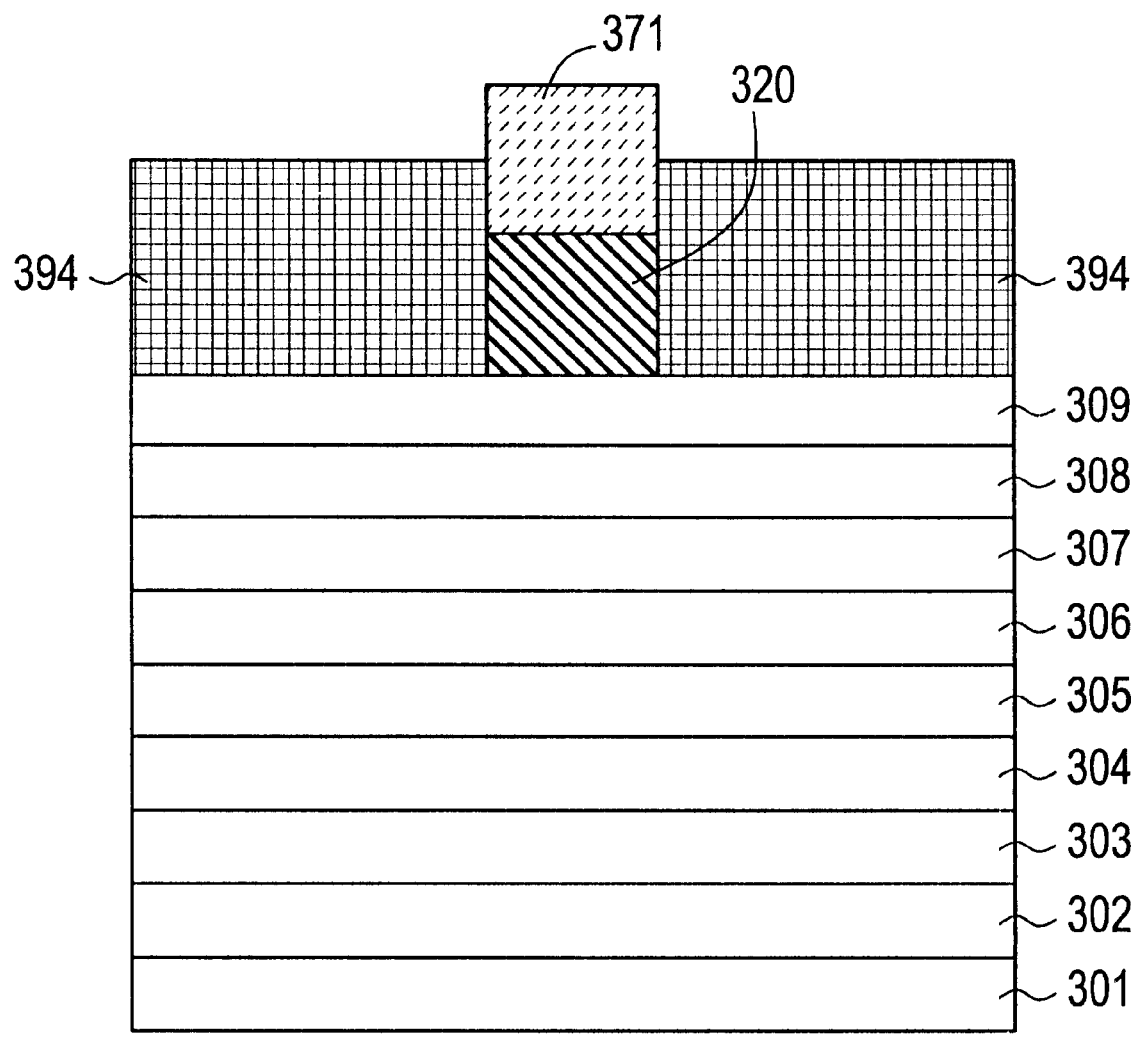

Another method of manufacturing the third embodiment shown in FIG. 12 is described. FIGS. 17–18 are cross-sectional views illustrating the steps of another method of manufacturing the same embodiment. Referring to FIGS. 12, 13, 17, 18, 15 and 16, the present embodiment is described in detail, below.

After the structure shown in FIG. 13 is obtained in the same way as in Example 3, a mask 393 is formed on the fabricated wafer, and, using the undoped $In_{0.49}Ga_{0.51}P$ layer 309 as an etching stopper layer, the $p^+$-GaAs layer 320 is selectively etched by means of wet etching with, for instance, a sulfuric acid based etchant, as shown in FIG. 17.

Next, as shown in FIG. 18, after removing the mask 393, masks 394 are formed, and a gate electrode 371 is formed on the $p^+$-GaAs layer 320.

Next, after removing the masks 394, the steps illustrated by FIGS. 15 and 16 are performed as Example 3, whereby $4 \times 10^{18}$ cm$^{-3}$ Si-doped $n^+$-GaAs ohmic contact layers 313 are grown to fill source/drain electrode sections, by the MBE method or the MOCVD method, and a source electrode 372 and a drain electrode 373 are formed so as to accomplish the structure of FIG. 12.

This method can also provide excellent uniformity in formation of the gate.

EXAMPLE 5

Figure 19:
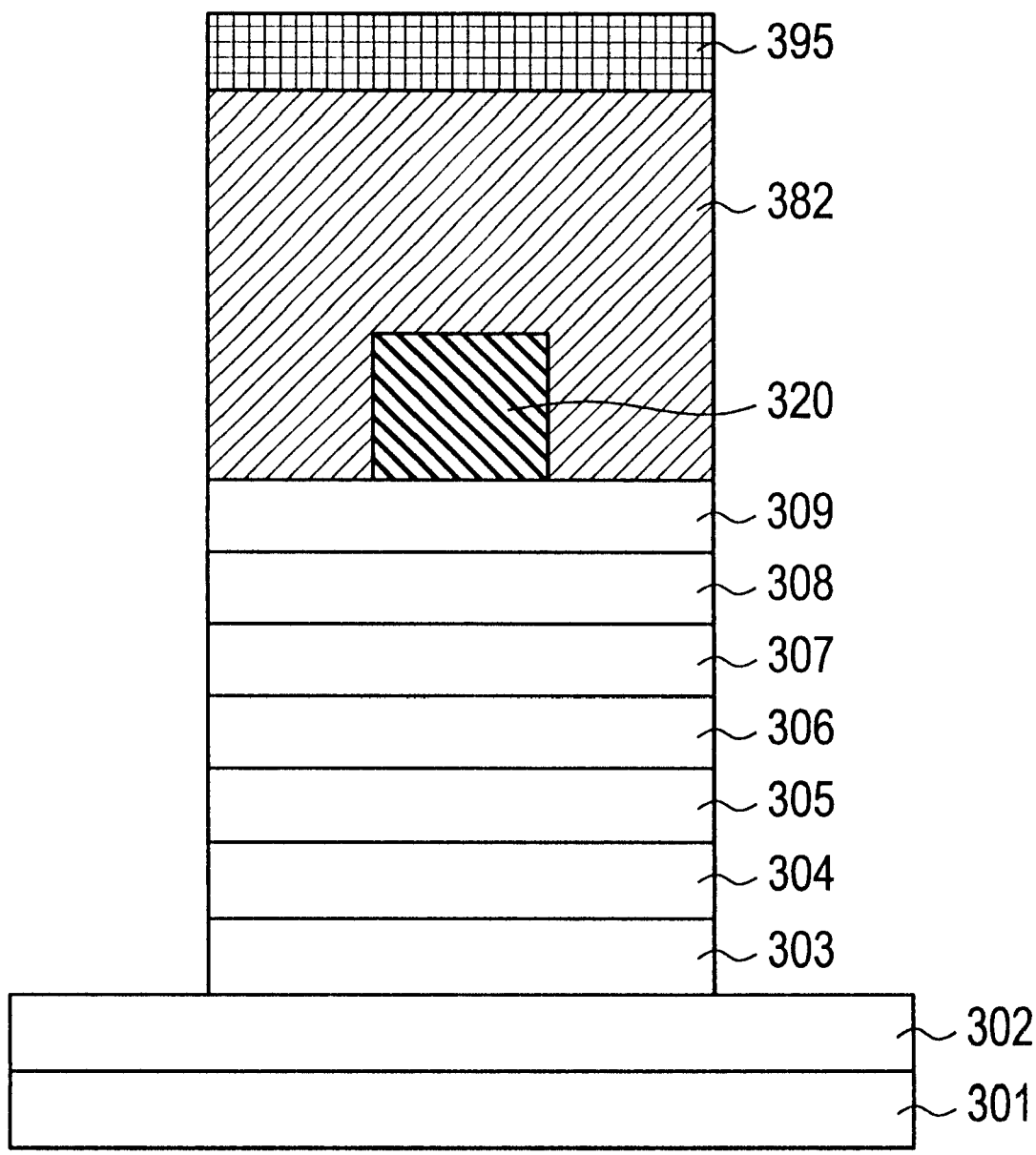
Figure 20:
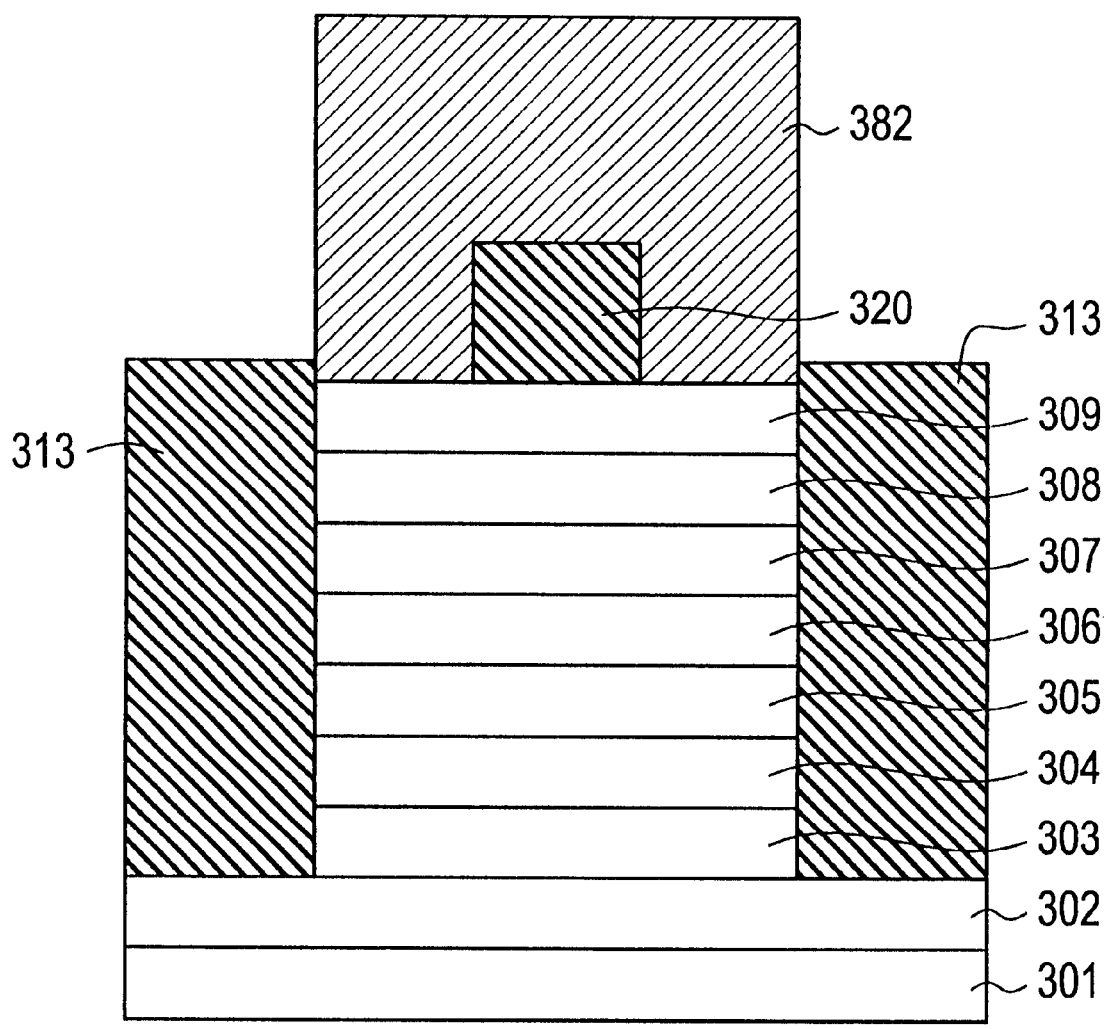

Still another method of manufacturing the third embodiment shown in FIG. 12 is described. FIGS. 19–20 are cross-sectional views illustrating the steps of still another method of manufacturing the same embodiment. Referring to FIGS. 12, 13, 17, 19 and 20, the present embodiment is described in detail, below.

After the structure shown in FIG. 13 is obtained in the same way as in Example 3, a mask 393 is formed in the same way as Example 4, and, using the undoped $In_{0.49}Ga_{0.51}P$ layer 309 as an etching stopper layer, the $p^+$-GaAs layer is selectively etched by means of wet etching with, for instance, a sulfuric acid based etchant, as shown in FIG. 17.

Next, after removing the mask, a $SiO_2$ film 382 is applied over the entire surface. After that, as shown in FIG. 19, a mask 395 is formed and portions of layers 382, 303–309 are removed. After removing the mask 395, the $SiO_2$ film 382 is used as a mask, $4 \times 10^{18}$ cm$^{-3}$ Si-doped $n^+$-GaAs ohmic contact layers 313 are grown to fill source/drain electrode sections, by the MBE method or the MOCVD method. Subsequently, a gate electrode 371, a source electrode 372 and a drain electrode 373 are formed so as to accomplish the structure of FIG. 12.

EXAMPLE 6

Figure 21:
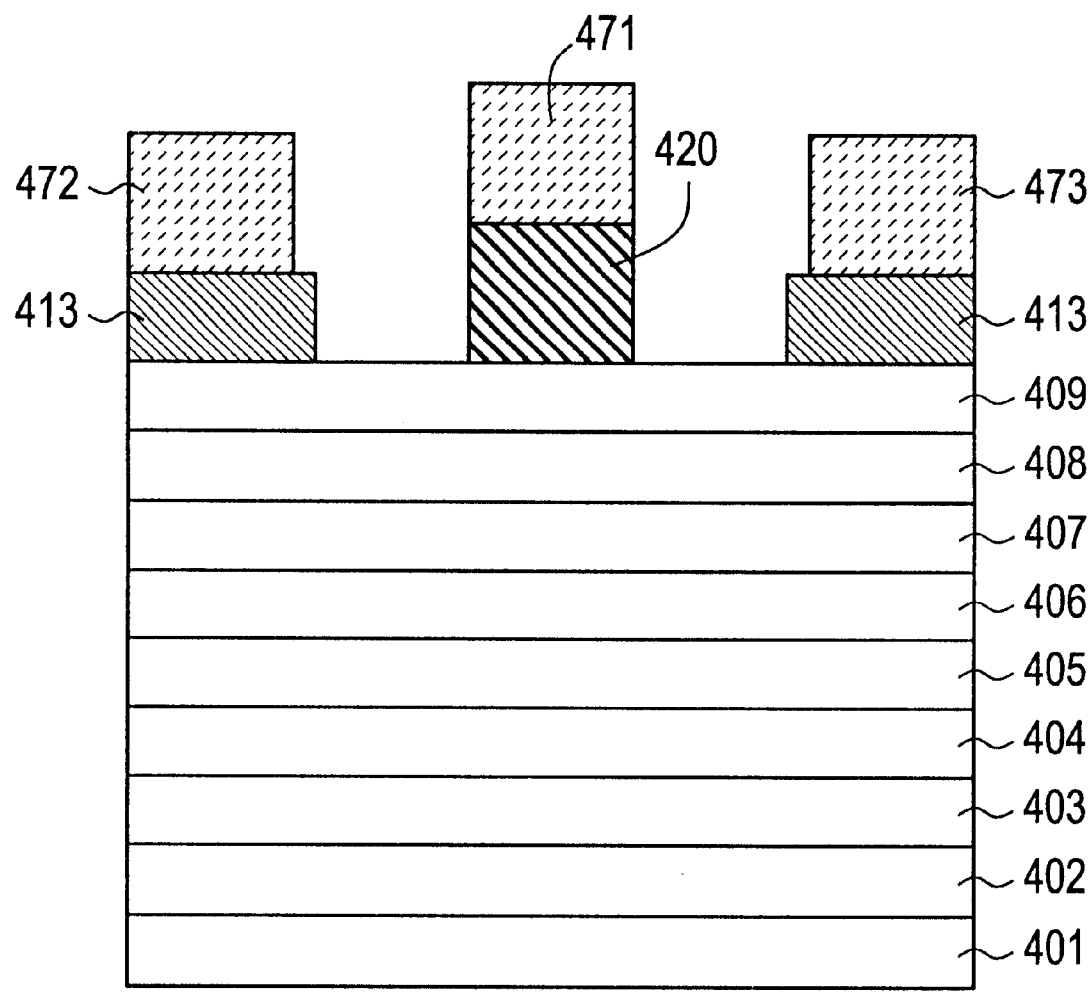
FIG. 21 is a schematic cross-sectional view showing the fourth embodiment of the present invention.

FIG. 21 is a cross-sectional view showing the structure of the fourth embodiment of the present invention and FIGS. 22–25 are cross-sectional views illustrating, in sequence, the steps of a method of manufacturing the same embodiment. Referring to FIGS. 21–25, the fourth embodiment is described in detail below.

Figure 22:
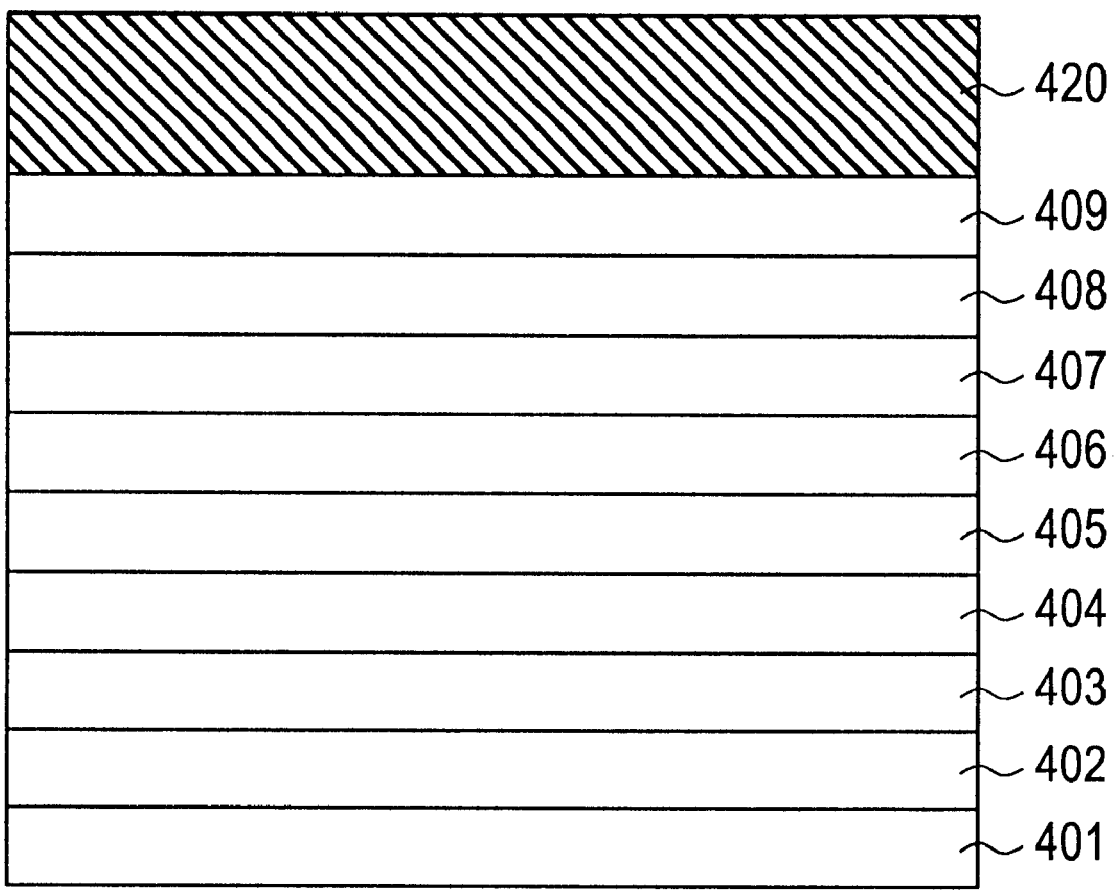
FIGS. 22–25 are a series of schematic cross-sectional views illustrating the steps of a method of manufacturing the fourth embodiment.

On a semi-insulating GaAs substrate 401, a GaAs buffer layer 402 with a-thickness of 400 nm, an undoped $Al_{0.2}Ga_{0.8}As$ buffer layer 403 with a thickness of 100 nm, a $4 \times 10^{18}$ cm$^{-3}$ Si-doped $Al_{0.2}Ga_{0.8}As$ electron supply layer 404 with a thickness of 4 nm, an undoped $Al_{0.2}Ga_{0.8}As$ spacer layer 405 with a thickness of 2 nm, an undoped $In_{0.2}Ga_{0.8}As$ channel layer 406 with a thickness of 15 nm, an undoped $Al_{0.2}Ga_{0.8}As$ spacer layer 407 with a thickness of 2 nm, a $4 \times 10^{18}$ cm$^{-3}$ Si-doped $Al_{0.2}Ga_{0.8}As$ electron supply layer 408 with a thickness of 9 nm, an undoped $In_{0.49}Ga_{0.51}P$ layer 409 with a thickness of 17 nm, and a $p^+$-GaAs layer 420 doped with $1 \times 10^{20}$ cm$^{-3}$ Zn or C are formed, in succession, by epitaxial growth, using either the MBE method or the MOCVD method. FIG. 22 shows the structure after epitaxial growth.

Figure 23:
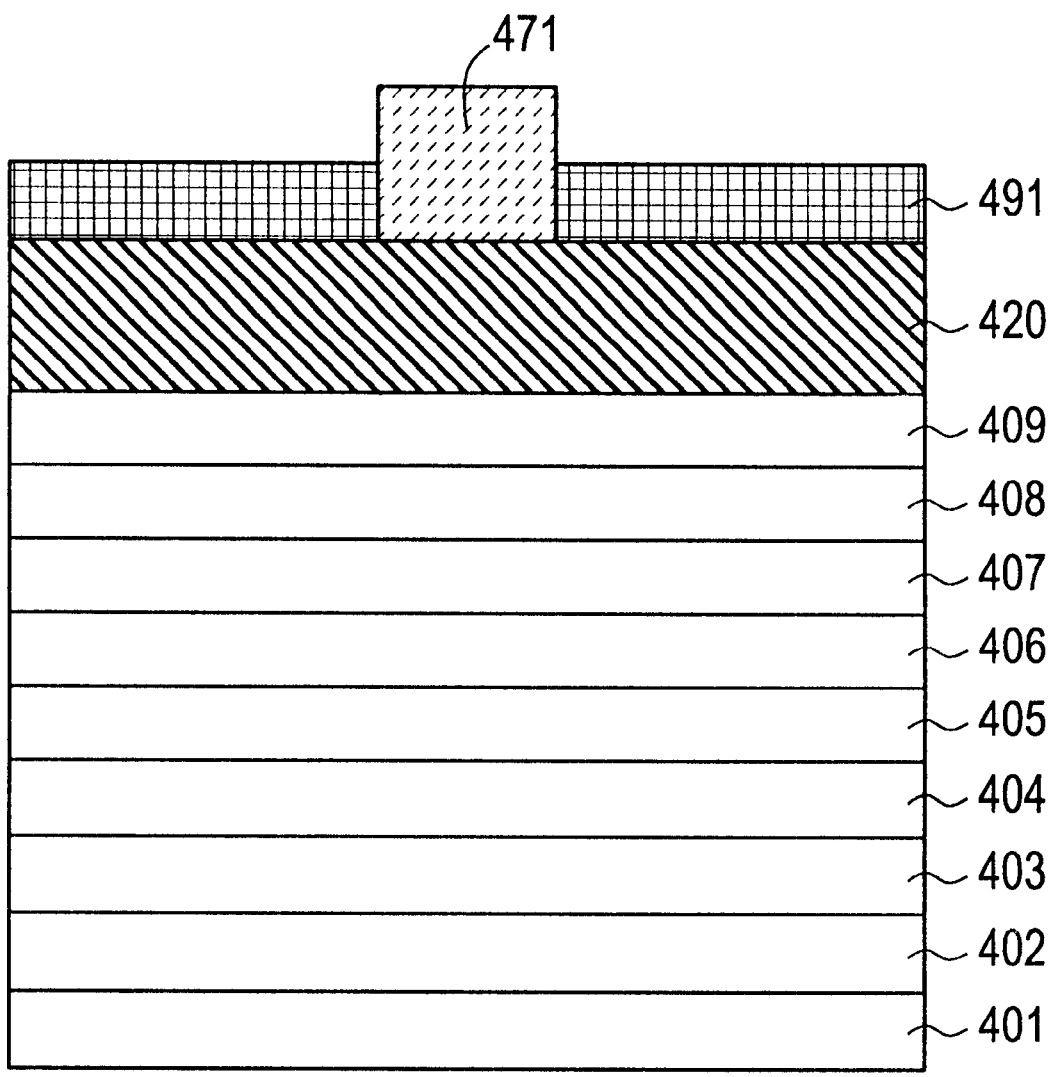

Next, as shown in FIG. 23, a mask 491 is formed on the resultant wafer, and, then, a gate electrode 471 is formed.

Figure 24:
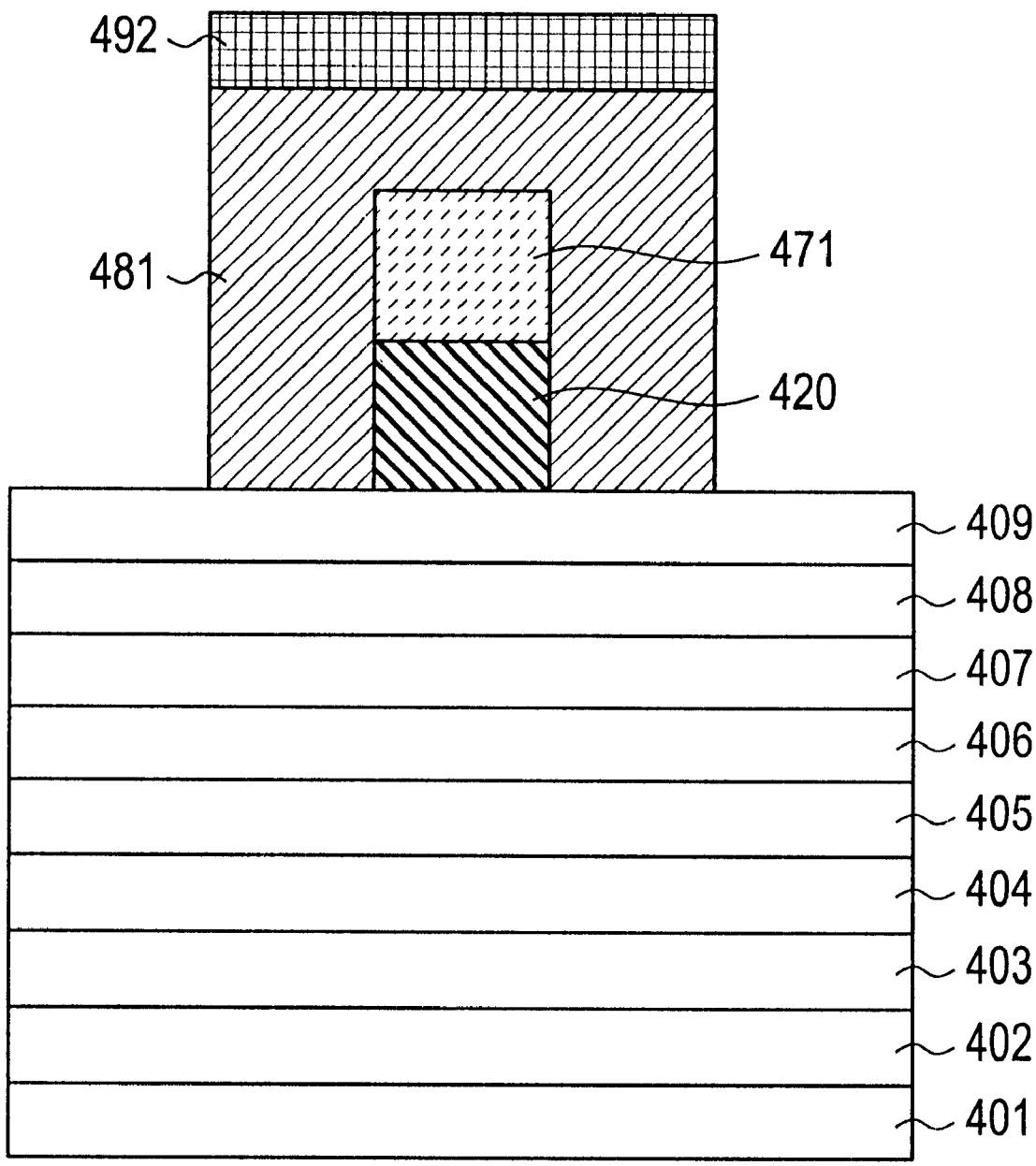
Figure 25:
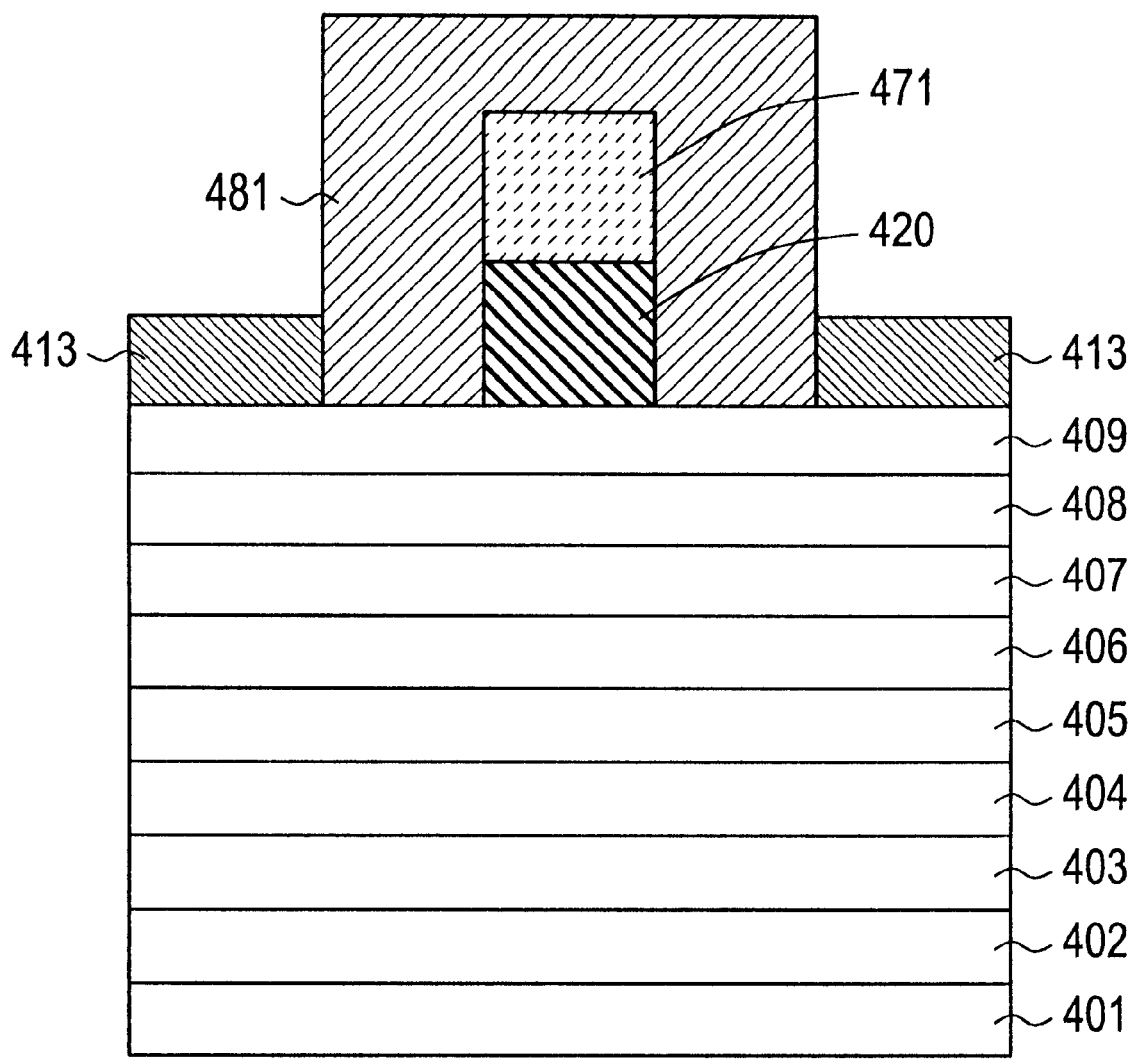

After the mask 491 is removed, the gate electrode 471 is used as a mask and portions of the $p^+$-GaAs layer 420 other than that beneath the gate electrode 471 are selectively etched, using the layer 409 as an etching stopper layer, by means of wet etching with, for instance, a sulfuric acid based etchant. Following that, a $SiO_2$ film 481 is applied over the entire surface. After that, as shown in FIG. 24, a mask 492 is formed, and portions of the $SiO_2$ film 481 are removed. After removing the mask 492, as shown in FIG. 25, the $SiO_2$ film 481 is used as a mask and, by the MBE method or the MOCVD method, $4 \times 10^{18}$ cm$^{-3}$ Si-doped $n^+$-GaAs ohmic contact layers 413 are grown in source/drain electrode sections. Subsequently, a source electrode 472 and a drain electrode 473 are formed and the structure of FIG. 21 is obtained.

With this structure, when a semiconductor of $n^+$-type conductivity, that is, the ohmic contact layer 413 is formed, the interface thereat is formed with the InGaP layer 409 containing no Al so that at the time of regrowth morphology can be improved and the interface states, greatly reduced, and thereby high frequency characteristic of the JFET can be enhanced. Moreover, an introduction of an InGaP layer 409 enables the wet etching to be employed with little damage in fabrication of a JFET. This can much reduce deterioration of high frequency characteristic as well as dispersion of various characteristics. With this structure, the contact resistance from the source/drain electrodes to the channel layer can be also lowered. Further, through the use of the InGaP layer 409, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations.

EXAMPLE 7

Figure 26:
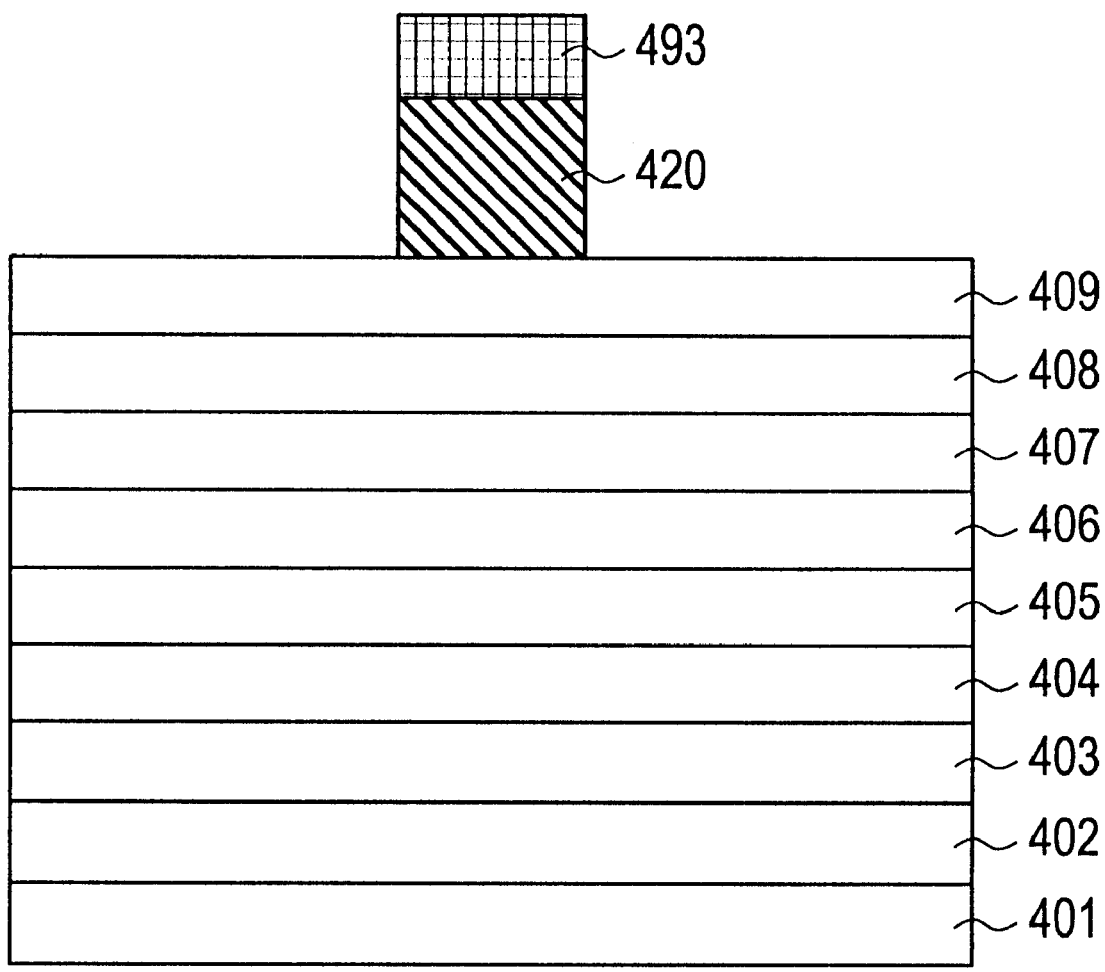
FIGS. 26–29 are a series of schematic cross-sectional views illustrating the steps of another method of manufacturing the fourth embodiment.
Figure 27:
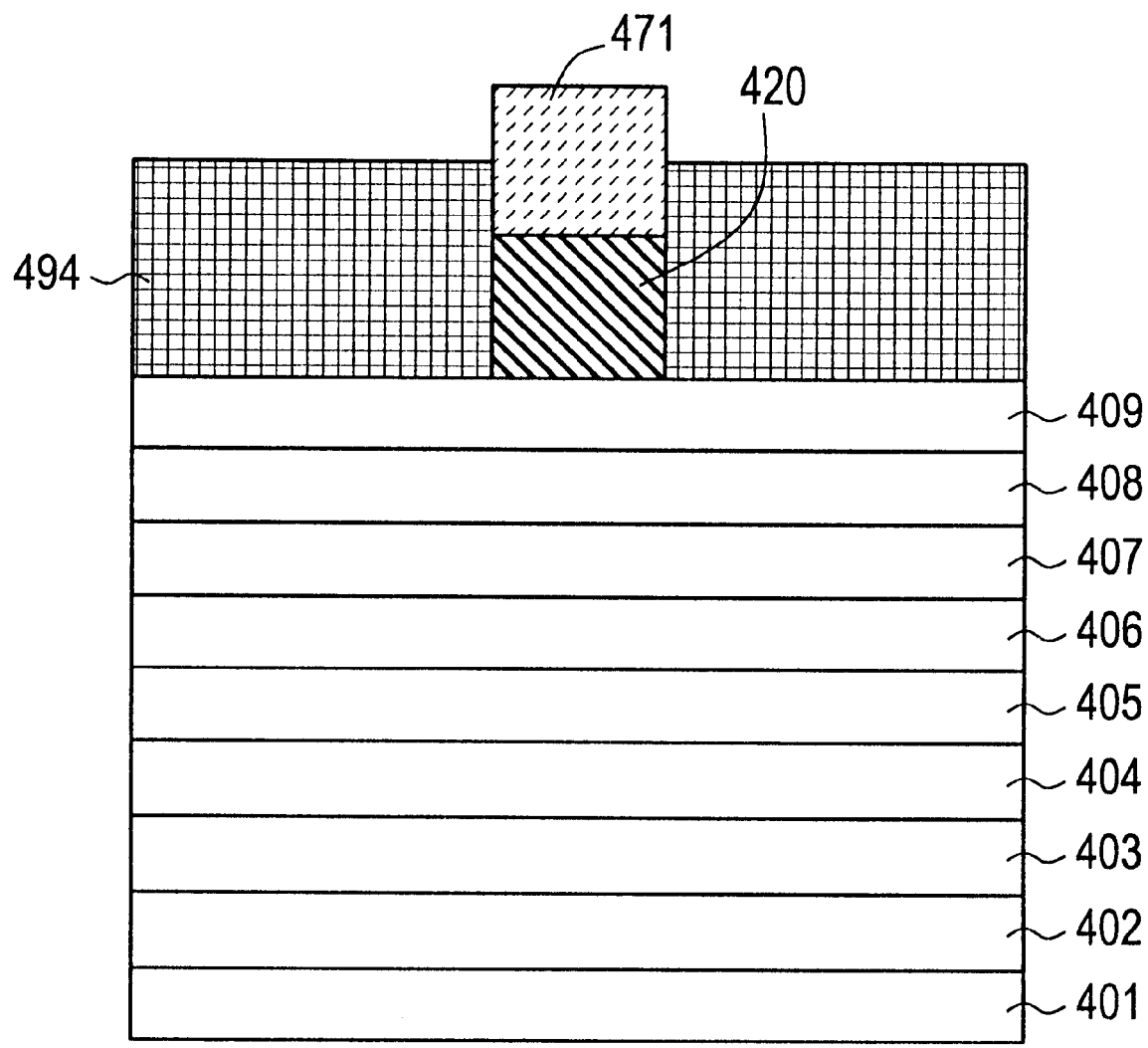

Another method of manufacturing the fourth embodiment shown in FIG. 21 is described. FIGS. 26–27 are cross-sectional views illustrating the steps of another method of manufacturing the same embodiment. Referring to FIGS. 21, 22, 26, 27, 24 and 25, the present embodiment is described in detail, below.

After the structure shown in FIG. 22 is obtained in the same way as in Example 6, a mask 493 is formed on the fabricated wafer, and, using the undoped $In_{0.49}Ga_{0.51}P$ layer 409 as an etching stopper layer, the $p^+$-GaAs layer 420 is selectively etched by means of the wet etching with, for instance, sulfuric acid based etchant, as shown in FIG. 26.

Next, as shown in FIG. 27, after removing the mask 493, masks 494 are formed and a gate electrode 471 is formed on the $p^+$-GaAs layer 420.

Next, after removing the masks 494, a $SiO_2$ film 481 is formed in the same way as in Example 6, as shown in FIG. 24. After that, as shown in FIG. 25, using the $SiO_2$ film 481 as a mask, $4 \times 10^{18}$ cm$^{-3}$ Si-doped n$^+$-GaAs ohmic contact layers 413 are grown in source/drain electrode sections, by the MBE method or the MOCVD method, and a source electrode 472 and a drain electrode 473 are formed so as to accomplish the structure of FIG. 21.

This method can also provide excellent uniformity in formation of the gate.

EXAMPLE 8

Figure 28:
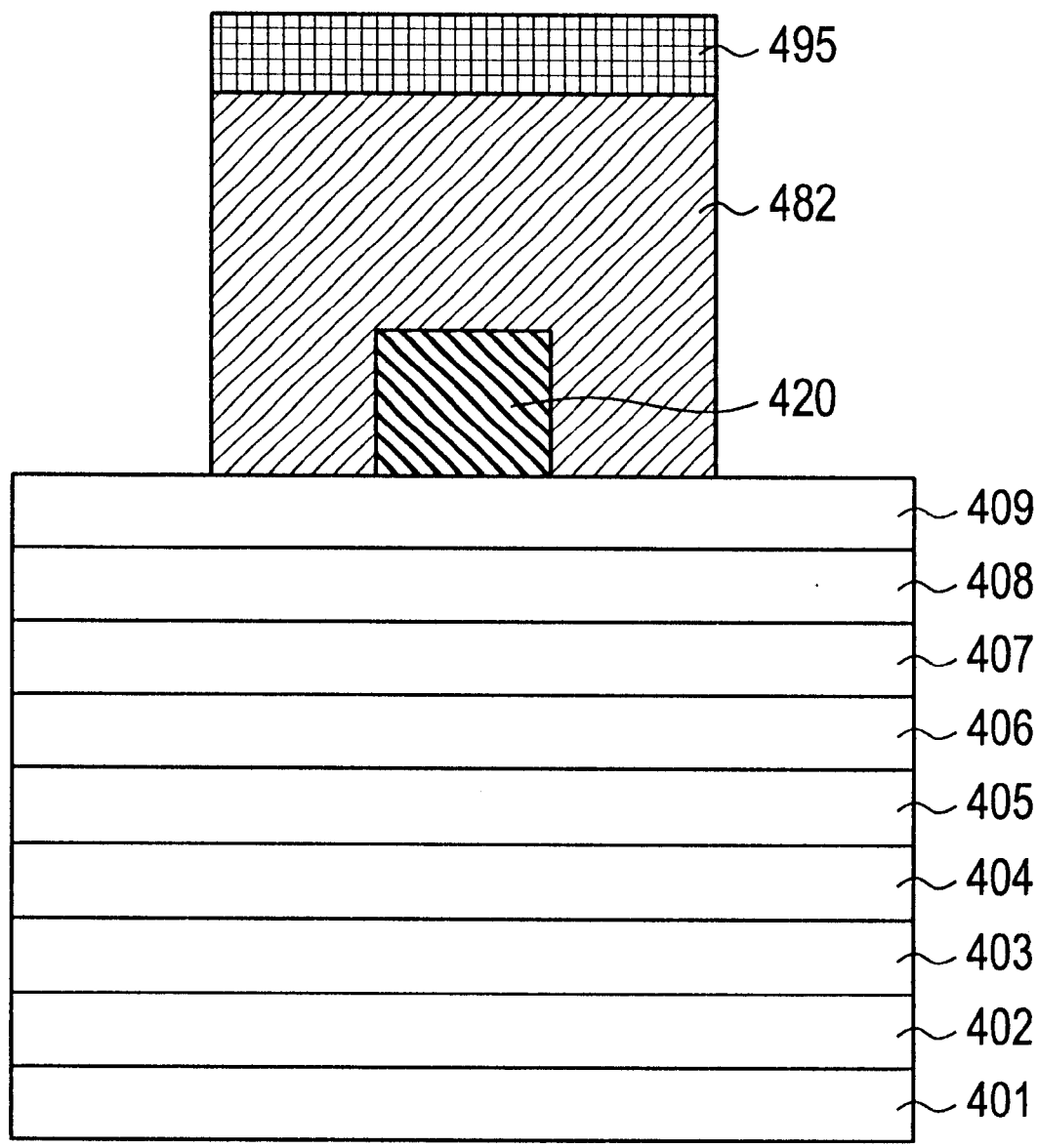
Figure 29:
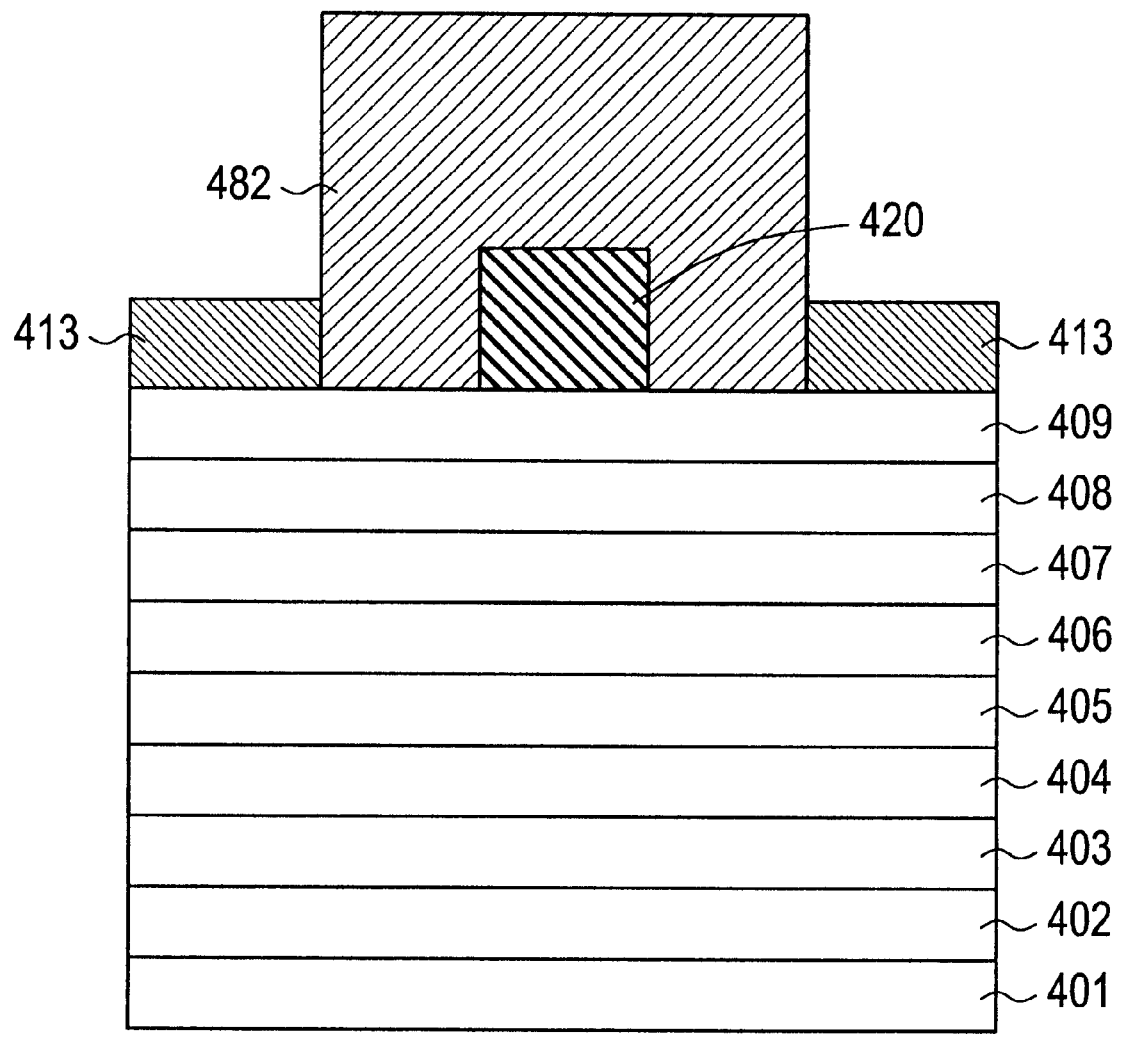

Still another method of manufacturing the fourth embodiment shown in FIG. 21 is described. FIGS. 28–29 are cross-sectional views illustrating the steps of still another method of manufacturing the same embodiment. Referring to FIGS. 21, 22, 26, 28 and 29, the present embodiment is described in detail below.

After the layered structure shown in FIG. 22 is formed in the same way as in Example 6, a mask 493 is formed on the resultant wafer in the same way as in Example 7, and, using the undoped $In_{0.49}Ga_{0.51}P$ layer 409 as an etching stopper layer, the p$^+$-GaAs layer 420 is selectively etched by means of wet etching with, for instance, a sulfuric acid based etchant and thereby the structure shown in FIG. 26 is obtained.

Next, after removing the masks 493, a $SiO_2$ film 482 is applied over the entire surface, as shown in FIG. 28. A mask 495 is then formed and portions of the $SiO_2$ film 482 are removed. After removing the mask 495, as shown in FIG. 29, using the $SiO_2$ film 482 as a mask, $4 \times 10^{18}$ cm$^{-3}$ Si-doped n$^+$-GaAs ohmic contact layers 413 are grown in source/drain electrode sections, by the MBE method or the MOCVD method. Subsequently, a gate electrode 471, a source electrode 472 and a drain electrode 473 are formed so as to accomplish the structure of FIG. 21.

In the following Examples 9–13, embodiments specifically designed to lower respective contact resistances are described.

EXAMPLE 9

Figure 30:
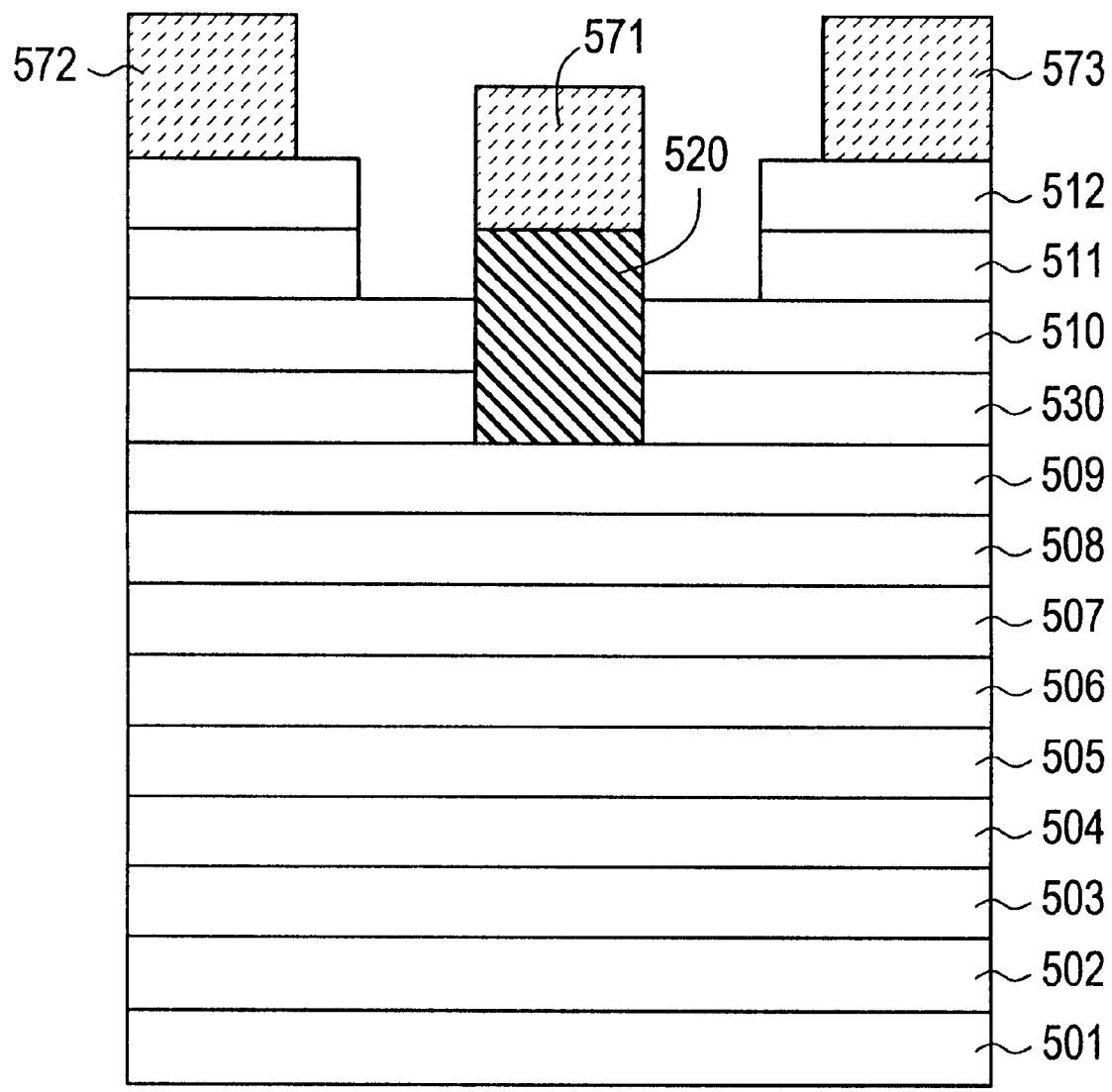
FIG. 30 is a schematic cross-sectional view showing the fifth embodiment of the present invention.

FIG. 30 is a cross-sectional view showing the structure of the fifth embodiment of the present invention and FIGS. 31–34 are cross-sectional views illustrating, in sequence, the steps of a method of manufacturing the same embodiment. Referring to FIGS. 30–34, the fifth embodiment is described in detail below.

Figure 31:
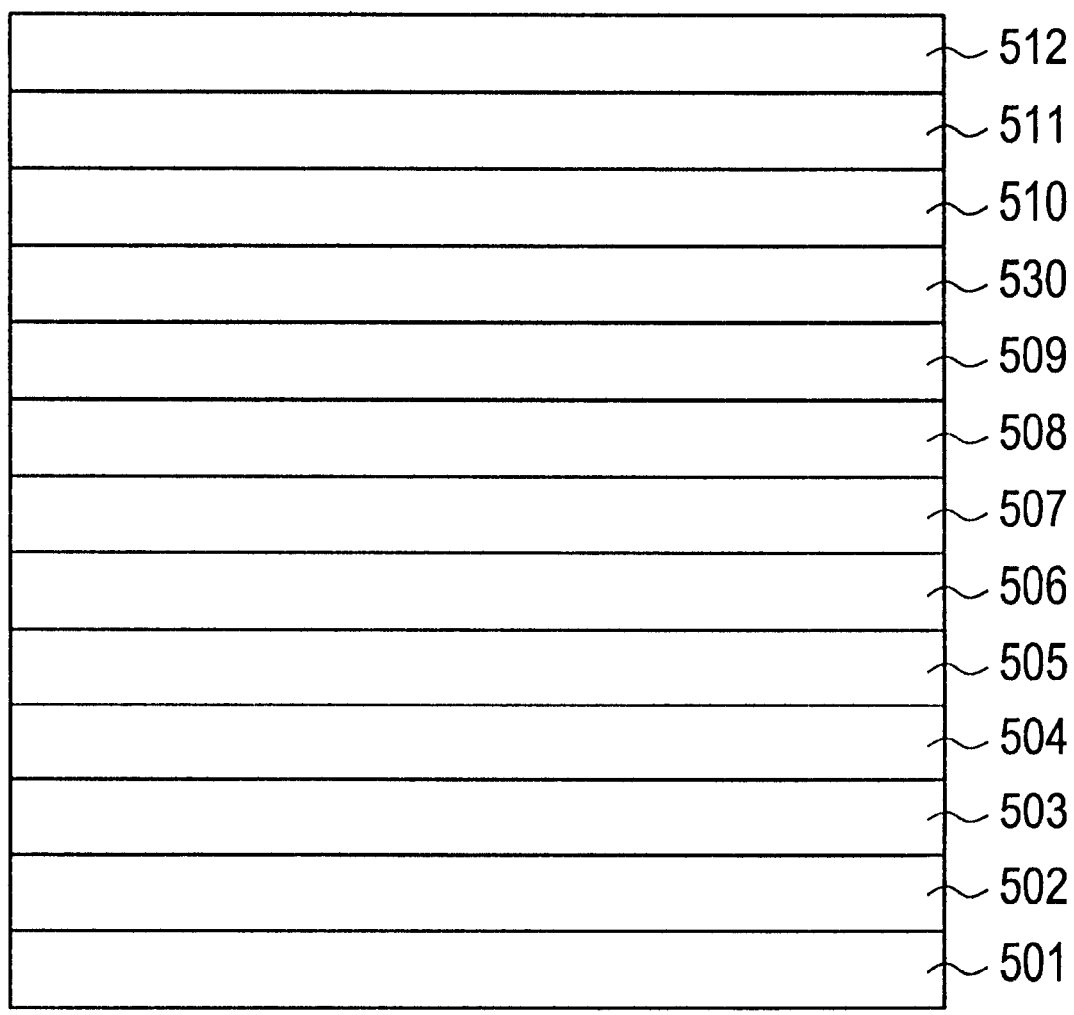
FIGS. 31–34 are a series of schematic cross-sectional views illustrating the steps of a method of manufacturing the fifth embodiment.

On a semi-insulating GaAs substrate 501, a GaAs buffer layer 502 with a thickness of 400 nm, an undoped $Al_{0.2}Ga_{0.8}As$ buffer layer 503 with a thickness of 100 nm, a $4 \times 10^{18}$ cm$^{-3}$ Si-doped $Al_{0.2}Ga_{0.8}As$ electron supply layer 504 with a thickness of 4 nm, an undoped $Al_{0.2}Ga_{0.8}As$ spacer layer 505 with a thickness of 2 nm, an undoped $In_{0.2}Ga_{0.8}As$ channel layer 506 with a thickness of 15 nm, an undoped $Al_{0.2}Ga_{0.8}As$ spacer layer 507 with a thickness of 2 nm, a $4 \times 10^{18}$ cm$^{-3}$ Si-doped $Al_{0.2}Ga^{0.8}As$ electron supply layer 508 with a thickness of 9 nm, an undoped $In_{0.49}Ga_{0.51}P$ layer 509 with a thickness of 12 nm, an undoped InGaAsP layer 530 with a thickness of 5 nm, an undoped GaAs buried layer 510 with a thickness of 30 nm, a $4 \times 10^{18}$ cm$^{-3}$ Si-doped $Al_{0.2}Ga_{0.8}As$ wide recess stopper layer 511 with a thickness of 6 nm and a $4 \times 10^{18}$ cm$^{-3}$ Si-doped GaAs cap layer 512 with a thickness of 100 nm are formed, in succession, by epitaxial growth, using either the MBE method or the MOCVD method. FIG. 31 shows the structure after the epitaxial growth.

Figure 32:
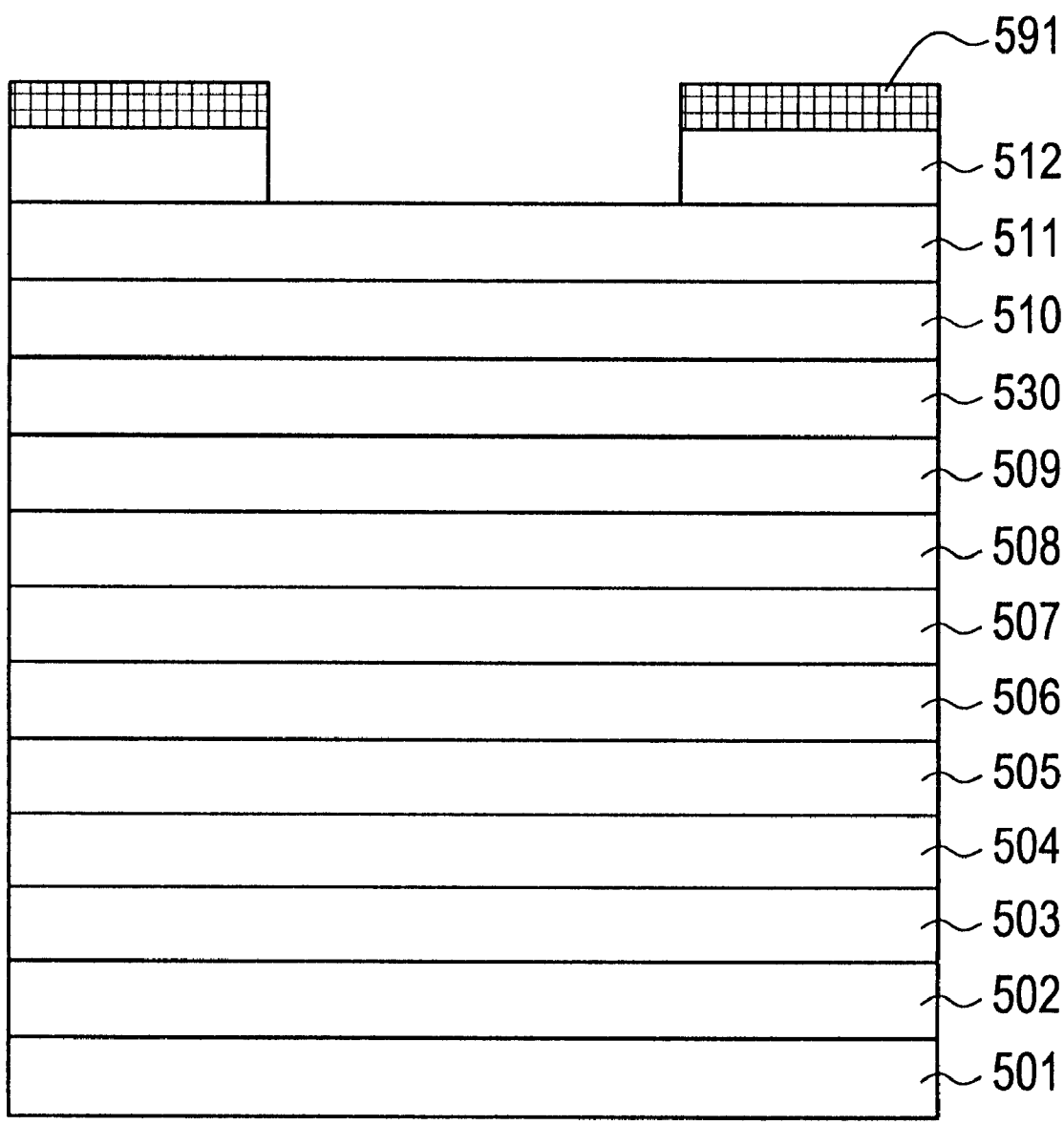

Next, as shown in FIG. 32, on the wafer fabricated as above, a mask 591 having an opening for a wide recess (a second recess) is formed, and, using the $Al_{0.2}Ga_{0.8}As$ wide recess stopper layer 511 as an etching stopper layer, the GaAs cap layer 512 is selectively etched. The selective etching of this sort can be carried out by dry etching in which either an ECR (Electron Cyclotron Resonance) etching apparatus or a RIE (Reactive Ion Etching) apparatus is used and a mixed gas (such as $BCl_3+SF_6$) of a chloride gas containing only chlorine as a halogen element and a fluoride gas containing only fluorine as a halogen element is supplied thereto.

Figure 33:
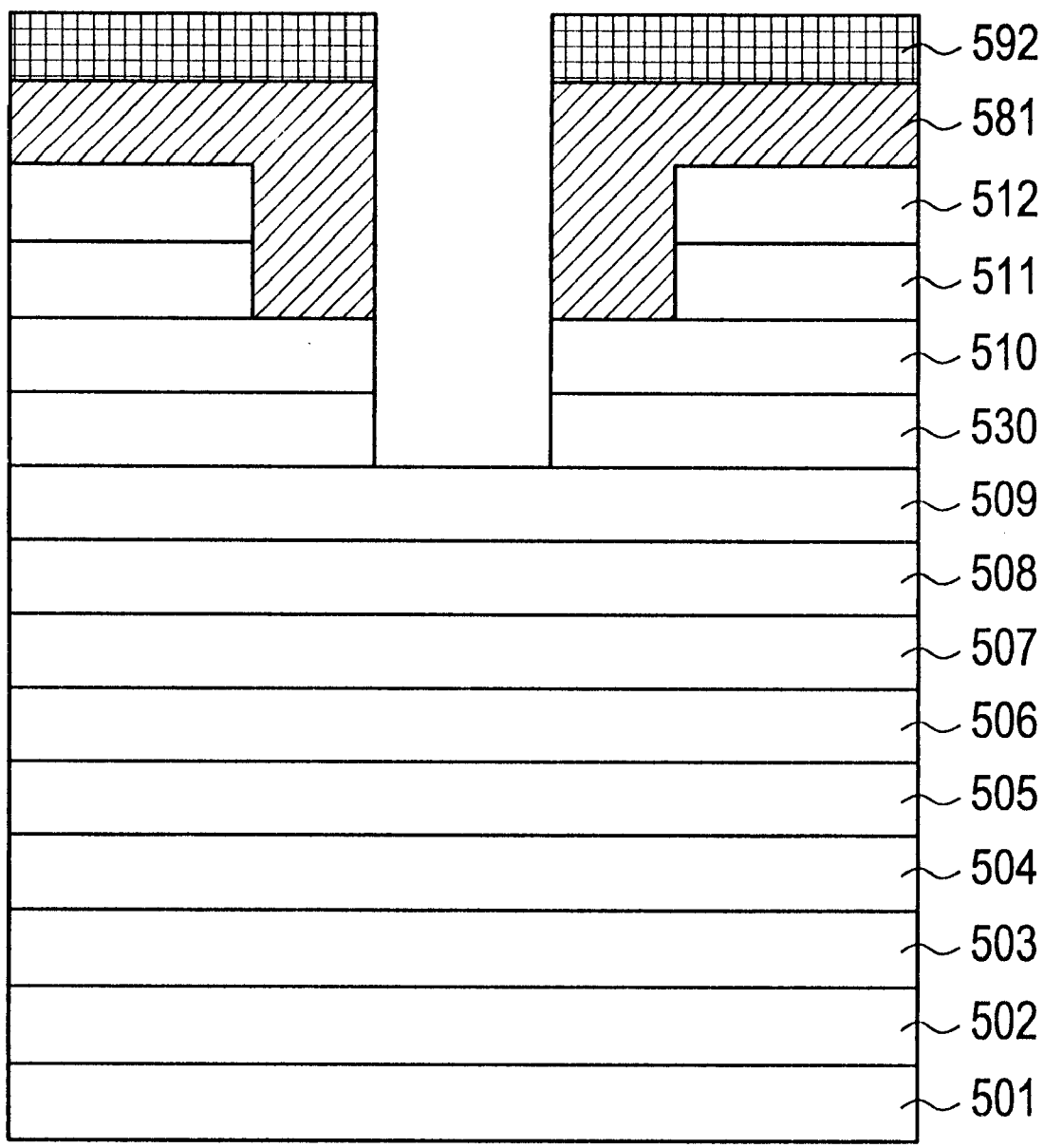

After an exposed portion of the $Al_{0.2}Ga_{0.8}As$ wide recess stopper layer 511 and the mask 591 are removed, a $SiO_2$ film 581 is formed over the entire surface. A mask 592 having an opening for a gate recess section (a first recess) is formed afresh and the $SiO_2$ film 581 is etched. The undoped GaAs buried layer 510 with a thickness of 30 nm and the InGaAsP layer 530 are then selectively etched by means of wet etching with, for instance, a sulfuric acid based etchant, using the $In_{0.49}Ga_{0.51}P$ layer 509 as a stopper layer. FIG. 33 shows the structure after the wet etching.

Figure 34:
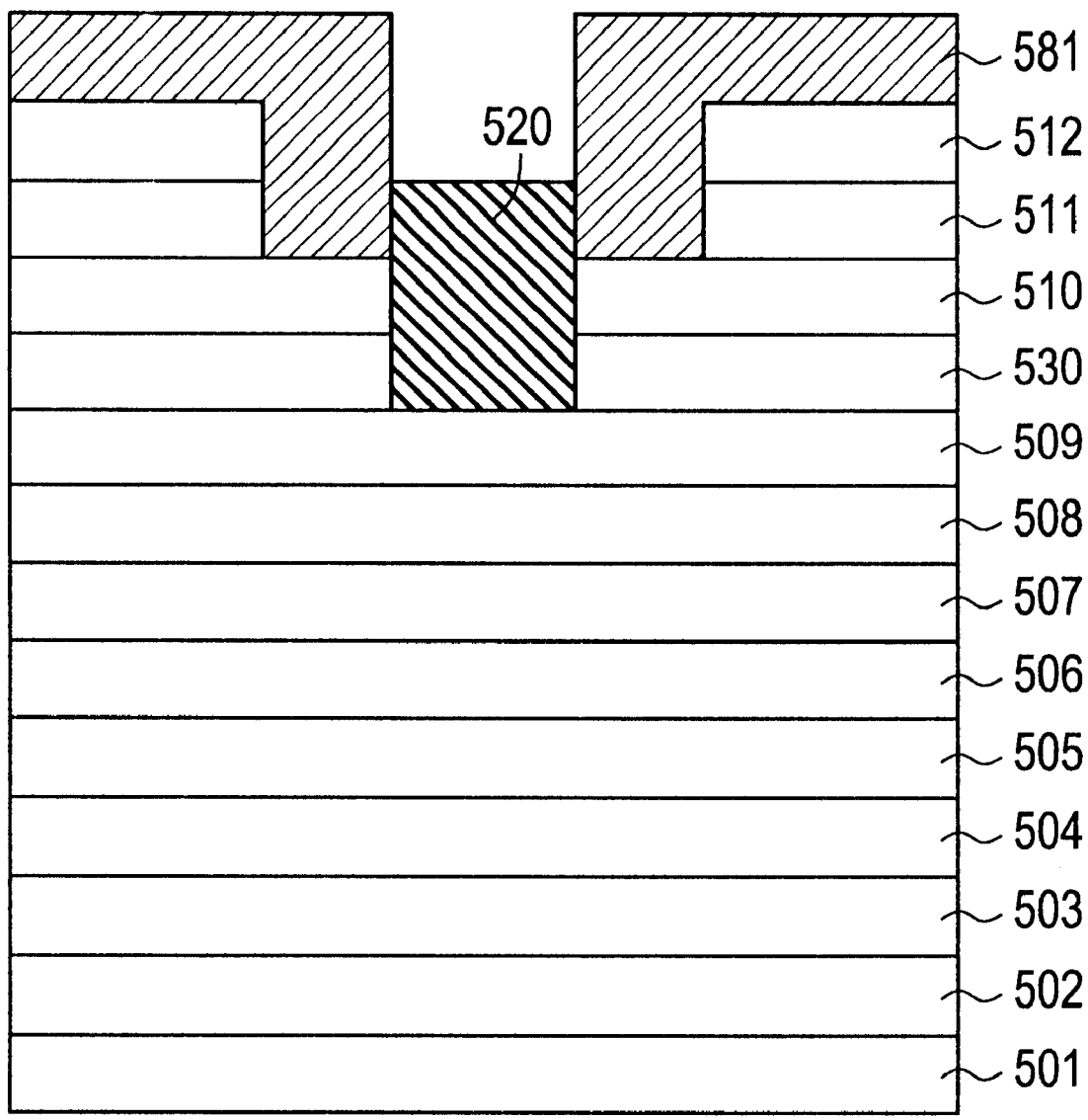

Next, as shown in FIG. 34, after the mask 592 is removed, a p$^+$-GaAs layer 520 doped with $1 \times 10^{20}$ cm$^{-3}$ Zn or C is grown on the exposed portion of the $In_{0.49}Ga_{0.51}P$ layer 509 lying in the gate opening section by the MBE method or the MOCVD method, using the $SiO_2$ film 581 as a mask.

A gate electrode 571 is then formed on the p$^+$-GaAs layer 520. Next, a source electrode 572 and a drain electrode 573 are formed as ohmic electrodes with AuGe by means of deposition, lift-off and alloying (for example, 400° C./1 min), and the structure of FIG. 30 is accomplished.

With this structure, when a semiconductor of p$^+$-type conductivity is formed, morphology thereof can be improved and the interface states, greatly reduced, and thereby high frequency characteristic of the JFET can be enhanced. Moreover, an introduction of an InGaP layer enables the wet etching to be employed with little damage in fabrication of a JFET. This can much reduce deterioration of high frequency characteristic as well as dispersion of various characteristics. The change of the epitaxial structure to the one that forms a multi-stage recess, in other words, an addition of the InGaAsP layer 530 can reduce the contact resistance from the cap layer 512 to the channel layer 506. Further, through the use of the InGaP layer 509, with stand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations. Although, in this example, the InGaAsP layer 530 is etched away to form the recess, the first recess may be formed without etching away the InGaAsP layer 530 so as to keep a part of that layer or even without etching that layer at all, and, in these cases, the p$^+$-GaAs layer 520 may be formed within said recess.

EXAMPLE 10

Figure 35:
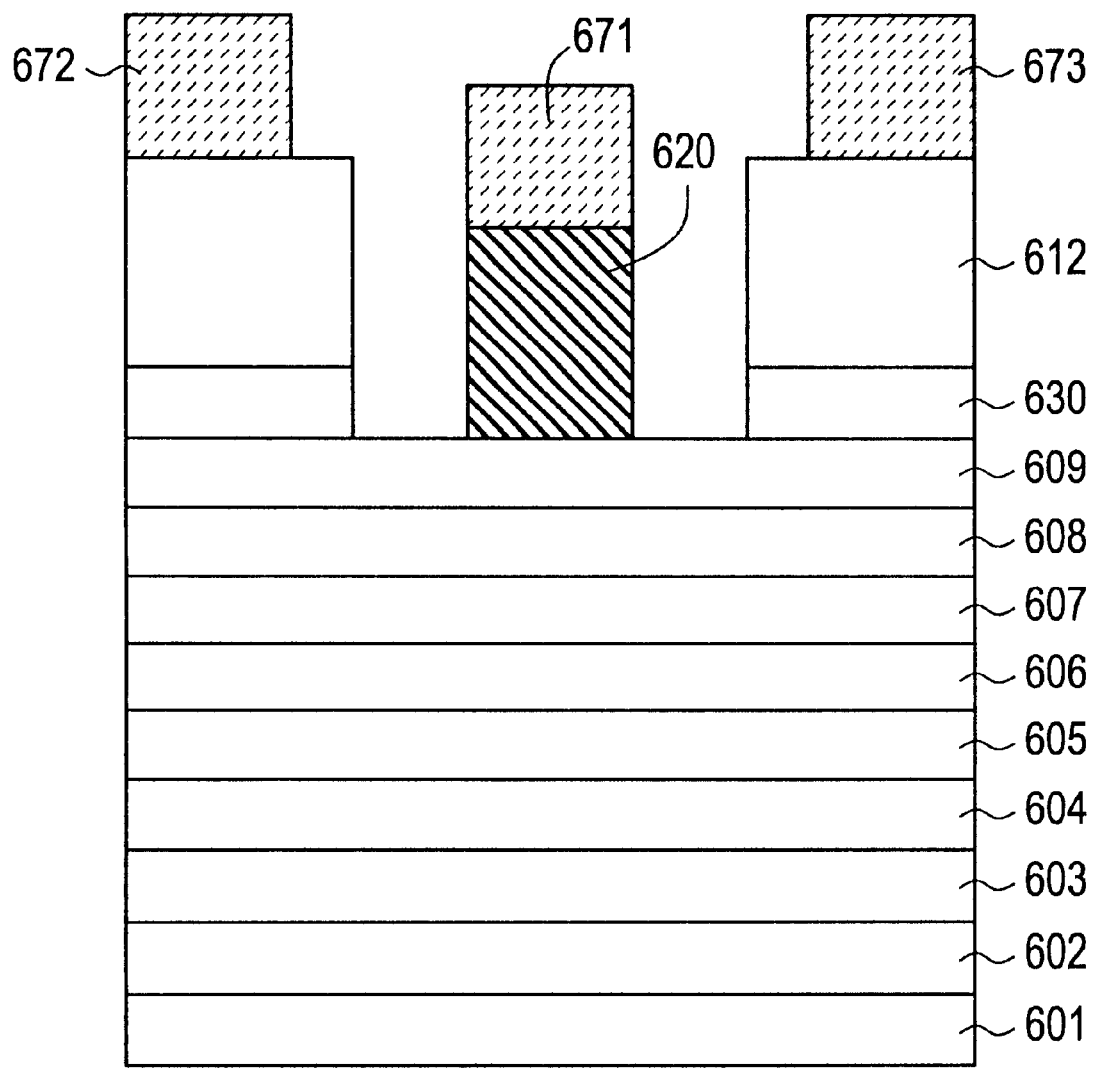
FIG. 35 is a schematic cross-sectional view showing the sixth embodiment of the present invention.

FIG. 35 is a cross-sectional view showing the structure of the sixth embodiment of the present invention and FIGS. 36–39 are cross-sectional views illustrating, in sequence, the steps of a method of manufacturing the same embodiment. Referring to FIGS. 35–39, the sixth embodiment is described in detail below.

Figure 36:
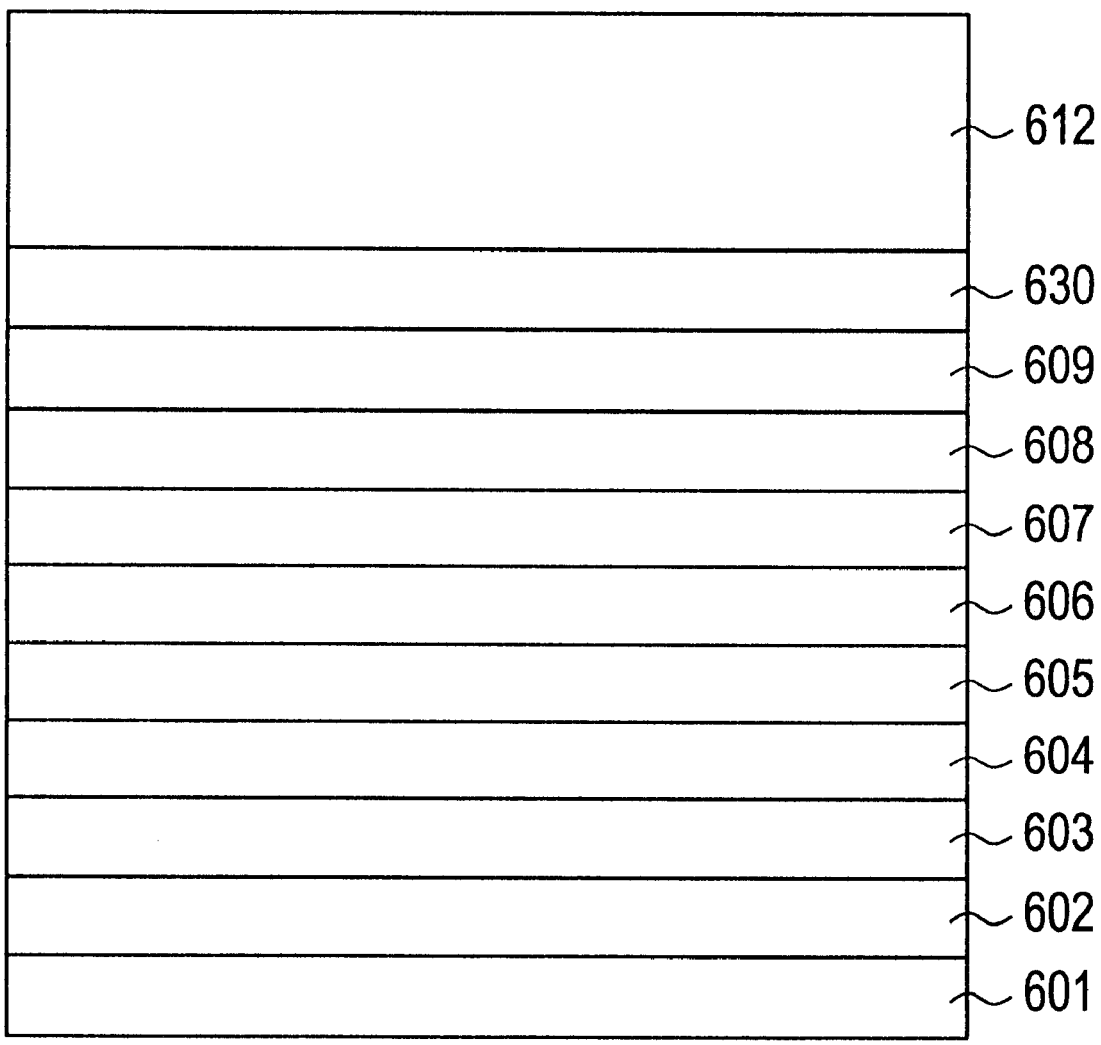
FIGS. 36–39 are a series of schematic cross-sectional views illustrating the steps of a method of manufacturing the sixth embodiment.

On a semi-insulating GaAs substrate 601, a GaAs buffer layer 602 with a thickness of 400 nm, an undoped $Al_{0.2}Ga_{0.8}As$ buffer layer 603 with a thickness of 100 nm, a $4\times10^{18}$ cm$^{-3}$ Si-doped $Al_{0.2}Ga_{0.8}As$ electron supply layer 604 with a thickness of 4 nm, an undoped $Al_{0.2}Ga_{0.8}As$ spacer layer 605 with a thickness of 2 nm, an undoped $In_{0.2}Ga_{0.8}As$ channel layer 606 with a thickness of 15 nm, an undoped $Al_{0.2}Ga_{0.8}As$ spacer layer 607 with a thickness of 2 nm, a $4\times10^{18}$ cm$^{-3}$ Si-doped $Al_{0.2}Ga_{0.8}As$ electron supply layer 608 with a thickness of 9 nm, an undoped $In_{0.49}Ga_{0.51}P$ layer 609 with a thickness of 12 nm, an undoped InGaAsP layer 630 with a thickness of 5 nm, and a $4\times10^{18}$ cm$^{-3}$ Si-doped GaAs cap layer 612 with a thickness of 100 nm are formed, in succession, by epitaxial growth, using either the MBE method or the MOCVD method. FIG. 36 shows the structure after the epitaxial growth.

Figure 37:
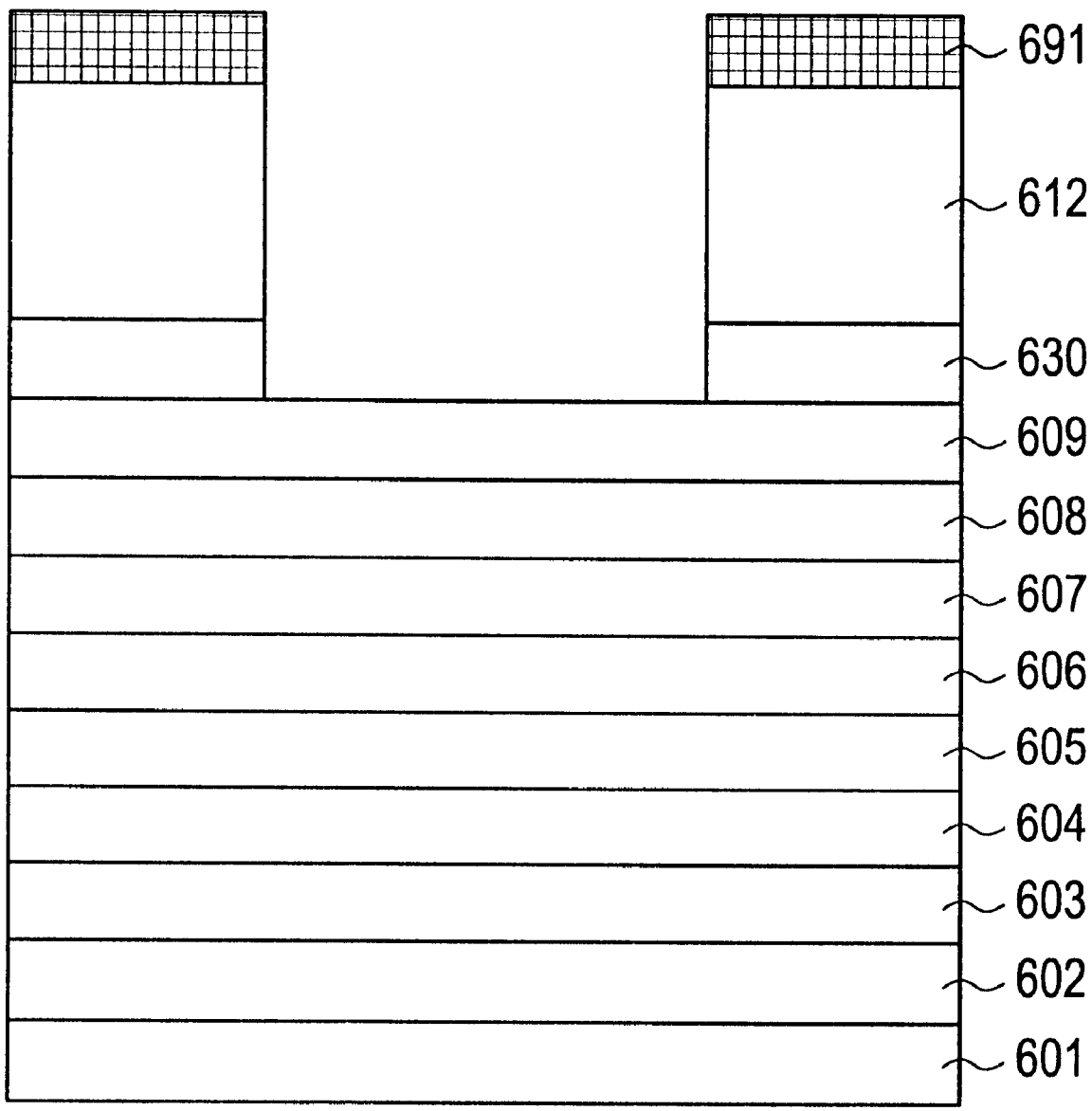

Next, on the wafer fabricated as above, a mask 691 having an opening for a wide recess is formed, and, using the $In_{0.49}Ga_{0.51}P$ layer 609 as a stopper layer, the GaAs cap layer 612 and the InGaAsP layer 630 are selectively etched by means of wet etching with, for instance, a sulfuric acid based etchant. FIG. 37 shows the structure after the wet etching.

Figure 38:
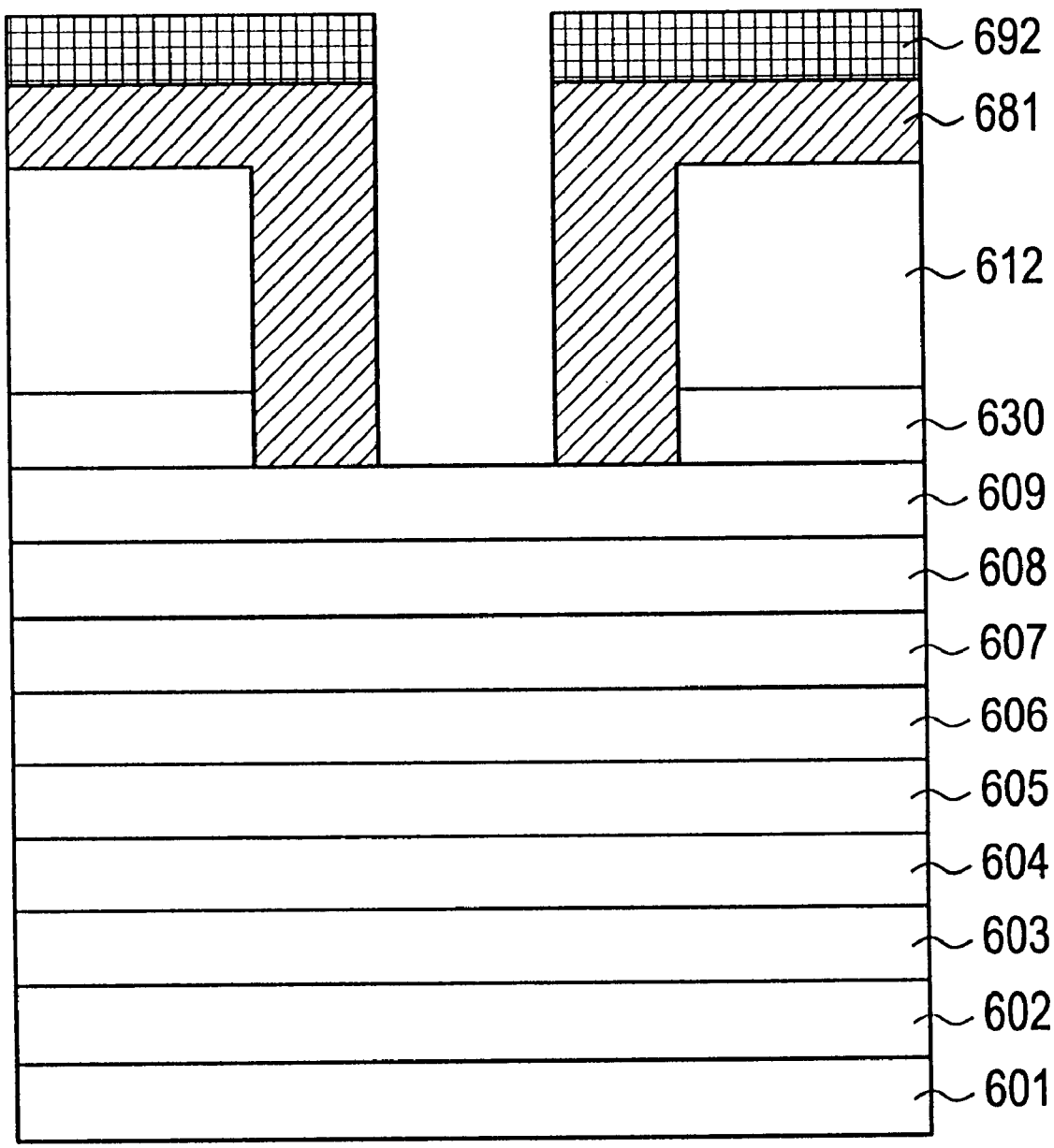
Figure 39:
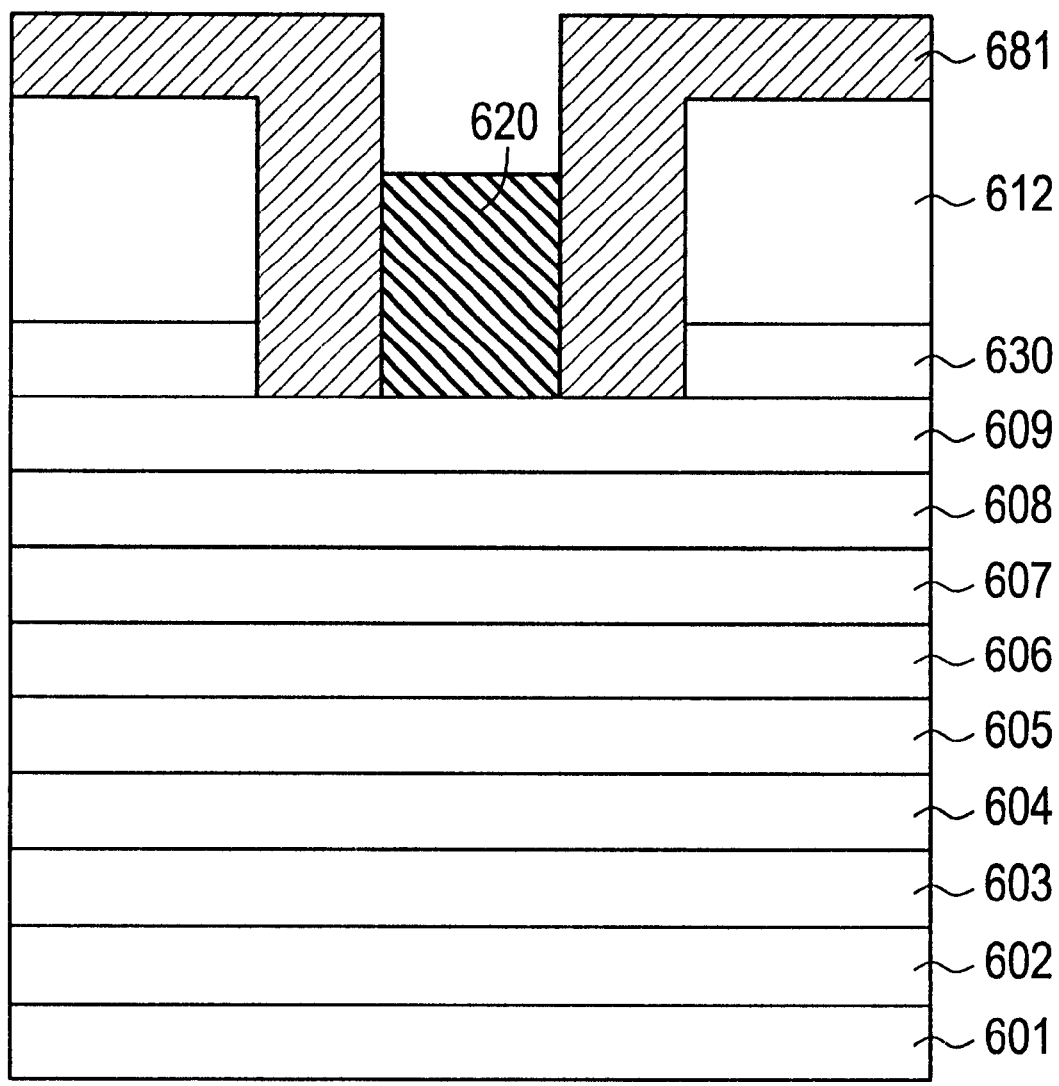

After the mask 691 is removed, a $SiO_2$ film 681 is formed over the entire surface. A mask 692 having an opening for a gate recess section is formed afresh and the $SiO_2$ film 681 is etched. FIG. 38 shows the structure after etching the $SiO_2$ film 681. Next, as shown in FIG. 39, after the mask 692 is removed, a p$^+$-GaAs layer 620 doped with $1\times10^{20}$ cm$^{-3}$ Zn or C is grown on the exposed portion of the $In_{0.49}Ga_{0.51}P$ layer 609 lying in the gate opening section by the MBE method or the MOCVD method, using the $SiO_2$ film 681 as a mask.

A gate electrode 671 is then formed on the p$^+$-GaAs layer 620. Next, a source electrode 672 and a drain electrode 673 are formed as ohmic electrodes with AuGe by means of deposition, lift-off and alloying (for example, 400° C./1 min), and the structure of FIG. 35 is accomplished.

With this structure, when a semiconductor of p$^+$-type conductivity is formed, morphology thereof can be improved and the interface states, greatly reduced, and thereby high frequency characteristic of the JFET can be enhanced. Moreover, an introduction of the InGaP layer 609 enables the wet etching to be employed with little damage in fabrication of a JFET. This can much reduce deterioration of high frequency characteristic as well as dispersion of various characteristics. The change of the epitaxial structure to the one that forms a multi-stage recess can reduce the contact resistance from the cap layer 612 to the channel layer 606. Further, through the use of the InGaP layer 609, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations. Although, in this example, the InGaAsP layer 630 is etched away to form the recess, the recess may be formed without etching away the InGaAsP layer 630 so as to keep a part of that layer or even without etching that layer at all, and, in these cases, the p$^+$-GaAs layer 620 may be formed within said recess.

EXAMPLE 11

Figure 40:
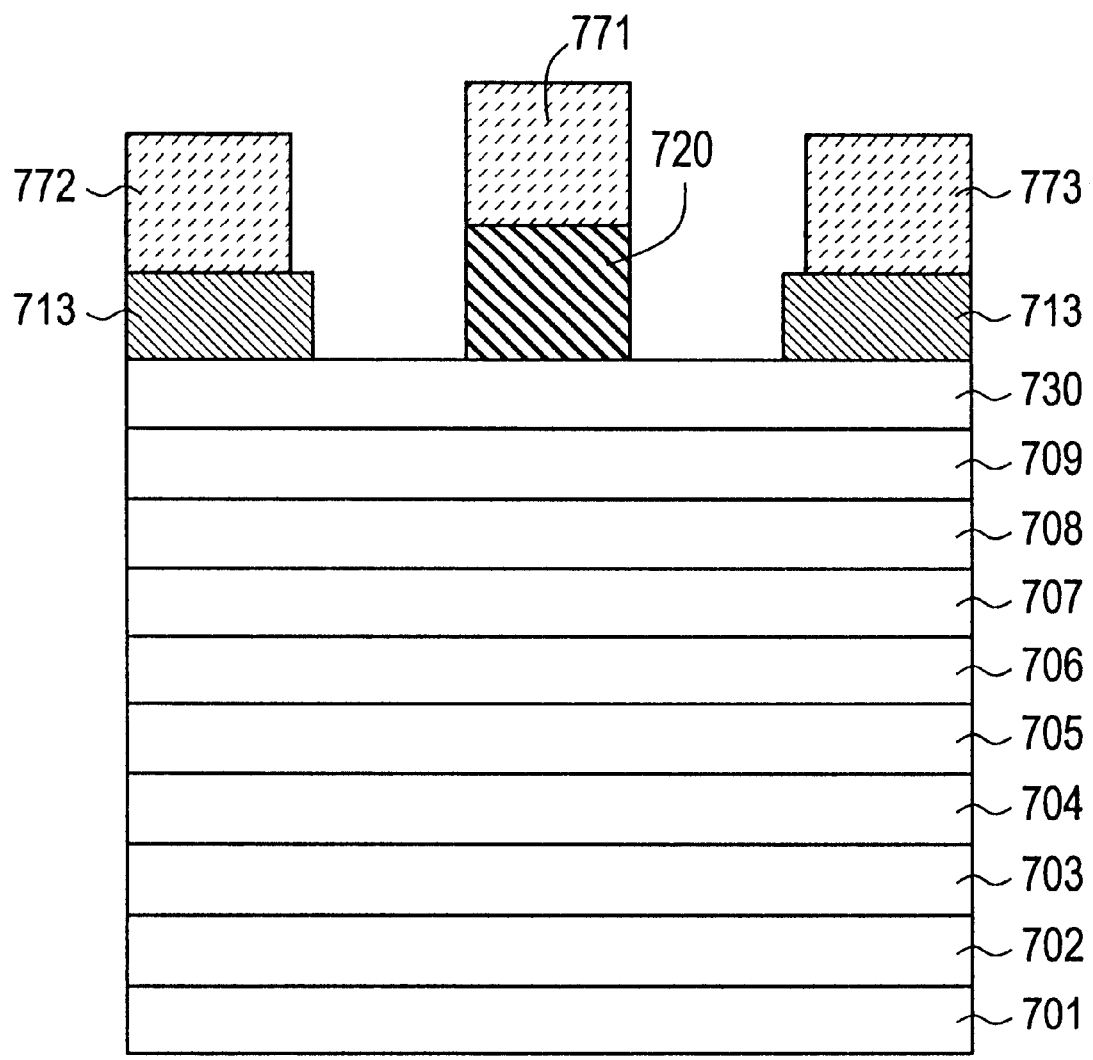
FIG. 40 is a schematic cross-sectional view showing the seventh embodiment of the present invention.

FIG. 40 is a cross-sectional view showing the structure of the seventh embodiment of the present invention and FIGS. 41–44 are cross-sectional views illustrating, in sequence, the steps of a method of manufacturing the same embodiment. Referring to FIGS. 40–44, the seventh embodiment is described in detail below.

Figure 41:
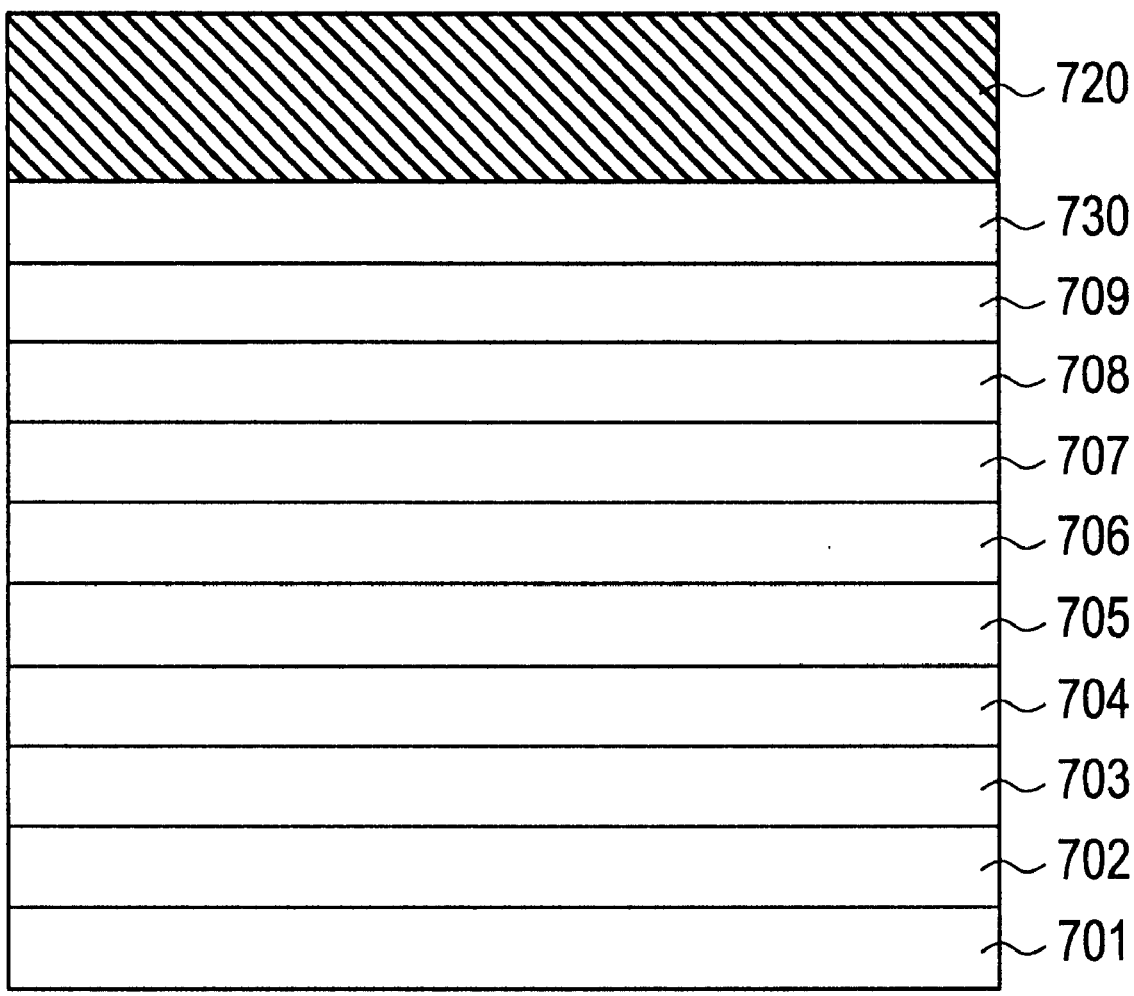
FIGS. 41–44 are a series of schematic cross-sectional views illustrating the steps of a method of manufacturing the seventh embodiment.

On a semi-insulating GaAs substrate 701, a GaAs buffer layer 702 with a thickness of 400 nm, an undoped $Al_{0.2}Ga_{0.8}As$ buffer layer 703 with a thickness of 100 nm, a $4\times10^{18}$ cm$^{-3}$ Si-doped $Al_{0.2}Ga_{0.8}As$ electron supply layer 704 with a thickness of 4 nm, an undoped $Al_{0.2}Ga_{0.8}As$ spacer layer 705 with a thickness of 2 nm, an undoped $In_{0.2}Ga_{0.8}As$ channel layer 706 with a thickness of 15 nm, an undoped $Al_{0.2}Ga_{0.8}As$ spacer layer 707 with a thickness of 2 nm, a $4\times10^{18}$ cm$^{-3}$ Si-doped $Al_{0.2}Ga_{0.8}As$ electron supply layer 708 with a thickness of 9 nm, an undoped $In_{0.49}Ga_{0.51}P$ layer 709 with a thickness of 12 nm, an undoped InGaAsP layer 730 with a thickness of 5 nm and a p$^+$-GaAs layer 720 doped with $1\times10^{20}$ cm$^{-3}$ Zn or C are formed, in succession, by epitaxial growth, using either the MBE method or the MOCVD method. FIG. 41 shows the structure after epitaxial growth.

Figure 42:
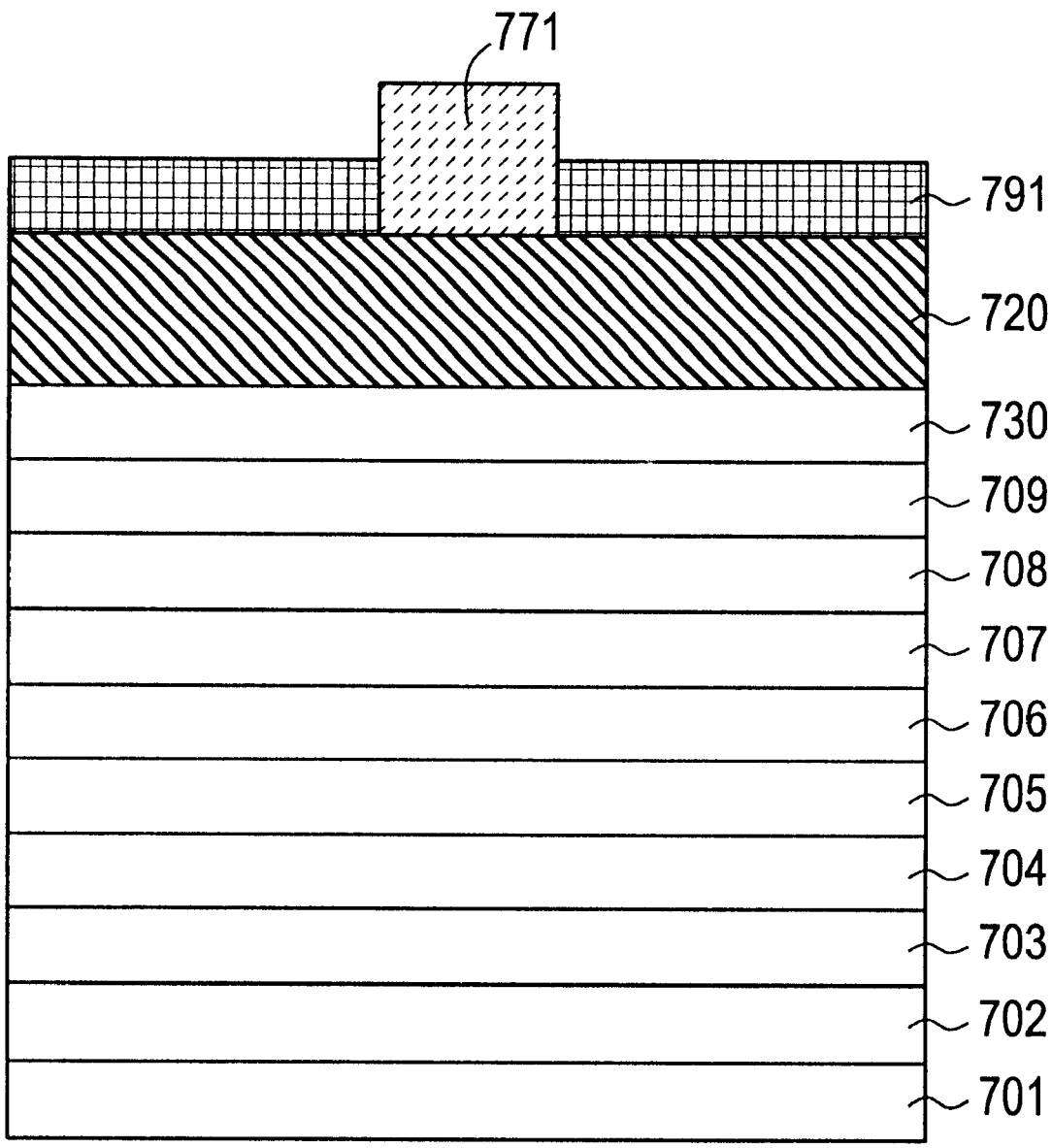

Next, as shown in FIG. 42, a mask 791 is formed, and, then, a gate electrode 771 is formed. After the mask 791 is removed, using the gate electrode 771 and the InGaAsP layer 730 as a mask and an etching stopper layer, respectively, portions of the p$^+$-GaAs layer 720 other than that beneath the gate electrode 771 is selectively etched by means of wet etching with, for instance, a sulfuric acid based etchant.

Figure 43:
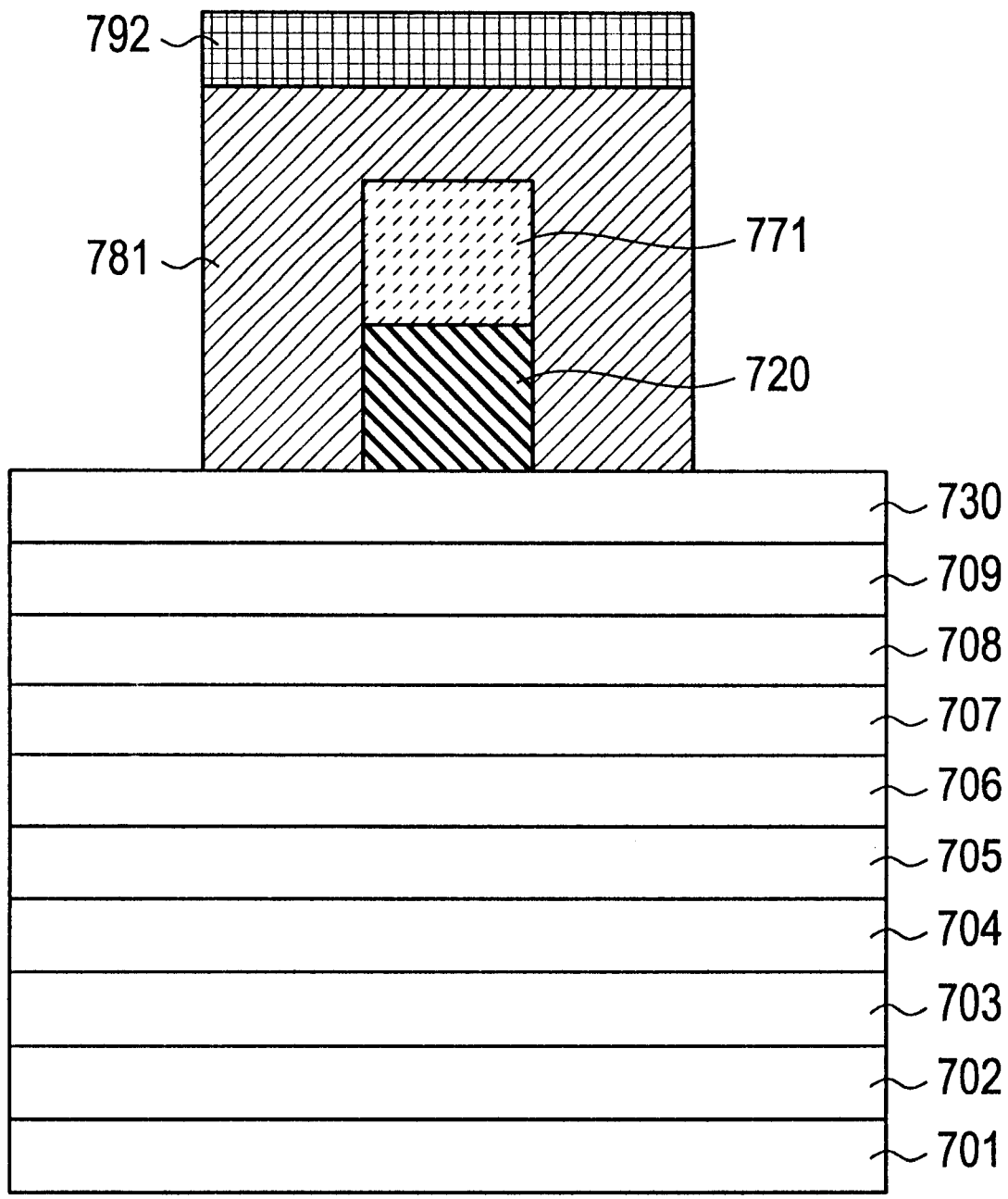
Figure 44:
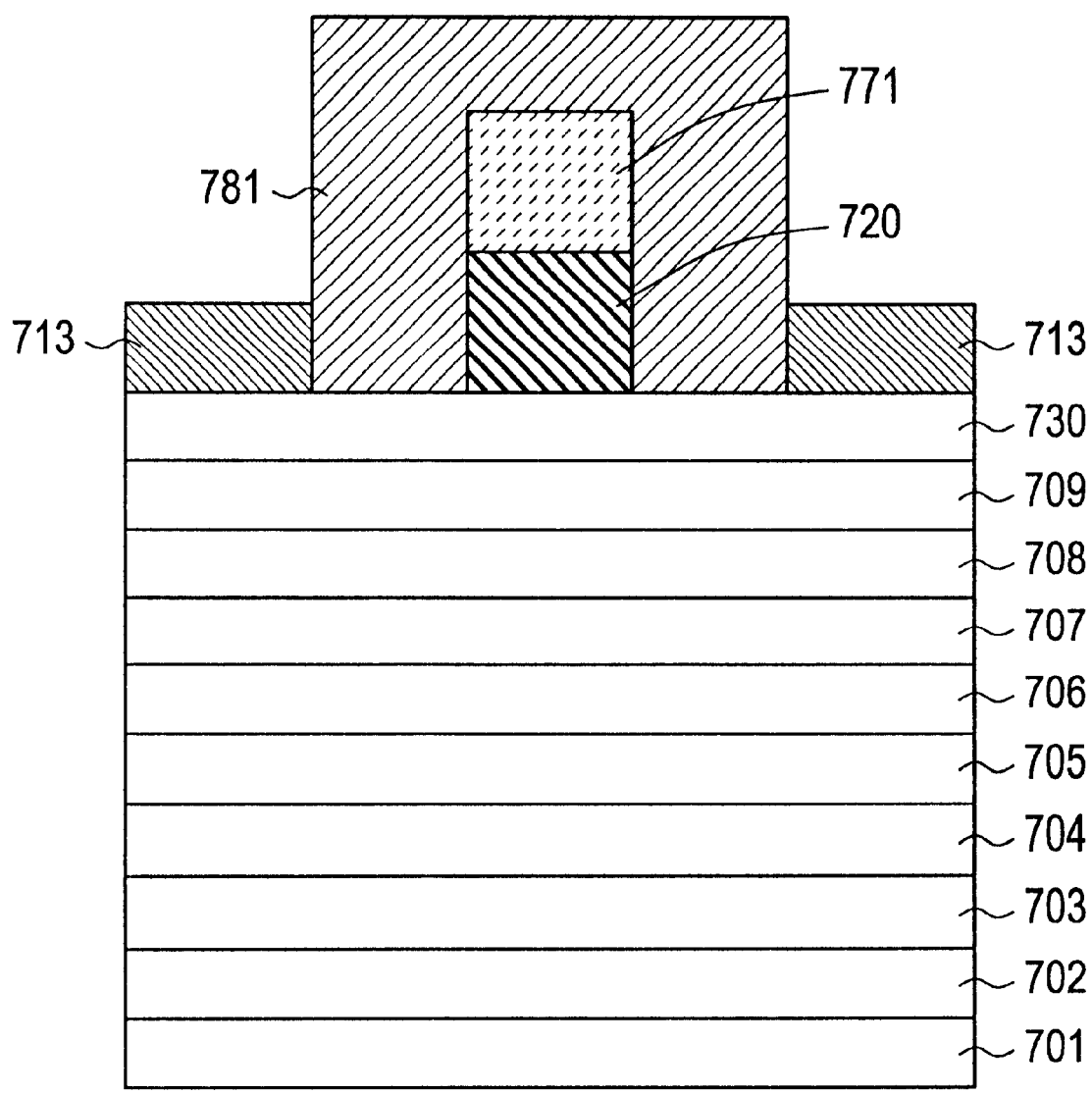

Next, a $SiO_2$ film 781 is applied over the entire surface, and, as shown in FIG. 43, a mask 792 is formed, and source/drain electrode formation sections of the $SiO_2$ film 781 are removed. After removing the mask 792, the $SiO_2$ film 781 is used as a mask and, by the MBE method or the MOCVD method, $4\times10^{18}$ cm$^{-3}$ Si-doped n$^+$-GaAs ohmic contact layers 713 are grown on the source/drain electrode sections of the InGaAsP layer 730. FIG. 44 shows the structure after the ohmic contact layers 713 are grown. Subsequently, a source electrode 772 and a drain electrode 773 are formed and the structure of FIG. 40 is obtained.

With this structure, when a semiconductor of n$^+$-type conductivity, that is, the ohmic contact layer 713 is formed, morphology thereof can be improved and the interface states, greatly reduced, and thereby high frequency characteristic of the JFET can be enhanced. Moreover, an introduction of the InGaP layer 709 enables the wet etching to be employed with little damage in fabrication of a JFET. This can much reduce deterioration of high frequency characteristic as well as dispersion of various characteristics. Furthermore, an addition of the InGaAsP layer 730 can lower the contact resistance from the source/drain electrodes to the channel layer. In this method, the gate formation is accomplished with excellent uniformity. Further, through the use of an InGaP layer as a second layer, withstand voltage characteristic of the JFET can be improved and stable operations of the JFET can be realized. In addition, because, in this structure, a layer where the substitution of the group V elements actually takes place is laid at some distance from the channel layer at the time of epitaxial growth, the control over the substitution of the group V elements can be made without affecting the FET operations.

EXAMPLE 12

Figure 45:
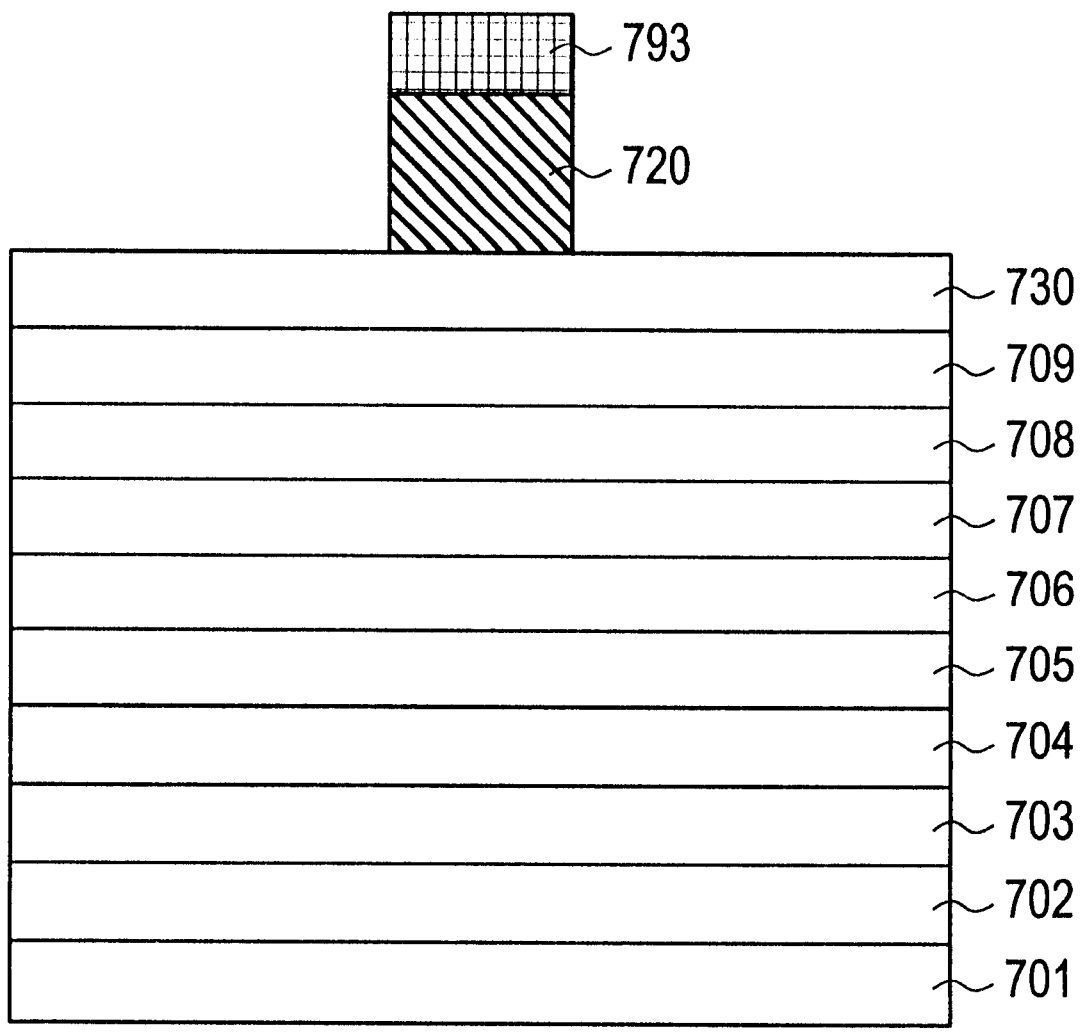
FIGS. 45–46 are a series of schematic cross-sectional views illustrating the steps of another method of manufacturing the seventh embodiment.
Figure 46:
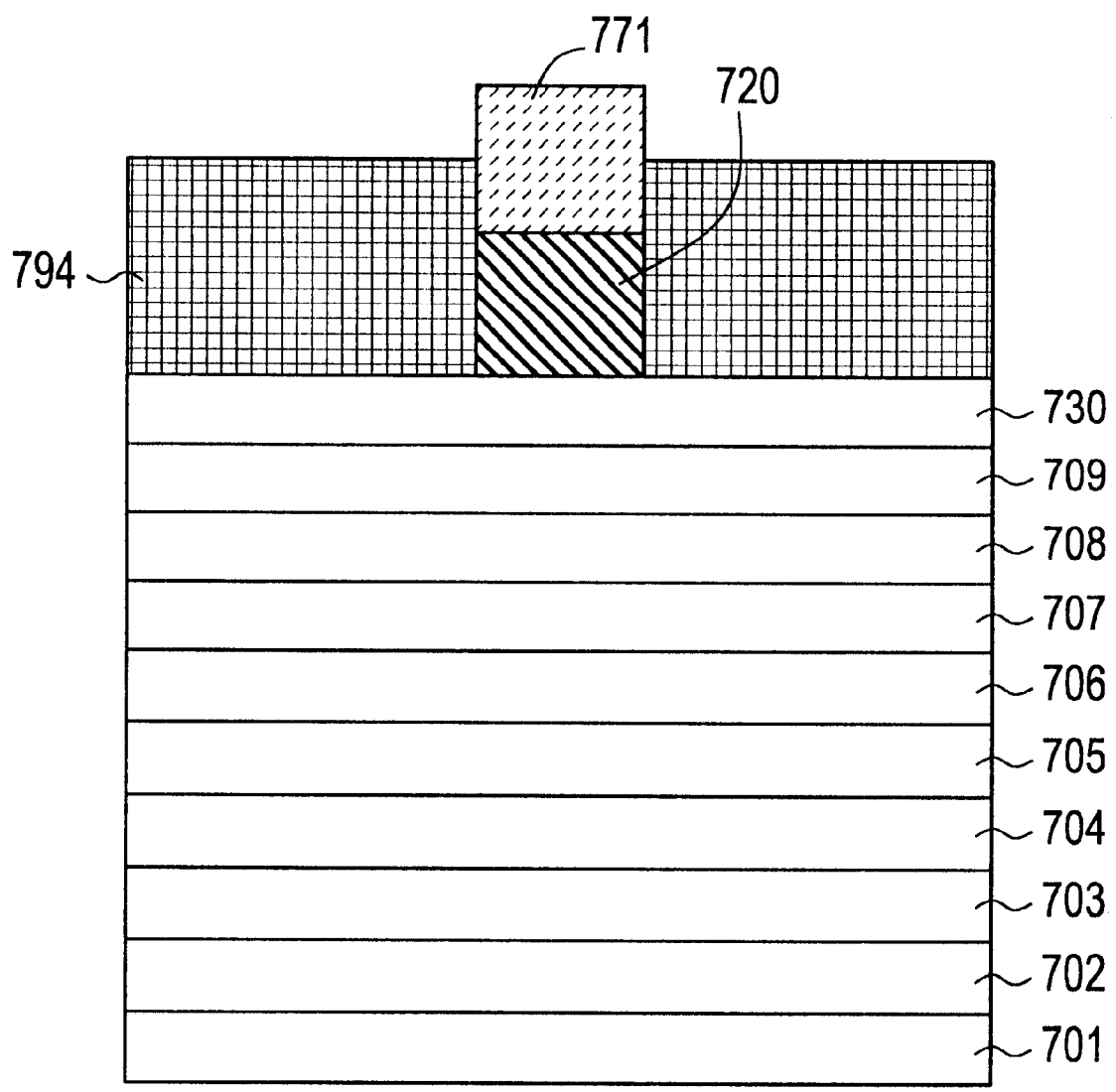

Another method of manufacturing the seventh embodiment shown in FIG. 40 is described. FIGS. 45–46 are cross-sectional views illustrating the steps of another method of manufacturing the same embodiment. Referring to FIGS. 40, 41, 45, 46, 43 and 44, the present embodiment is described in detail, below.

After the structure shown in FIG. 41 is obtained in the same way as in Example 11, a mask 793 is formed on the fabricated wafer, and, using the undoped InGaAsP layer 730 as an etching stopper layer, the p$^+$-GaAs layer 720 is selectively etched by means of wet etching with, for instance, a sulfuric acid based etchant, as shown in FIG. 45.

Next, as shown in FIG. 46, after removing the mask 793, masks 794 are formed, and a gate electrode 771 is formed on the p$^+$-GaAs layer 720.

Next, after removing the masks 794, as shown in FIG. 43, formation of a SiO$_2$ film 781 over the entire surface and patterning thereof are performed in the same way as in Example 11, and then, as shown in FIG. 44, using the SiO$_2$ film 781 as a mask, $4 \times 10^{18}$ cm$^{-3}$ Si-doped n$^+$-GaAs ohmic contact layers 713 are grown in the source/drain electrode sections, by the MBE method or the MOCVD method. Subsequently, a source electrode 772 and a drain electrode 773 are formed so as to accomplish the structure of FIG. 40.

This method can also provide excellent uniformity in formation of the gate.

EXAMPLE 13

Figure 47:
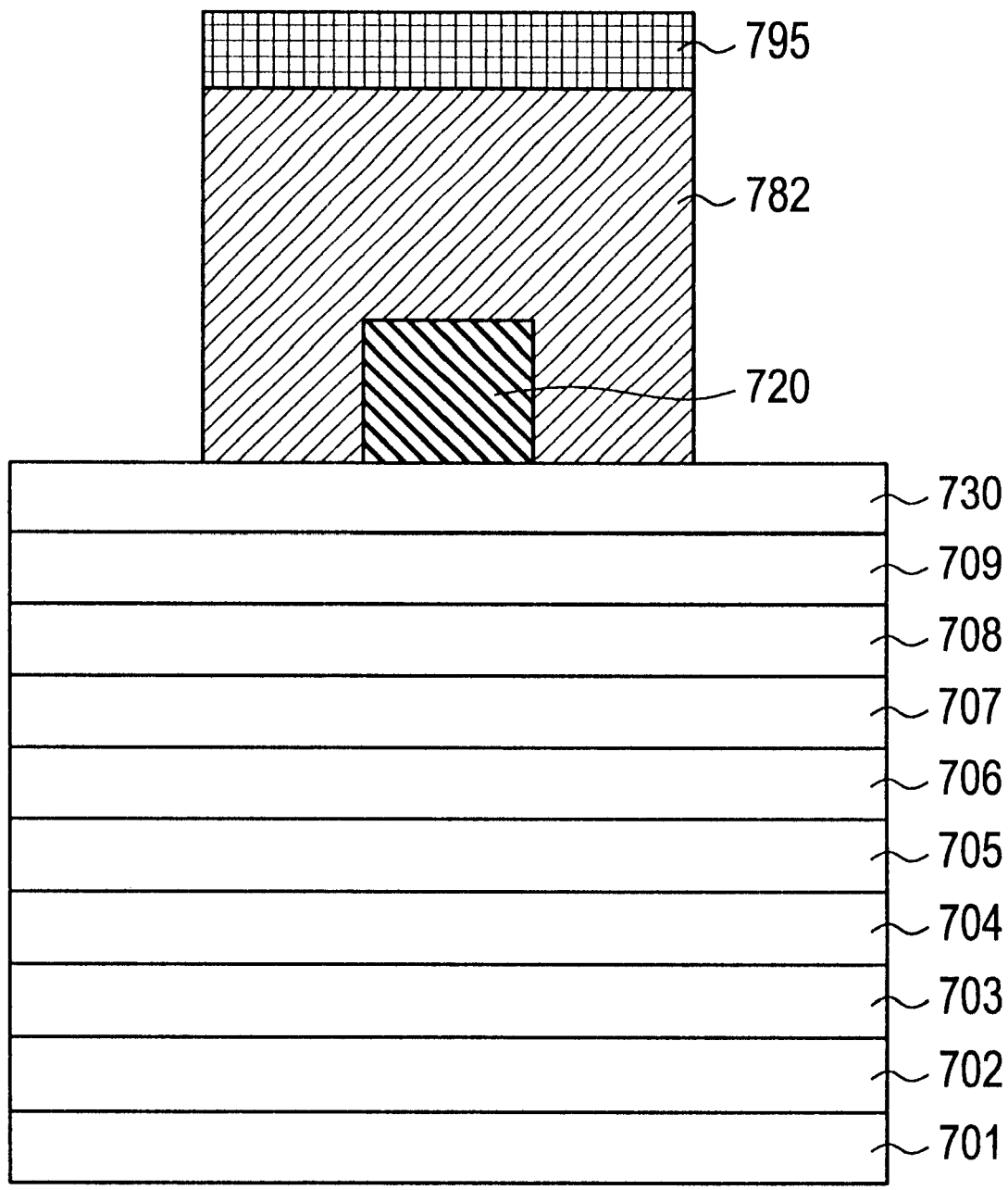
FIGS. 47–48 are a series of schematic cross-sectional views illustrating the steps of a still another method of manufacturing the seventh embodiment.
Figure 48:
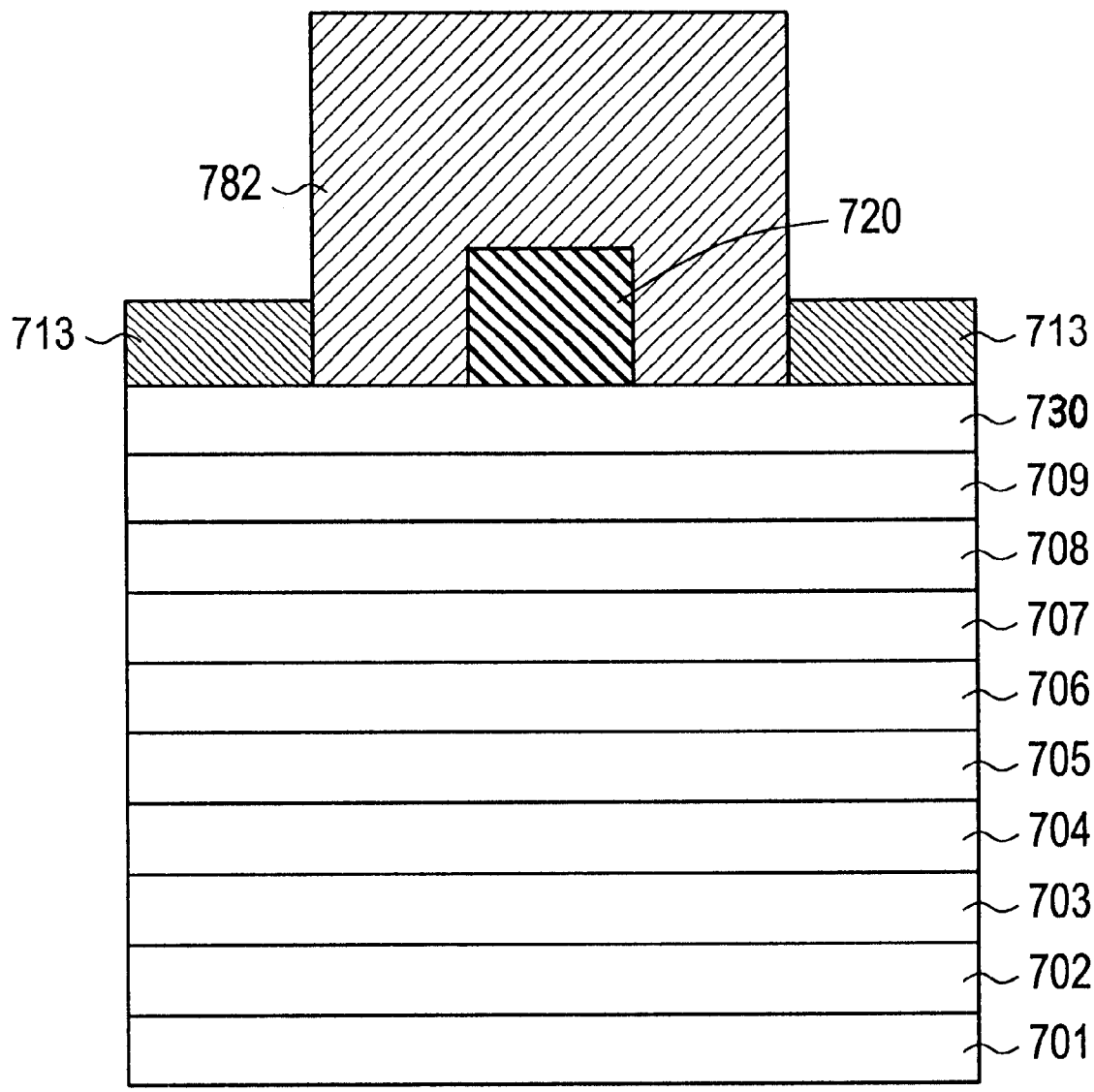

Still another method of manufacturing the seventh embodiment of the present invention is described. FIGS. 47–48 are cross-sectional views illustrating the steps of another method of manufacturing the same embodiment. Referring to FIGS. 40, 41, 45, 47 and 48, the present embodiment is described in detail, below.

Through the steps of FIGS. 41 and 45, a p$^+$-GaAs layer 720 is etched into a prescribed shape in the same way as in Example 12.

Next, after removing the masks, a SiO$_2$ film 782 is applied over the entire surface, as shown in FIG. 47. A mask 795 is then formed and portions of the SiO$_2$ film 782 are removed. After removing the mask 795, using the SiO$_2$ film 782 as a mask, $4 \times 10^{18}$ cm$^{-3}$ Si-doped n$^+$-GaAs ohmic contact layers 713 are grown in source/drain electrode sections, by the MBE method or the MOCVD method. FIG. 48 shows the structure after formation of the ohmic contact layer 713. Subsequently, a gate electrode 771, a source electrode 772 and a drain electrode 773 are formed so as to accomplish the structure of FIG. 40.

EXAMPLES 14–26

In the above examples 1–13, a spacer layer and an electron supply layer, both of which are composed of AlGaAs, are formed on a channel layer. Nevertheless, in any of these examples, by replacing these two layers with an InGaP layer and a doped InGaP layer, respectively, the epitaxial structure can be altered and the contact resistance can be reduced. For example, undoped In$_{0.49}$Ga$_{0.51}$P and $4 \times 10^{18}$ cm$^{-3}$ Si-doped In$_{0.49}$Ga$_{0.51}$P can be utilized for a spacer layer and an electron supply layer, respectively.

EXAMPLE 27

Figure 49:
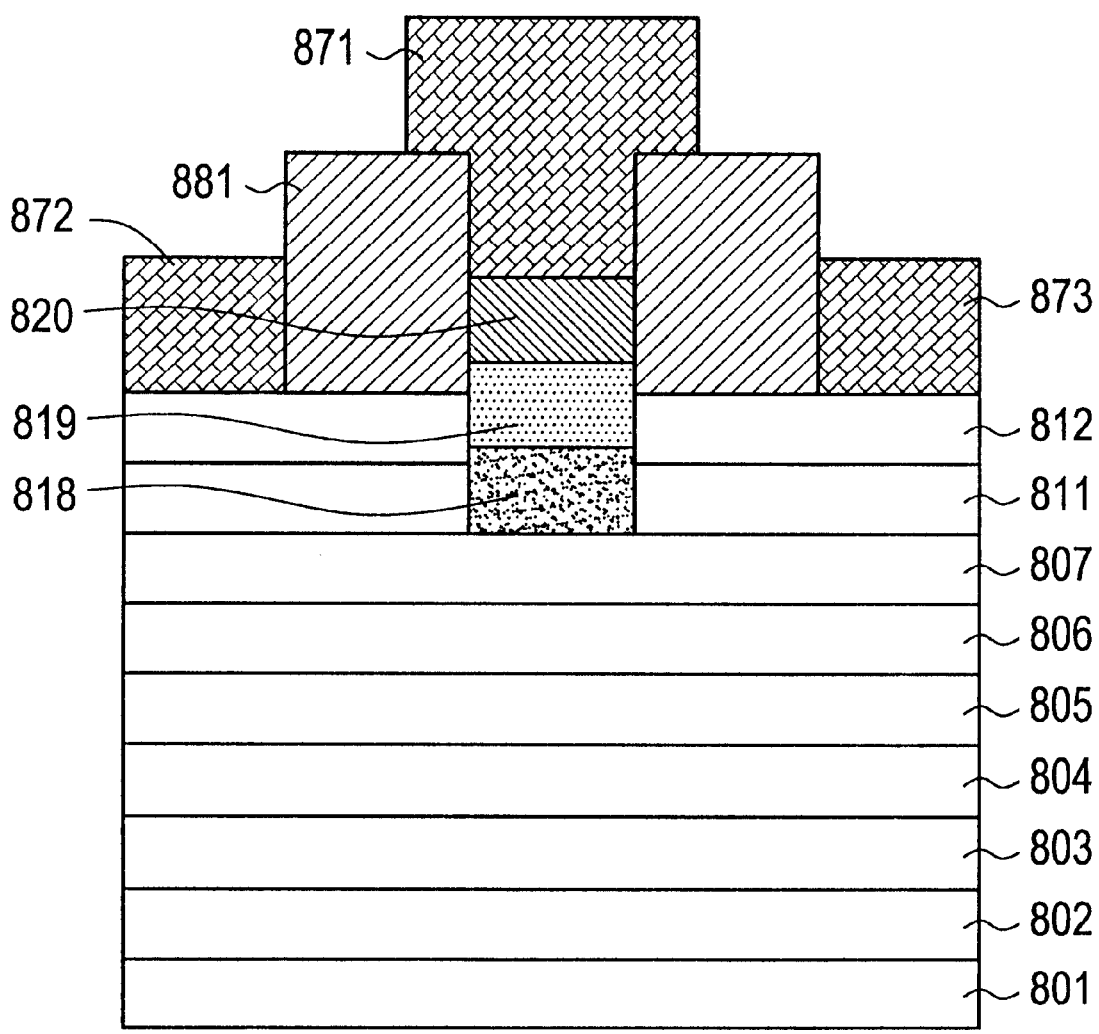
FIG. 49 is a schematic cross-sectional view showing the eighth embodiment of the present invention.

FIG. 49 is a cross-sectional view showing the structure of the eighth embodiment of a field effect transistor according to the present invention and FIGS. 50–54 are cross-sectional views illustrating, in sequence, the steps of a method of manufacturing the same embodiment. Referring to FIGS. 49–54, this embodiment is described in detail below.

Figure 50:
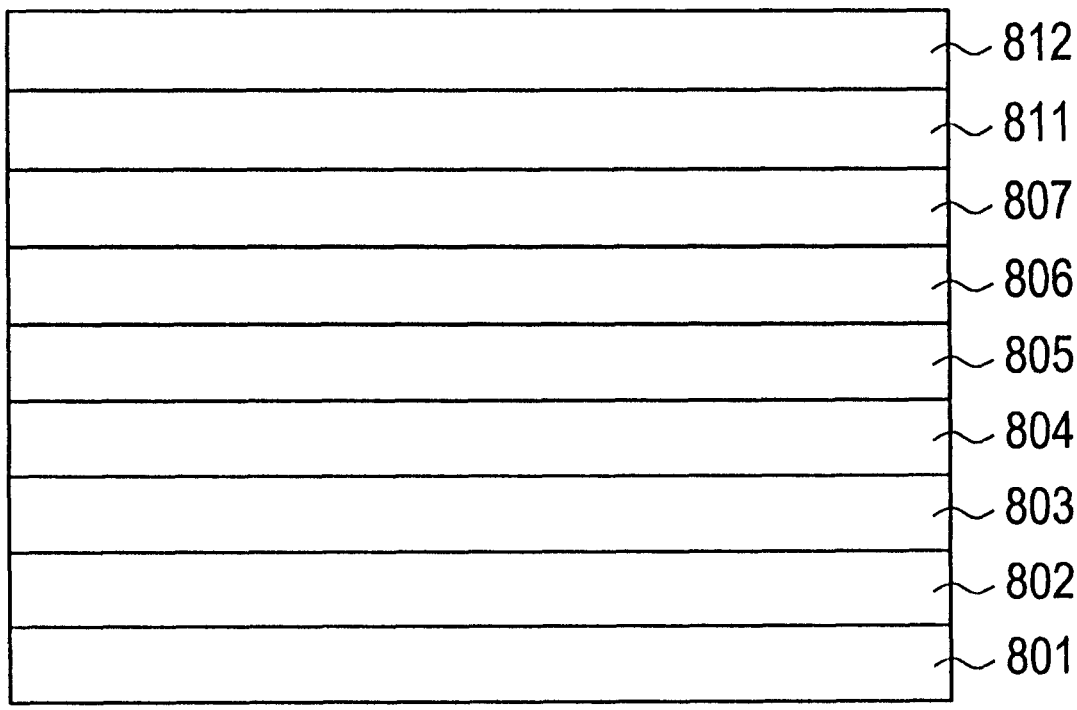
FIGS. 50–54 are a series of schematic cross-sectional views illustrating the steps of a method of manufacturing the eighth embodiment.

Firstly, on a semi-insulating GaAs substrate 801, an undoped GaAs buffer layer 802 with a thickness of 400 nm, an undoped Al$_{0.2}$Ga$_{0.8}$As buffer layer 803 with a thickness of 100 nm, a $4 \times 10^{18}$ cm$^{-3}$ Si-doped Al$_{0.2}$Ga$_{0.8}$As electron supply layer 804 with a thickness of 4 nm, an undoped Al$_{0.2}$Ga$_{0.2}$As spacer layer 805 with a thickness of 2 nm, an undoped In$_{0.2}$Ga$_{0.8}$As channel layer 806 with a thickness of 15 nm, an undoped GaAs spacer layer 807 with a thickness of 2 nm, an undoped InGaP etching stopper layer 811 with a thickness of 2 nm, a $4 \times 10^{18}$ cm$^{-3}$ Si-doped GaAs ohmic contact layer 812 with a thickness of 23 nm are formed, in succession, by epitaxial growth, using either the MBE method or the MOCVD method. FIG. 50 is a cross-sectional view showing the structure after the epitaxial growth.

Figure 51:
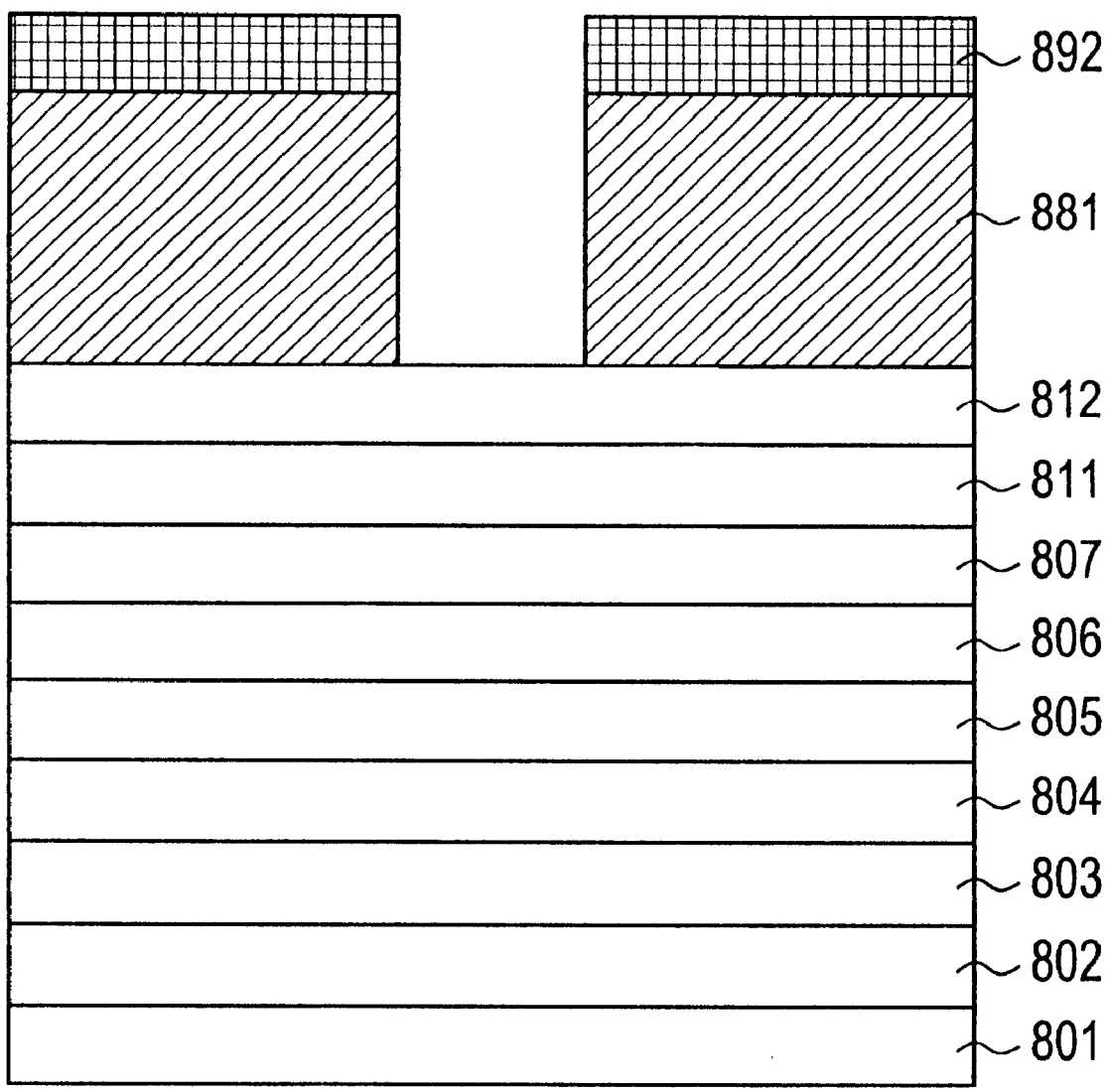

Next, on the wafer fabricated as above, a SiO$_2$ film 881 and a mask 892 which has an opening for a gate opening section are successively formed and, by etching the SiO$_2$ film 881, the GaAs layer 812 is exposed in the gate opening section. FIG. 51 is the structure after etching the SiO$_2$ film 881.

Figure 52:
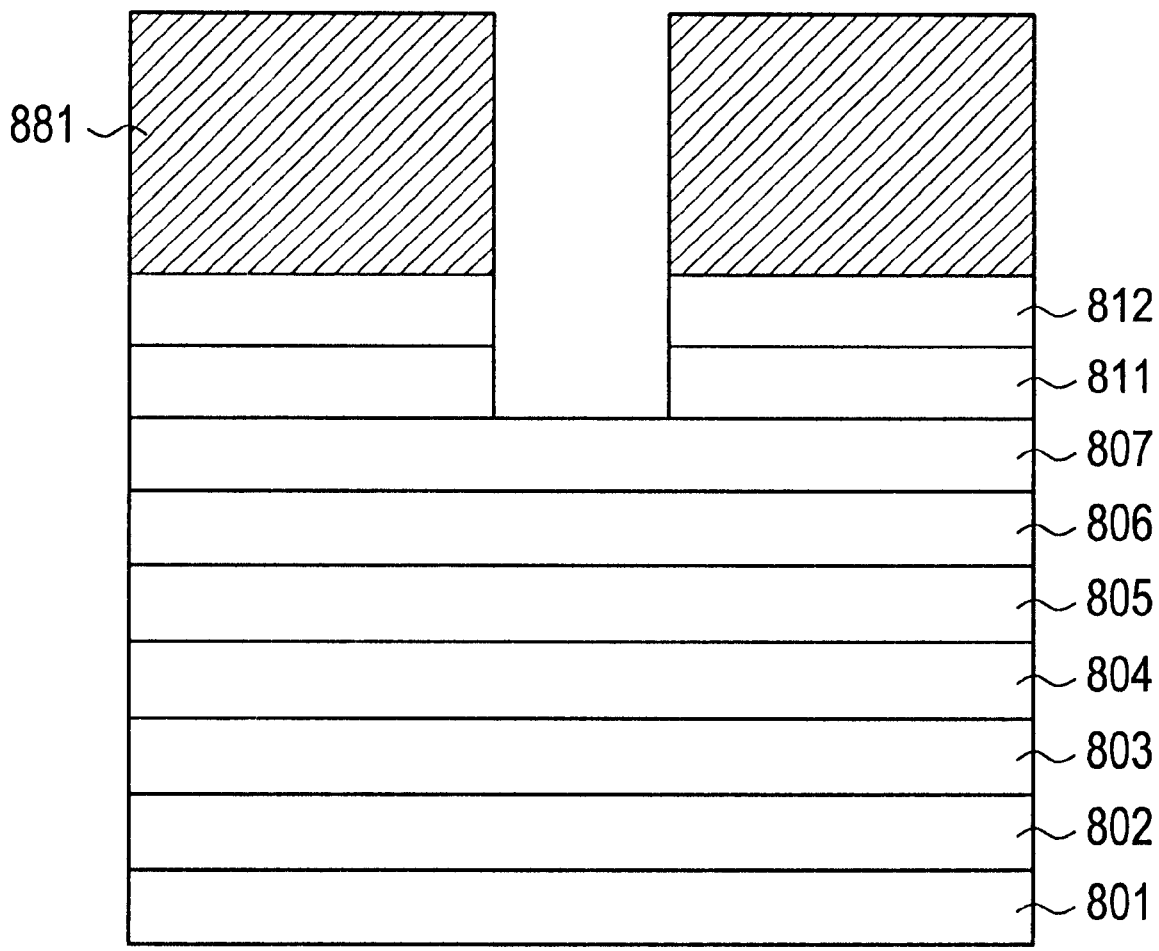

The mask 892 is then removed and the GaAs layer 812 is etched by means of dry etching, using the InGaP layer 811 as an etching stopper layer, and thereafter a portion of the InGaP layer 811 in the gate opening section is removed with a hydrochloric acid based etchant. FIG. 52 is a cross-sectional view showing the structure after removing the InGaP layer 811.

Figure 53:
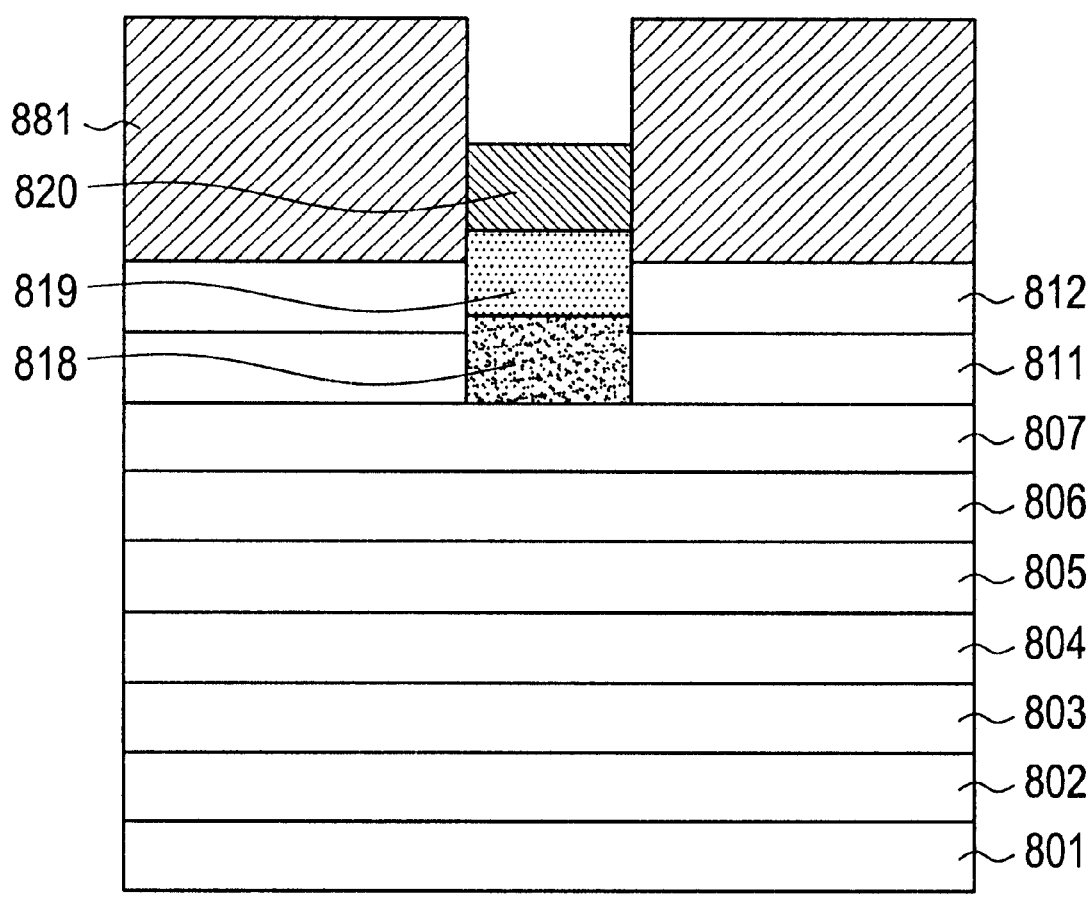

Subsequently, the wafer is brought in a MBE apparatus or an MOCVD apparatus and, using the SiO$_2$ film 881 as a mask, a $4 \times 10^{18}$ cm$^{-3}$ Si-doped Al$_{0.2}$Ga$_{0.8}$As electron supply layer 818 with a thickness of 12 nm, an undoped In$_{0.49}$Ga$_{0.51}$P layer 819 with a thickness of 15 nm and a $1 \times 10^{20}$ cm$^{-3}$ Zn-doped p$^+$-type GaAs layer 820 are selectively grown in succession. FIG. 53 is a cross-sectional view showing the structure after forming the p$^+$-type GaAs layer 820.

Figure 54:
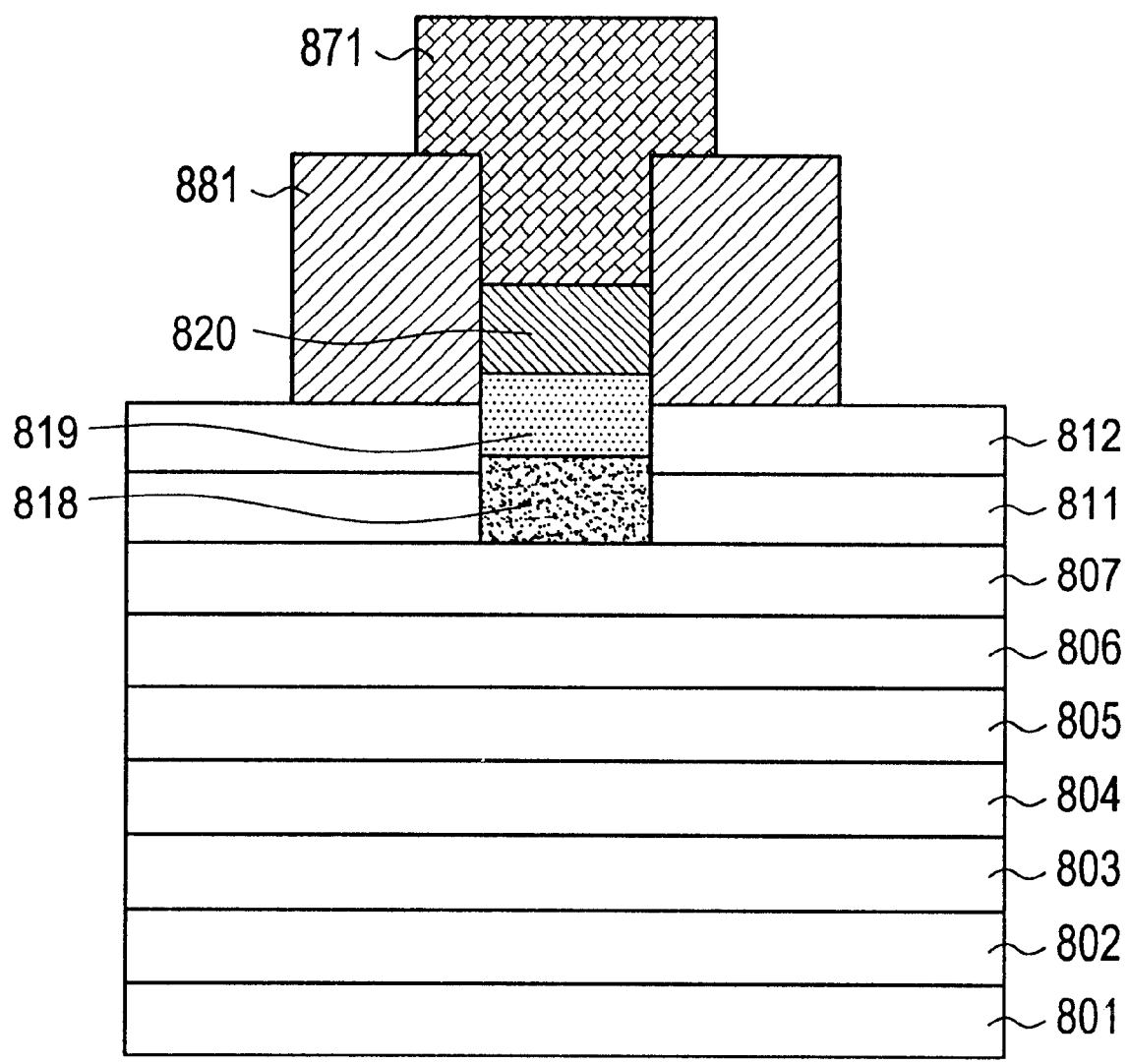

After that, a gate electrode metal 871 is formed on the p$^+$-type GaAs layer 820. The SiO$_2$ layer 881 is then patterned so as to have openings for source/drain regions. FIG. 54 is a cross-sectional view after this patterning. Next, ohmic electrode metals 872 and 873 are formed in the source/drain sections, respectively, to accomplish the structure of FIG. 49.

In the above manufacturing method, after forming the gate opening section (FIG. 52), the layers exposed within the gate opening section are the GaAs layer 807, the InGaP layer 811 and the n-type GaAs layer 812, none of which contains highly reactive Al. In the subsequent step of selective regrowth, this can suppress creation of the interface states on the regrowth interface which may be brought about by the presence of impurities such as oxygen. Consequently, deterioration of high frequency characteristic of the FET due to the interface states can be well avoided.

EXAMPLE 28

Figure 55:
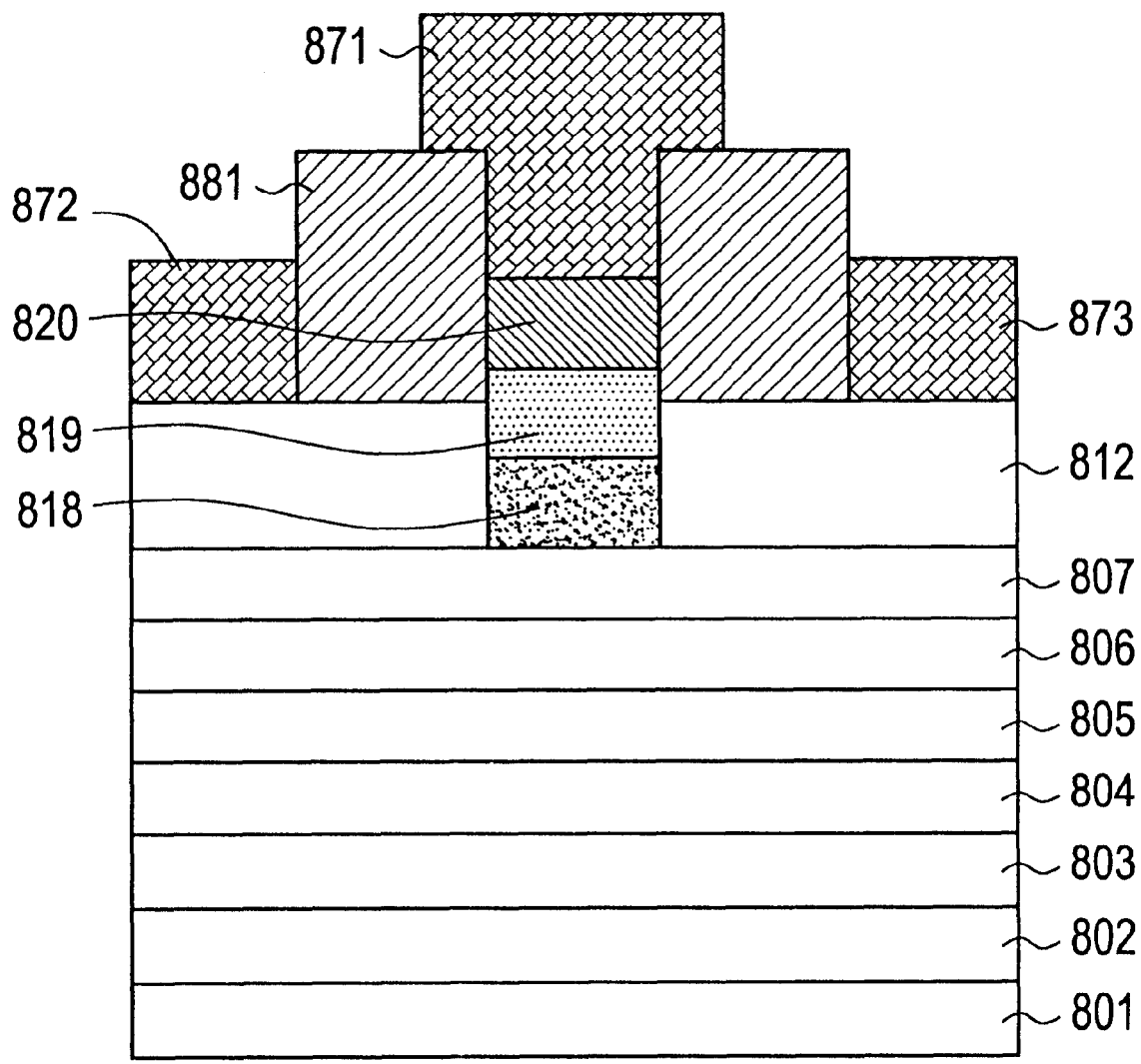
FIG. 55 is a schematic cross-sectional view showing an embodiment improved from the eighth embodiment of the present invention.

While a GaAs spacer layer 807 is laid on an InGaAs channel layer 806, in Example 27, it is possible to employ an undoped InGaP layer instead for this spacer layer. In this case, the InGaP spacer layer 807 can serve also as an etching stopper layer at the time of formation of a gate opening section so that the etching stopper layer 811 in Example 27 becomes redundant. FIG. 55 is a cross-sectional view showing the structure of the present example.

In the structure of the present example, after forming the gate opening section, the layers exposed within the gate opening section are the InGaP layer 807 and the n-type GaAs layer 812, none of which contains highly reactive Al. In the subsequent step of selective regrowth, this can suppress creation of the interface states on the regrowth interface which may be brought about by the presence of impurities such as oxygen. Consequently, deterioration of high frequency characteristic of the FET due to the interface states can be well avoided.

Further, because InGaP which has a lower electron affinity than GaAs is utilized as a spacer layer, the effect of confining the two-dimensional electron gas in the InGaAs channel layer 806 can be increased and the electron transport characteristic of the two-dimensional gas can be enhanced.

EXAMPLE 29

Figure 56:
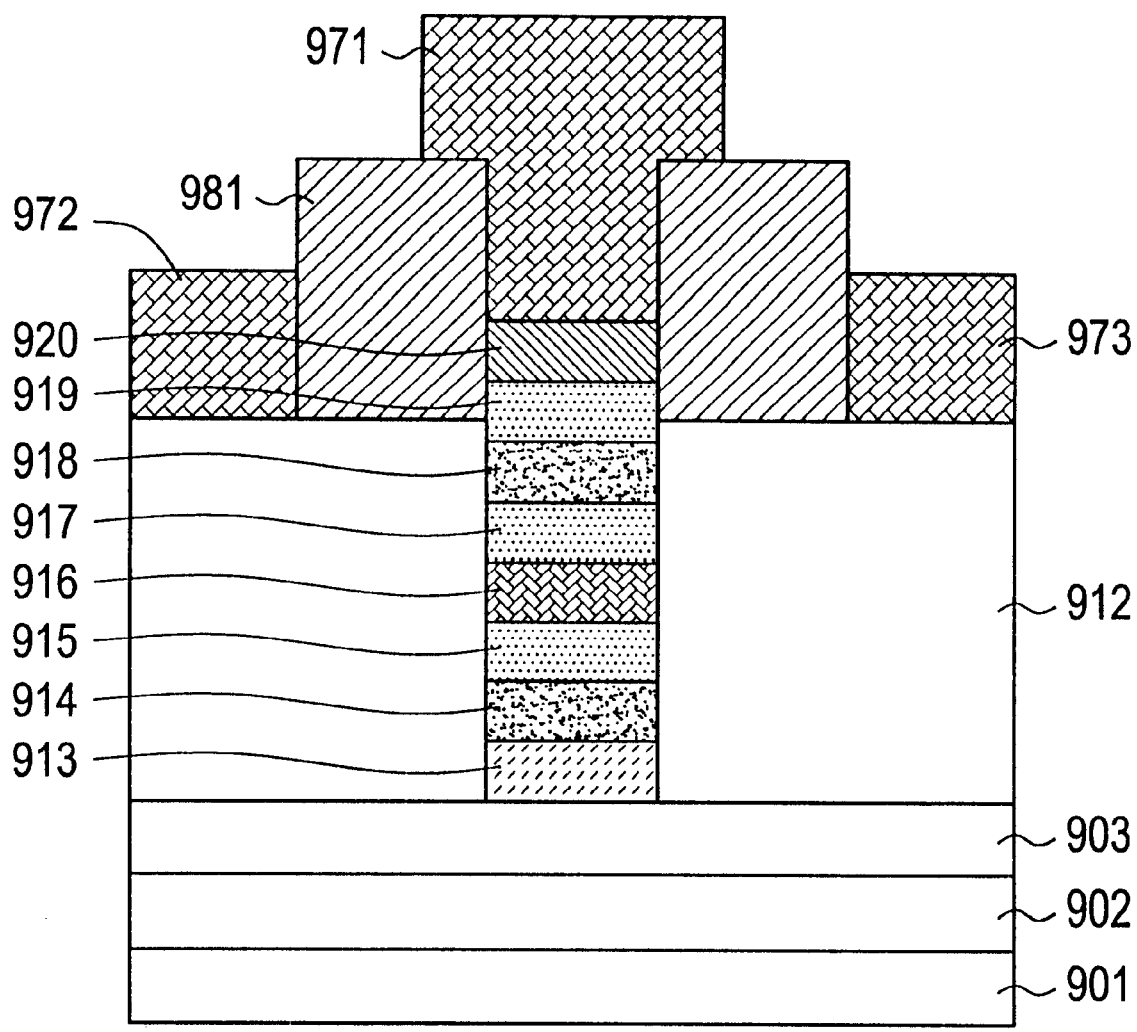
FIG. 56 is a schematic cross-sectional view showing the ninth embodiment of the present invention.

FIG. 56 is a cross-sectional view showing the structure of the ninth embodiment of a field effect transistor according to the present invention and FIGS. 57–60 are cross-sectional views illustrating, in sequence, the steps of a method of manufacturing the same embodiment. Referring to FIGS. 56–60, this embodiment is described in detail below.

Figure 57:
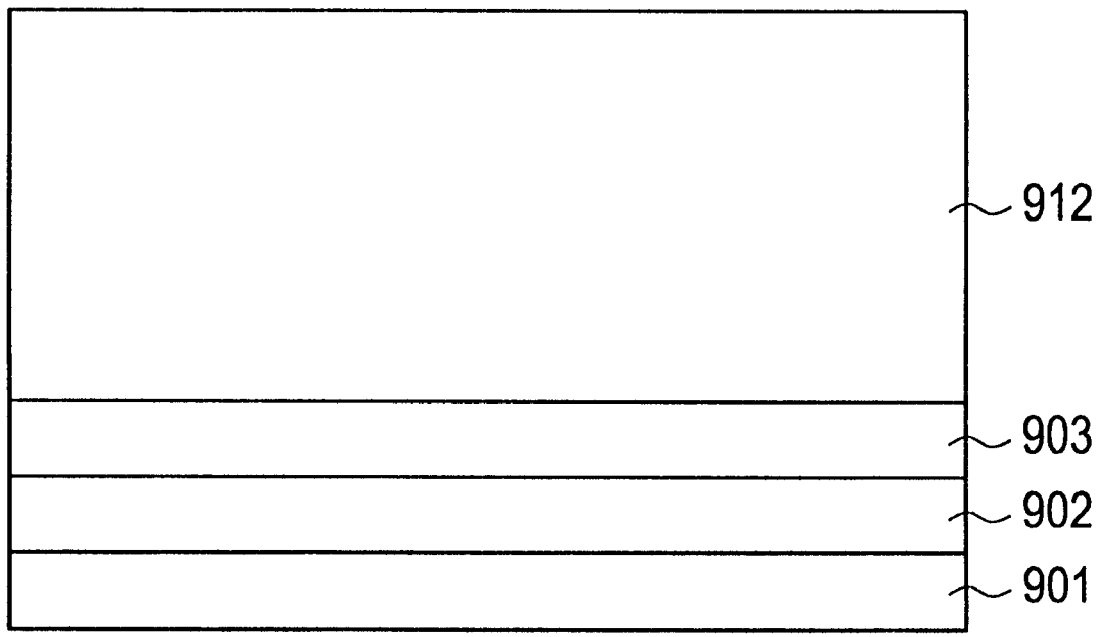
FIGS. 57–60 are a series of schematic cross-sectional views illustrating the steps of a method of manufacturing the ninth embodiment.

Firstly, on a semi-insulating GaAs substrate 901, an undoped GaAs buffer layer 902 with a thickness of 400 nm, an undoped InGaP etching stopper layer 903 with a thickness of 5 nm, a $4 \times 10^{18}$ cm$^{-3}$ Si-doped GaAs ohmic contact layer 912 with a thickness of 140 nm are formed, in succession, by epitaxial growth, using either the MBE method or the MOCVD method. FIG. 57 is a cross-sectional view showing the structure after the epitaxial growth.

Figure 58:
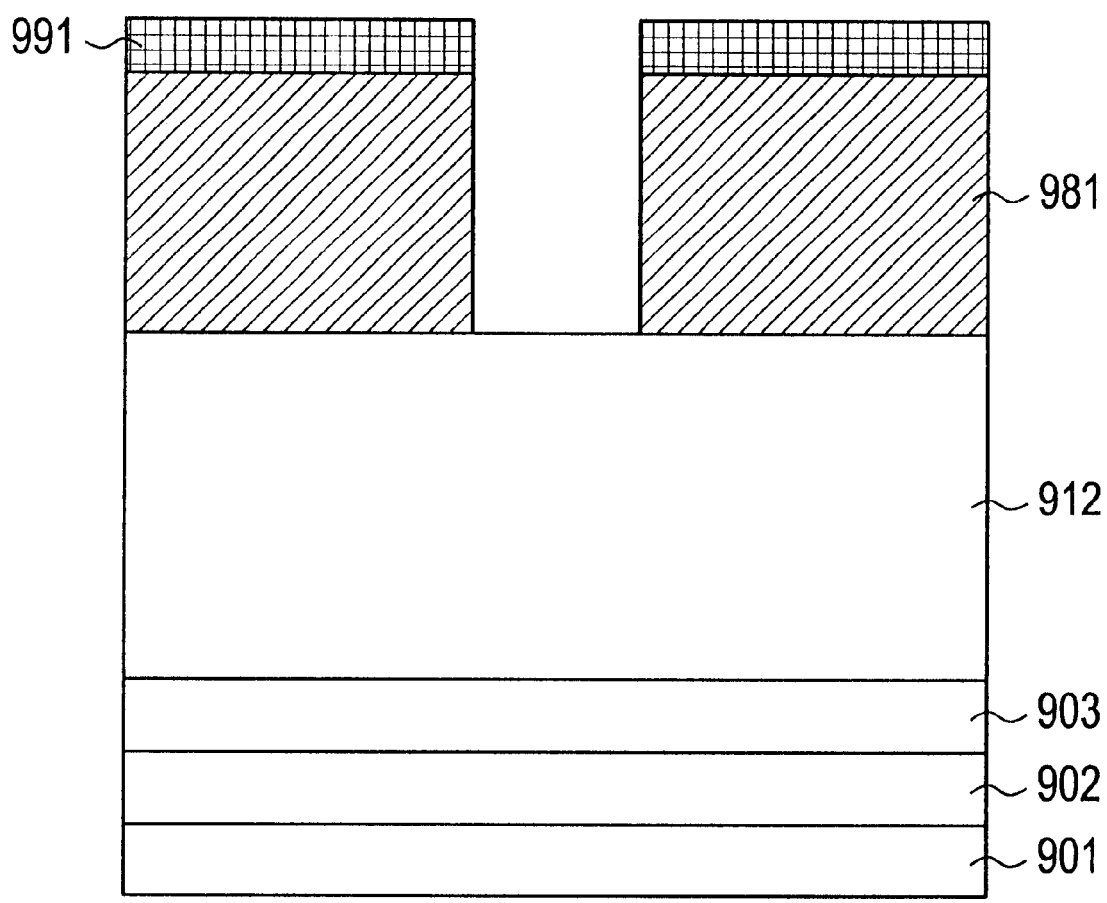
Figure 59:
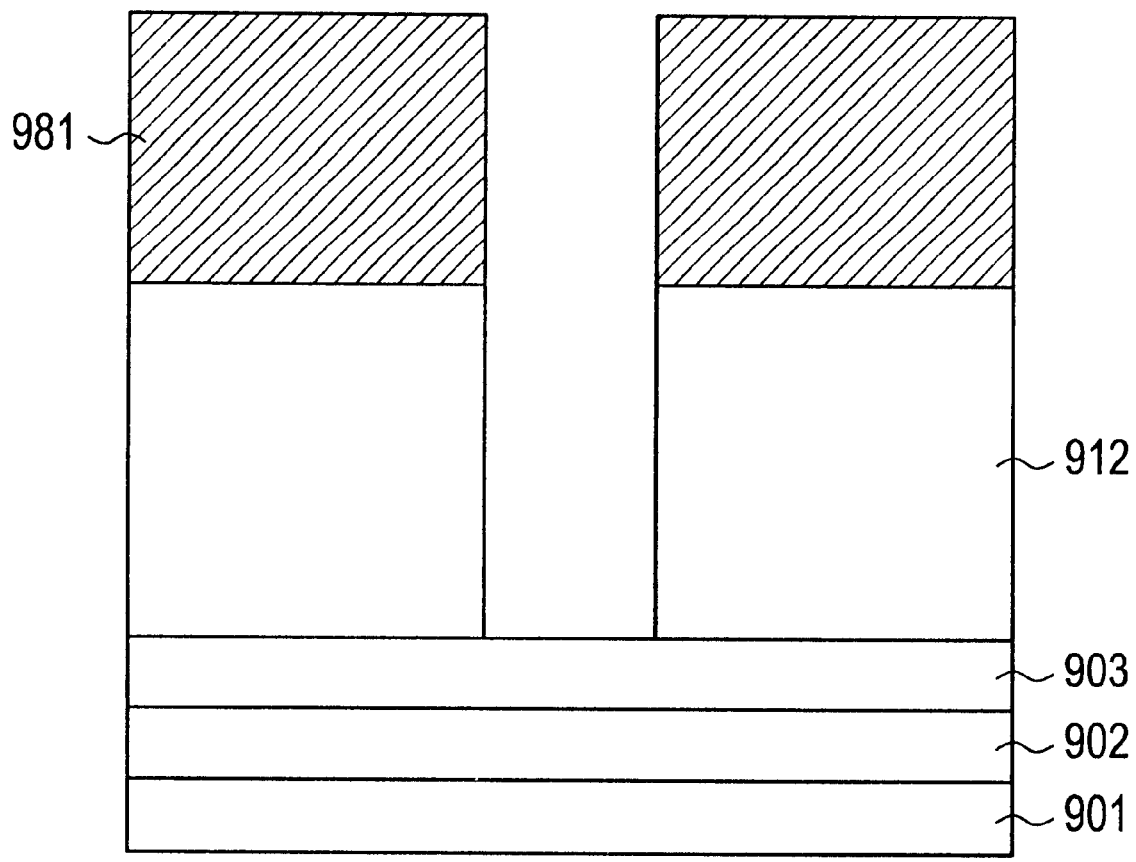

Next, on the wafer fabricated as above, a SiO$_2$ film 981 and a mask 991 which has an opening for a gate opening section are successively formed and, by etching the SiO$_2$ film 981, the GaAs layer 912 is exposed in the gate opening section. FIG. 58 is the structure after etching the SiO$_2$ film 981. The mask 991 is then removed and the GaAs layer 912 is etched by means of dry etching, using the InGaP layer 903 as an etching stopper layer. FIG. 59 is a cross-sectional view showing the structure after etching the GaAs layer 912.

Figure 60:
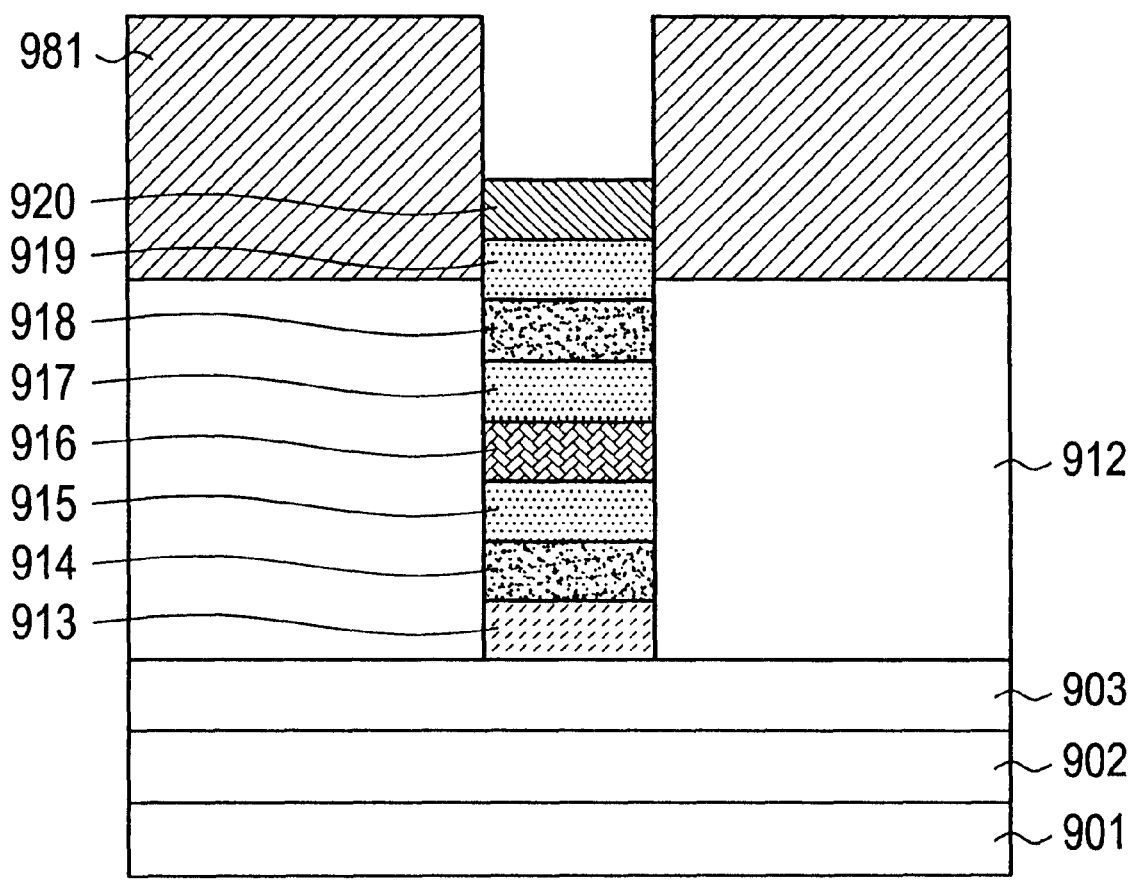
Figure 61:
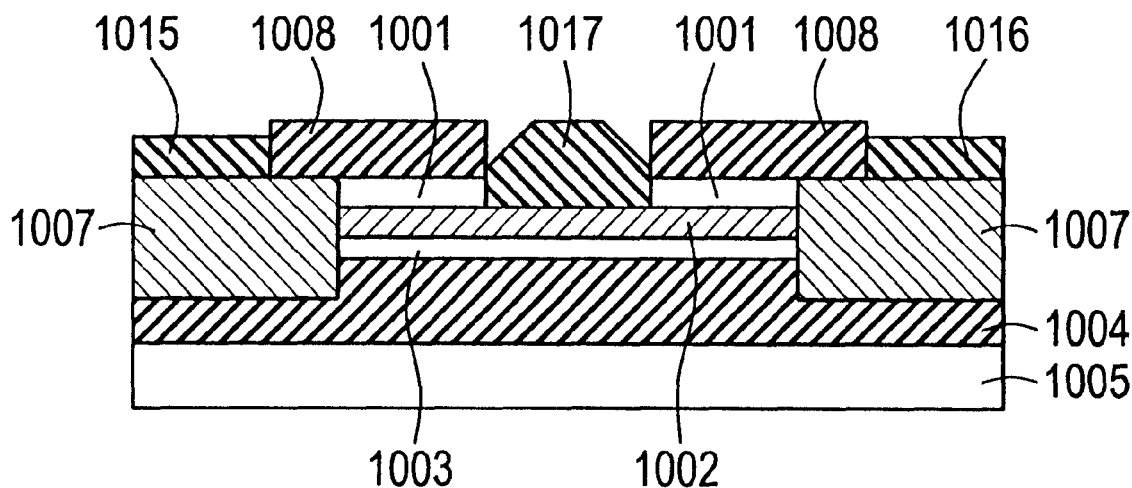
FIG. 61 is a schematic cross-sectional view showing the structure of a conventional JFET.
Figure 62:
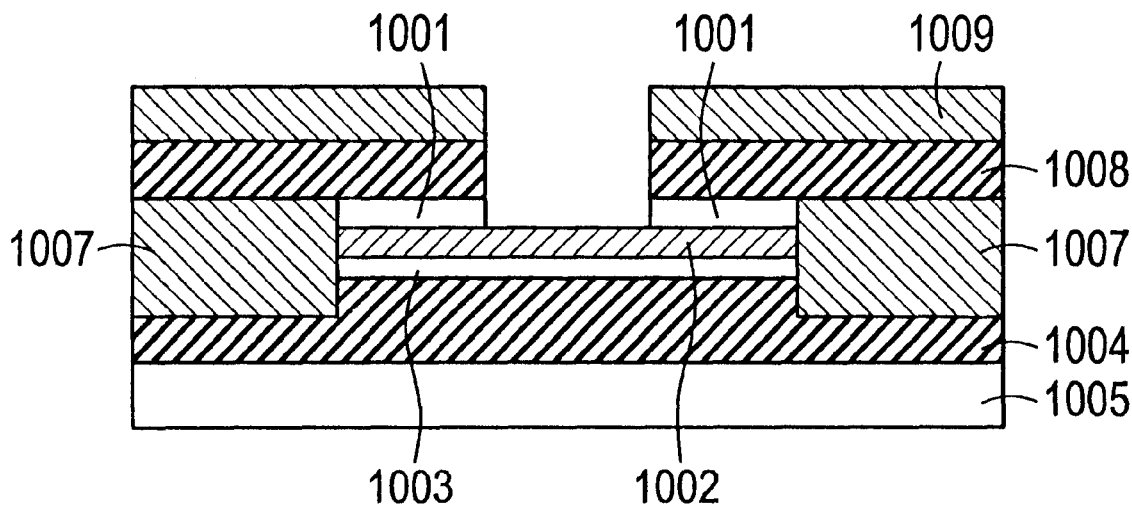
FIGS. 62–64 are a series of schematic cross-sectional views illustrating the steps of a conventional manufacturing method.
Figure 63:
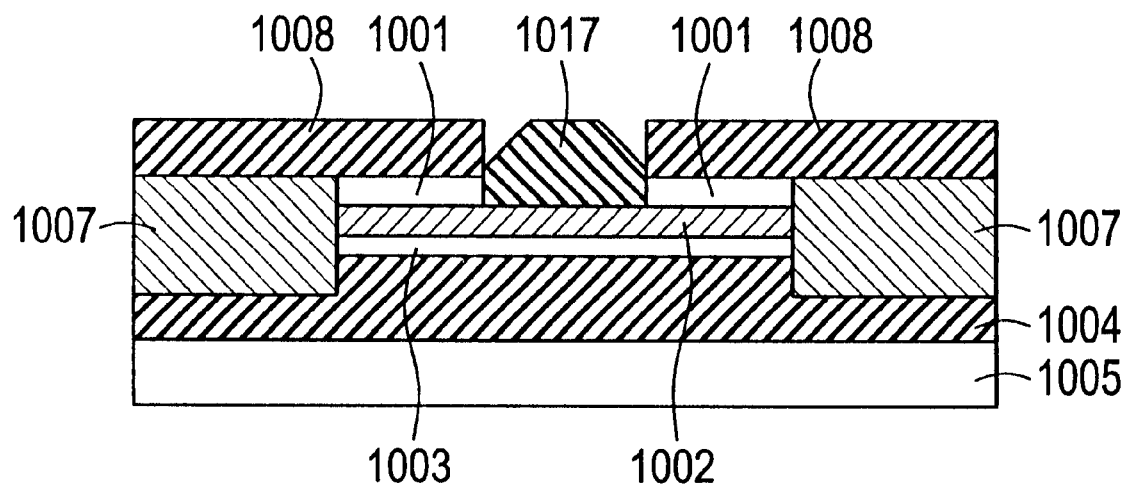
Figure 64:
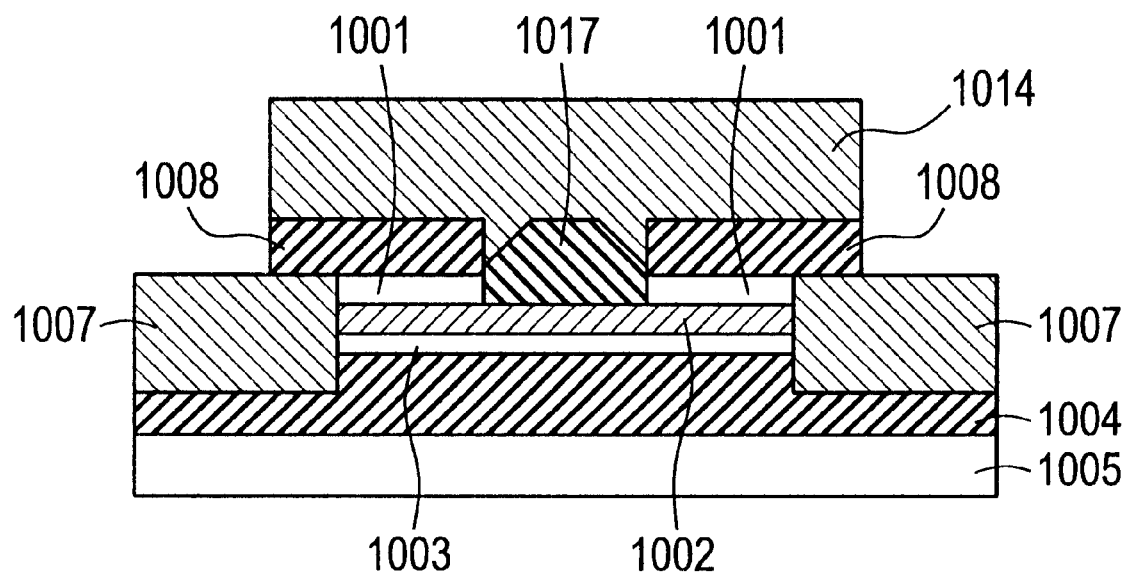

Subsequently, the wafer is brought in a MBE apparatus or an MOCVD apparatus and, using the SiO$_2$ film 981 as a mask, an Al$_{0.2}$Ga$_{0.8}$As buffer layer 913 with a thickness of 100 nm, a $4 \times 10^{18}$ cm$^{-3}$ Si-doped Al$_{0.2}$Ga$_{0.8}$As electron supply layer 914 with a thickness of 4 nm, an undoped Al$_{0.2}$Ga$_{0.8}$As spacer layer 915 with a thickness of 2 nm, an undoped In$_{0.2}$Ga$_{0.8}$As channel layer 916 with a thickness of 15 nm, an undoped Al$_{0.2}$Ga$_{0.8}$As spacer layer 917 with a thickness of 2 nm, a $4 \times 10^{18}$ cm$^{-3}$ Si-doped In$_{0.49}$Ga$_{0.5}$P electron supply layer 918 with a thickness of 12 nm, an undoped In$_{0.49}$Ga$_{0.51}$P layer 919 with a thickness of 15 nm and a $1 \times 10^{20}$ cm$^{-3}$ Zn-doped p$^+$-type GaAs layer 920 are selectively grown in succession. FIG. 60 is a cross-sectional view showing the structure after forming the p$^+$-type GaAs layer 920.

After that, a gate electrode metal 971 is formed on the p$^+$-type GaAs layer 920. Next, ohmic electrode metals 972 and 973 are formed in the source/drain sections, respectively, to accomplish the structure of FIG. 56.

In the above manufacturing method, after forming the gate opening section (FIG. 59), the layers exposed within the gate opening section are the InGaP layer 903 and the n-type GaAs layer 912, none of which contains highly reactive Al. In the subsequent step of selective regrowth, this can suppress creation of the interface states on the regrowth interface which may be brought about by the presence of impurities such as oxygen. Consequently, deterioration of high frequency characteristic of the FET due to the interface states can be well avoided.

Further, since layers from the buffer layer 913 to the p$^+$ type GaAs layer 920 are consecutively formed by epitaxial growth within a MBE apparatus or a MOCVD apparatus in the present example, all the heterojunction interfaces directly under the gate electrode 971 can be formed in excellent conditions with very few interface states, enabling fabrication of the FET with excellent high frequency characteristic.

While, in the above examples, the first conductive-type and the second conductive-type are described as n-type and p-type, respectively, this can be arranged the other way round. That is, the first conductive-type and the second conductive-type can be p-type and n-type, respectively. Further, although InGaAs is employed, herein, for the channel layer, the layer can be composed of GaAs. With respect to the gate layer material, apart from the GaAs layer mentioned above, AlGaAs, InGaAs or InGaP can be used. As for the ohmic contact layer (including the cap layer) for source/drain electrodes, too, apart from GaAs mentioned above, InGaAs, AlGaAs, InGaP, InGaAsP or the like can be utilized.

Further, it is to be understood by those skilled in the art that the composition ratio given for each layer is for the purpose of illustration only and not of limitation. Regarding the InGaP layer that characterizes the present invention, although the thickness thereof should be within the critical thickness, when expressed as In$_x$Ga$_{1-x}$P, x can take any value in a range 0<x<1. The more x approaches 1, the narrower the band gap becomes. The ON-state resistance becomes improved, in this case, but the withstand voltage which is the very object of the present invention tends to become lowered. Accordingly, x=0.48 or so, possible to allow good lattice matching with the GaAs substrate is the most favorable.

Further, the dopant concentrations for the doped layers are not limited to the ones mentioned in the above examples. For n-type dopants, the above mentioned Si is in general use and the dopant concentrations therefor are $1 \times 10^{17}$ to $1 \times 10^{20}$ cm$^{-3}$ or so. When a gate layer is made to be n-type, the dopant concentration is preferably set to be $4 \times 10^{18}$ cm$^{-3}$ or so. As for p-type dopants, there is widely used the above-mentioned Zn or C with a concentration of $1 \times 10^{18} - 5 \times 10^{20}$ cm$^{-3}$ or so in the MOCVD method, and Be with a concentration of $1 \times 10^{18}$ to $1 \times 10^{20}$ cm$^{-3}$ or so in the MBE method. In these cases, too, if a gate layer is made to be p-type, the concentration is preferably set to be $1 \times 10^{20}$ cm$^{-3}$ or so.

What is claimed is:

1. A field effect transistor having, on a semi-insulating compound semiconductor substrate:

a buffer layer;

an active layer that includes a channel layer made of a first conductive-type epitaxial growth layer;

source/drain electrodes formed on a first conductive-type semiconductor ohmic contact layer which is formed either on said active layer or on a lateral face thereof;

a gate layer made of a second conductive-type epitaxial growth layer, wherein said second conductive-type is different from said first conductive-type; and a gate electrode formed on said gate layer, wherein between said second conductive-type gate layer and said channel layer, said field effect transistor further has a semiconductor layer that rapidly lowers the energy of the valance band spreading from said gate layer to said channel layer.

2. The field effect transistor according to claim 1, Wherein said semiconductor layer that rapidly lowers the energy of the valance band is made of InGaP.

3. The field effect transistor according to claim 1, wherein said first conductive-type is n-type and second conductive-type is p-type.

4. The field effect transistor according to claim 1, wherein said channel layer is composed of either InGaAs or GaAs and said second conductive-type gate layer is a layer composed of substances selected from the group consisting of GaAs, AlGaAs, InGaAs and InGaP.

5. The field effect transistor according to claim 1, wherein a semiconductor layer to form a first recess is formed on the semiconductor layer that rapidly lowers the energy of the valance band and another semiconductor layer to form a second recess which is wider than said first recess is formed on said semiconductor layer to form a first recess, and said second conductive-type gate layer is formed in the first recess.

6. The field effect transistor according to claim 5, wherein a semiconductor layer or layers within the active layer lying above the channel are a layer or layers essentially consisting of In, Ga and P.

7. The field effect transistor according to claim 6, wherein said second conductive-type gate layer is formed in contact with the semiconductor layer that rapidly lowers the energy of the valance band.

8. The field effect transistor according to claim 5, wherein either one or both of the ohmic contact layer for source/drain electrodes and the second conductive-type gate layer formed on the active layer are formed on an InGaAsP layer over said semiconductor layer that rapidly lowers the energy of the valance band.

9. The field effect transistor according to claim 1, wherein the ohmic contact layer to provide ohmic contacts for source/drain electrodes is formed on the semiconductor layer that rapidly lowers the energy of the valance band and said second conductive-type gate layer is formed within a one-stage recess formed with said ohmic contact layer.

10. The field effect transistor according to claim 9, wherein the ohmic contact layer is formed by regrowth on the semiconductor layer that rapidly lowers the energy of the valance band.

11. The field effect transistor according to claim 10, wherein a semiconductor layer or layers within the active layer lying above the channel are a layer or layers essentially consisting of In, Ga and P.

12. The field effect transistor according to claim 11, wherein said second conductive-type gate layer is formed in contact with the semiconductor layer that rapidly lowers the energy of the valance band.

13. The field effect transistor according to claim 10, wherein either one or both of the ohmic contact layer for source/drain electrodes and the second conductive-type gate layer formed on the active layer are formed on an InGaAsP layer over said semiconductor layer that rapidly lowers the energy of the valance band.

14. The field effect transistor according to claim 9, wherein the ohmic contact layer is a layer consecutively formed, by epitaxial growth, on the semiconductor layer of InGaP that rapidly lowers the energy of the valance band, and the second conductive-type gate layer is a layer formed by regrowth in a recess formed by wet etching said ohmic contact layer, using said InGaP layer as an etching stopper layer.

15. The field effect transistor according to claim 14, wherein a semiconductor layer or layers within the active layer lying above the channel are a layer or layers essentially consisting of In, Ga and P.

16. The field effect transistor according to claim 15, wherein said second conductive-type gate layer is formed in contact with the semiconductor layer that rapidly lowers the energy of the valance band.

17. The field effect transistor according to claim 14, wherein either one or both of the ohmic contact layer for source/drain electrodes and the second conductive-type gate layer formed on the active layer are formed on an InGaAsP layer over said semiconductor layer that rapidly lowers the energy of the valance band.

18. The field effect transistor according to claim 9, wherein a semiconductor layer or layers within the active layer lying above the channel are a layer or layers essentially consisting of In, Ga and P.

19. The field effect transistor according to claim 18, wherein said second conductive-type gate layer is formed in contact with the semiconductor layer that rapidly lowers the energy of the valance band.

20. A field effect transistor according to claim 9, wherein either one or both of the ohmic contact layer for source/drain electrodes and the second conductive-type gate layer formed on the active layer are formed on an InGaAsP layer over said semiconductor layer that rapidly lowers the energy of the valance band.

21. The field effect transistor according to claim 1, wherein the ohmic contact layer is a layer formed by regrowth after source/drain electrode formation regions of an active layer which, at least, includes a channel layer are removed selectively.

22. The field effect transistor according to claim 21, wherein a semiconductor layer or layers within the active layer lying above the channel are a layer or layers essentially consisting of In, Ga and P.

23. The field effect transistor according to claim 22, wherein said second conductive-type gate layer is formed in contact with the semiconductor layer that rapidly lowers the energy of the valance band.

24. The field effect transistor according to claim 1, wherein a part or all of said active layer is formed by regrowth together with said second conductive-type gate layer in a depressed section that is formed in the semiconductor layer or layers formed on the buffer layer.

25. The field effect transistor according to claim 24, wherein said semiconductor layer or layers exposed in said depressed section are a semiconductor layer containing no Al.

26. The field effect transistor according to claim 24, wherein said semiconductor layers exposed in said depressed section consist of an etching stopper layer formed on the channel layer and the ohmic contact layer for source/drain electrodes formed on said stopper layer, and said depressed section is formed in the ohmic contact layer lying over the etching stopper layer.

27. The field effect transistor according to claim 24, wherein said semiconductor layers exposed in said depressed section consist of the ohmic contact layer for source/drain electrodes and the buffer layer, and within said formed depressed section, the whole active layer is formed by regrowth.

28. The field effect transistor according to claim 24, wherein said second conductive-type gate layer is formed in contact with the semiconductor layer that rapidly lowers the energy of the valance band.

* * * * *

UNITED STATES PATENT AND TRADEMARK OFFICE
CERTIFICATE OF CORRECTION

PATENT NO. : 6,534,790 B2
DATED : March 18, 2003
INVENTOR(S) : Takehiko Kato et al.

It is certified that error appears in the above-identified patent and that said Letters Patent is hereby corrected as shown below:

Column 1,
Line 57, delete "$Al_{0.2}Ga^{0.8}$" and insert -- $Al_{0.2}Ga_{0.8}$ --

Column 11,
Line 58, delete "$1 \times 10^{20\ cm-3}$" and insert -- $1 \times 10^{20}\ cm^{-3}$ --

Signed and Sealed this

Fifteenth Day of July, 2003

JAMES E. ROGAN
*Director of the United States Patent and Trademark Office*